US008575475B2

(12) United States Patent
Sakamoto et al.

(10) Patent No.: US 8,575,475 B2
(45) Date of Patent: Nov. 5, 2013

(54) SOLAR CELL MODULE WITH REAR CONTACTS

(75) Inventors: Tomonari Sakamoto, Shiga (JP); Naoya Kobamoto, Shiga (JP); Yuta Shinike, Shiga (JP); Ken'ichi Okada, Shiga (JP)

(73) Assignee: Kyocera Corporation, Kyoto (JP)

( * ) Notice: Subject to any disclaimer, the term of this patent is extended or adjusted under 35 U.S.C. 154(b) by 596 days.

(21) Appl. No.: 11/964,612

(22) Filed: Dec. 26, 2007

(65) Prior Publication Data

US 2009/0272419 A1 Nov. 5, 2009

(30) Foreign Application Priority Data

Dec. 26, 2006 (JP) ................................ 2006-349707
Sep. 21, 2007 (JP) ................................ 2007-245406

(51) Int. Cl.
*H01L 31/0224* (2006.01)

(52) U.S. Cl.
USPC ........................... 136/256; 136/243; 136/244

(58) Field of Classification Search
USPC ............................... 136/243–265; 438/57–98
See application file for complete search history.

(56) References Cited

U.S. PATENT DOCUMENTS

| 5,661,041 | A | * | 8/1997 | Kano | 438/72 |
| 6,384,317 | B1 | | 5/2002 | Kerschaver et al. | |
| 6,559,479 | B1 | * | 5/2003 | Ludemann | 257/99 |
| 2004/0182432 | A1 | * | 9/2004 | Yoda et al. | 136/244 |
| 2004/0261839 | A1 | * | 12/2004 | Gee et al. | 136/256 |
| 2009/0277491 | A1 | * | 11/2009 | Nakamura et al. | 136/244 |

FOREIGN PATENT DOCUMENTS

| JP | 63211773 A | 9/1988 |
| JP | 02052362 U | 4/1990 |
| JP | 2000150929 A | 5/2000 |
| JP | 2001135834 A | 5/2001 |
| JP | 2002500825 A | 1/2002 |
| JP | 2002532888 A | 10/2002 |
| JP | 2006120945 A | 5/2006 |
| JP | 2006203056 A | 8/2006 |
| JP | 2006324590 A | 11/2006 |
| JP | 2006332264 A | 12/2006 |
| WO | 2007099955 A1 | 9/2007 |

OTHER PUBLICATIONS

English machine translation of JP 2006-120945 A by Shimada published May 2006.*
Japanese language International Search Report and its partial English translation for corresponding WO application PCT/JP2007/074834 lists the references above.

(Continued)

*Primary Examiner* — Jonathan Johnson
*Assistant Examiner* — Christina Chern
(74) *Attorney, Agent, or Firm* — DLA Piper LLP (US)

(57) ABSTRACT

A solar cell module with a simple configuration and high efficiency is provided. A solar cell module of the present invention is configured by electrically connecting a plurality of solar cell elements. Each of the plurality of solar cell elements includes a plurality of first connection parts representing wiring connection parts in a first electrode and a plurality of second connection parts representing wiring connection parts in a second electrode on the same surface. A first solar cell element and a second solar cell element arranged adjacent to each other have portions of the plurality of first connection parts of the first solar cell element and the plurality of second connection parts of the second solar cell element connected by a wiring having a linear form in plan view.

15 Claims, 30 Drawing Sheets

(56) References Cited

OTHER PUBLICATIONS

Japanese language office action dated Aug. 5, 2012 and its English language translation issued in corresponding Japanese application 2008551116 cites the foreign patent documents above.

Japanese language office action dated Aug. 6, 2013 and its English language Statement of Relevance of Non-English References Pursuant to 37 CFR 1.98(a)(3)(i) issued in corresponding Japanese application 2012153758 cites the foreign patent document listed above.

* cited by examiner

F I G . 1
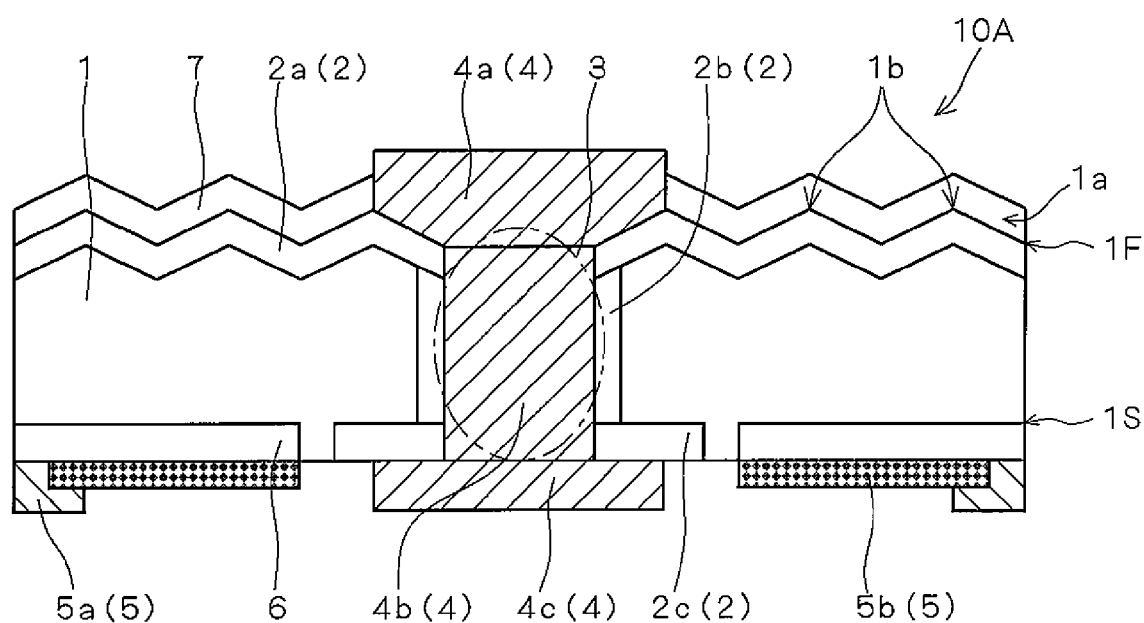

F I G. 3 A
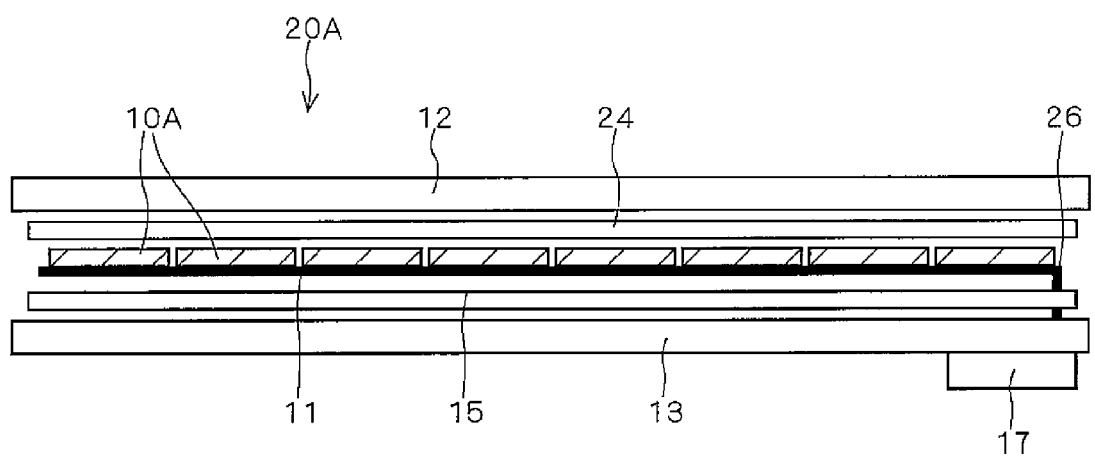
F I G. 3 B
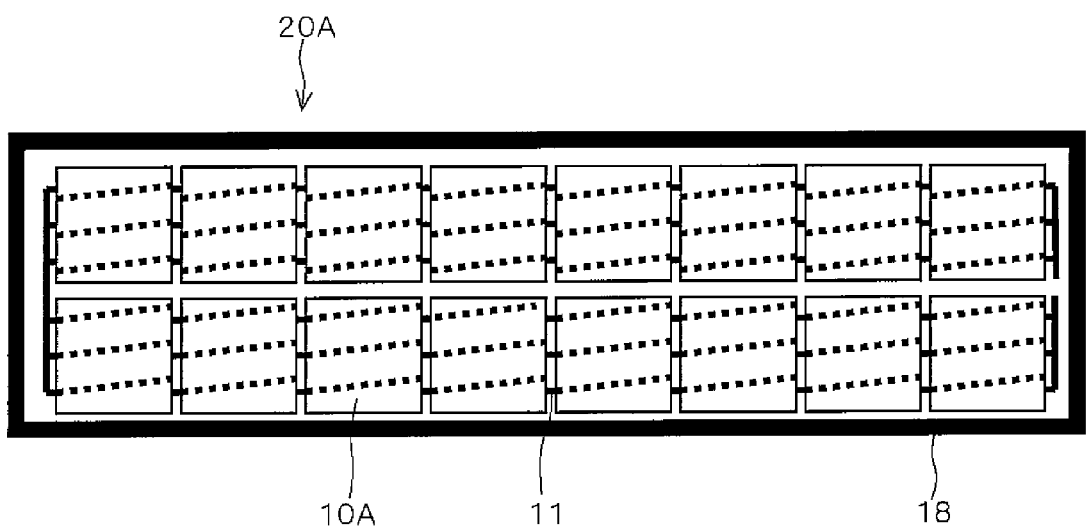

F I G . 4 A
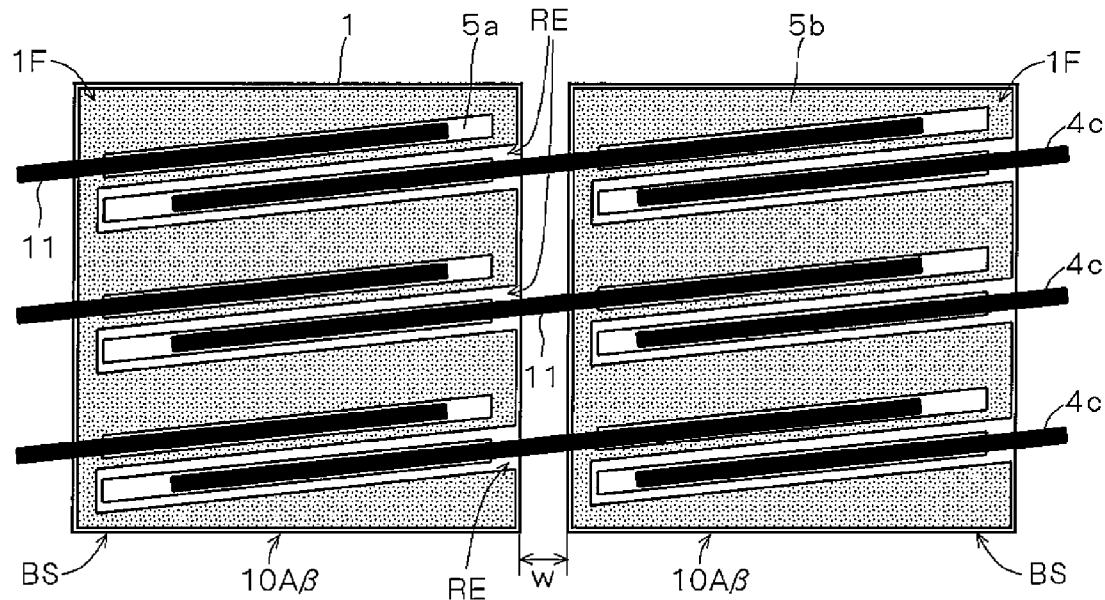
F I G . 4 B
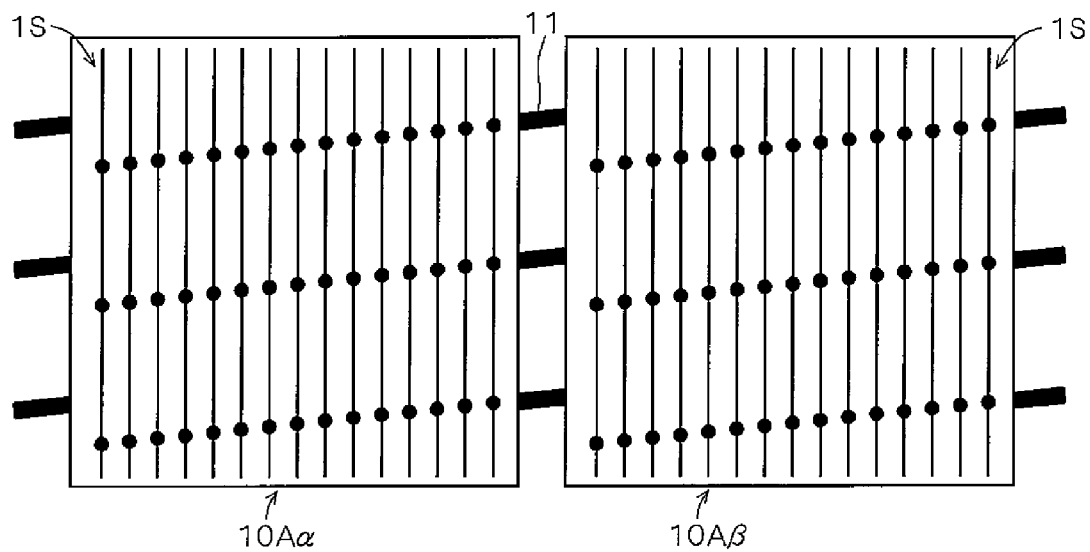

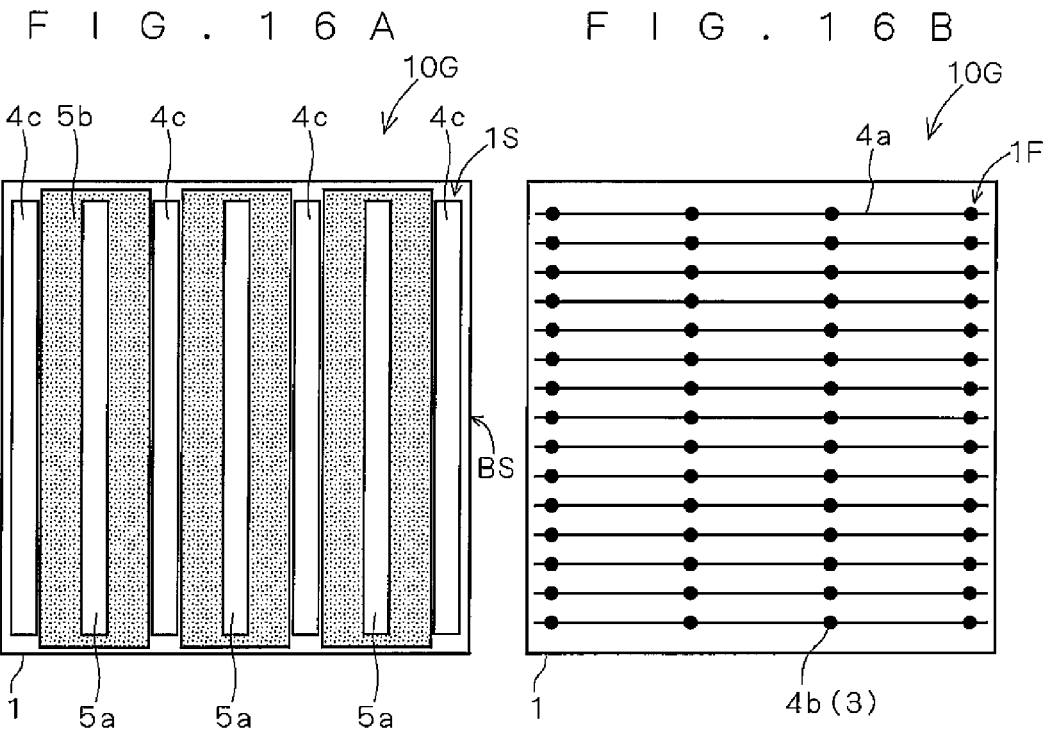
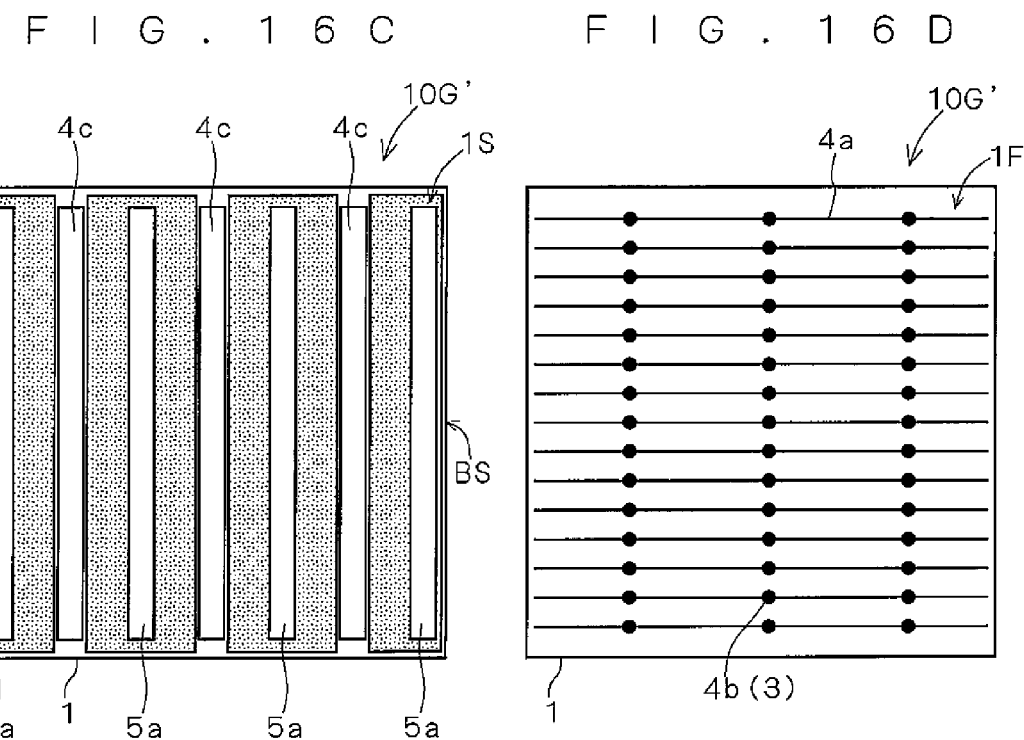

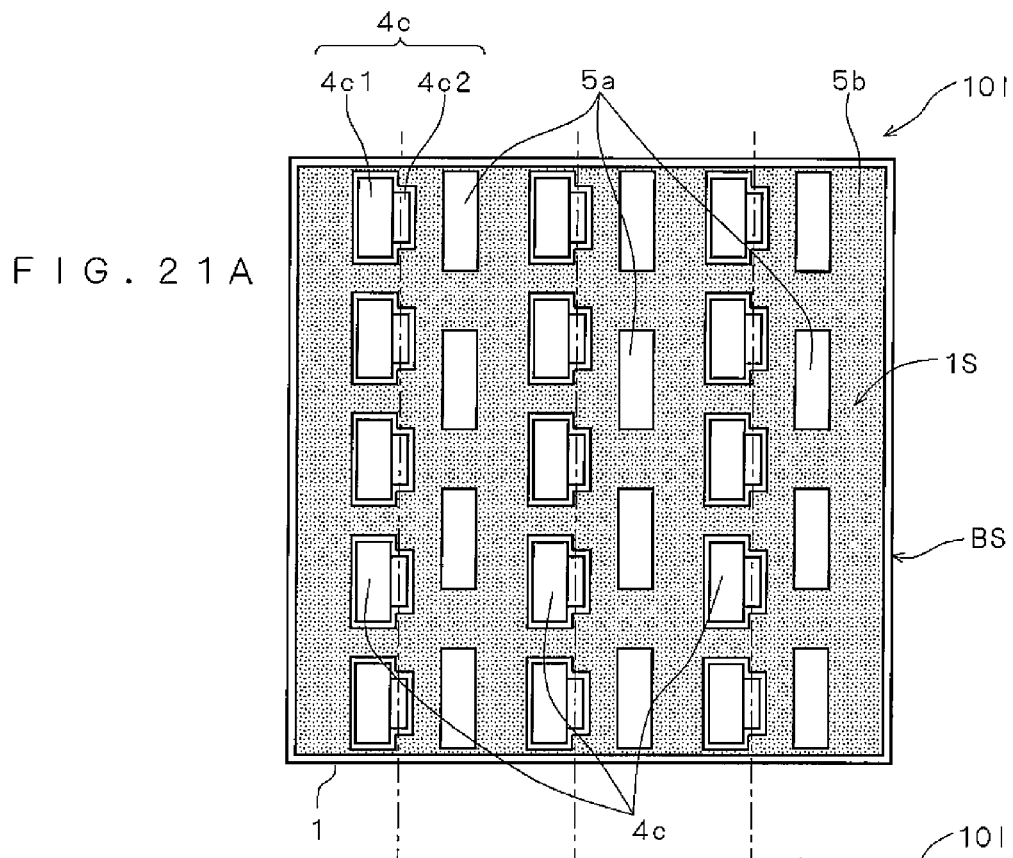
F I G . 2 1 A
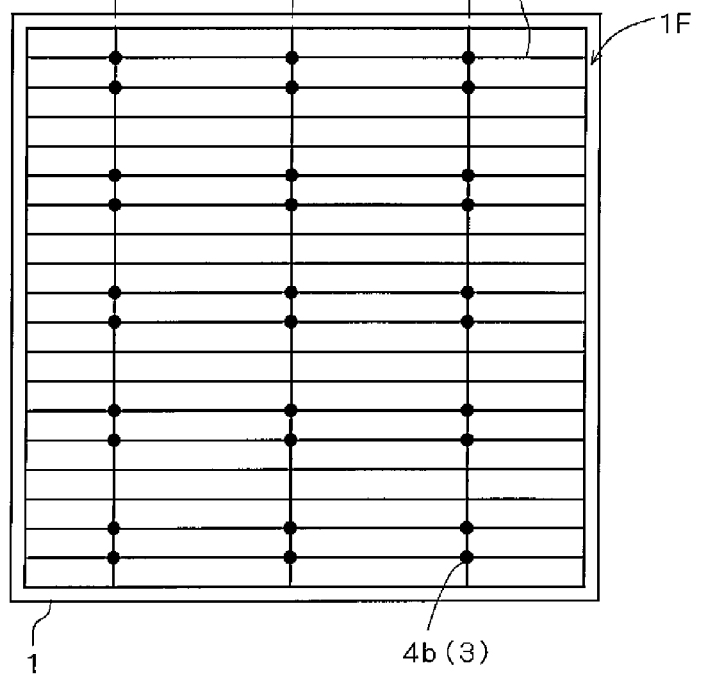
F I G . 2 1 B

SOLAR CELL MODULE WITH REAR CONTACTS

TECHNICAL FIELD

The present invention relates to a solar cell module.

BACKGROUND ART

A back contact type solar cell element is conventionally known as one type of solar cell element (refer to, for example, Japanese Laid-Open Patent Publication No. 63-211773 (Patent Document 1) and Japanese Published Patent Publication No. 2002-500825 (Patent Document 2)).

The conventional solar cell element includes a semiconductor substrate exhibiting one conductivity type, a opposite conductivity type layer exhibiting a conductivity type opposite to the semiconductor substrate, a first electrode, and a second electrode having a polarity different from the first electrode. The semiconductor substrate has a plurality of through holes penetrating between a light receiving surface and a back surface. The opposite conductivity type layer includes a first opposite conductivity type layer arranged on the light receiving surface of the semiconductor substrate, second opposite conductivity type layers arranged on the surfaces of the through holes of the semiconductor substrate, and a third opposite conductivity type layer arranged on the back surface side of the semiconductor substrate. The first electrode includes a light receiving surface electrode part formed on the light receiving surface side of the semiconductor substrate, through hole electrode parts formed in the through holes, a bus bar electrode part formed at the ends of the back surface of the semiconductor substrate and a finger electrode part formed on the back surface of the semiconductor substrate. The light receiving surface electrode part, the through hole electrode parts, the finger electrode part, and the bus bar electrode part are electrically connected. The second electrode is formed at a portion of the back surface of the semiconductor substrate where the third opposite conductivity type layer is not formed.

The conventional solar cell module has a configuration in which the bus bar electrodes of a plurality of solar cell elements, each having the above configuration, are connected by wiring.

While wide spread use of the solar cell module using such a solar cell element is further being expected, it is essential to enhance the conversion efficiency of solar light with a simple configuration. It is important to reduce the loss of photovoltaic power in enhancing the conversion efficiency.

DISCLOSURE OF THE INVENTION

In view of the above problems, it is an object of the present invention to provide a highly efficient solar cell module with a simple configuration.

A plurality of solar cell elements used in a solar cell module of the present invention include a power collecting part electrically connected to a connection part, and surrounding the connection part. When the adjacent solar cell elements are first solar cell element and second solar cell element among the plurality of solar cell elements, the wiring connected to the connection part of the first solar cell element and the connection part of the second solar cell element has a linear form in plan view.

According to such a configuration, the solar cell module of the present invention is made to a solar cell module in which loss of photovoltaic power due to internal resistance is reduced and which has a simple configuration and high conversion efficiency.

BRIEF DESCRIPTION OF THE DRAWINGS

FIG. 1 is a cross-sectional schematic view showing a structure of a solar cell element 10A according to a first embodiment of the present invention.

FIGS. 3A and 3B are diagrams schematically showing a configuration of the solar cell module 20A according to the first embodiment of the present invention.

FIGS. 4A and 4B are diagrams showing in detail the state of connection of the solar cell elements 10A by wirings 11 in the solar cell module 20A.

FIGS. 16A to 16D are plan views of a solar cell element 10G and a solar cell element 10G', which is a variation thereof, according to a seventh embodiment of the present invention.

FIGS. 21A and 21B are plan views of a solar cell element 10I according to a ninth embodiment of the present invention.

BEST MODE FOR CARRYING OUT THE INVENTION

Figure 2A:
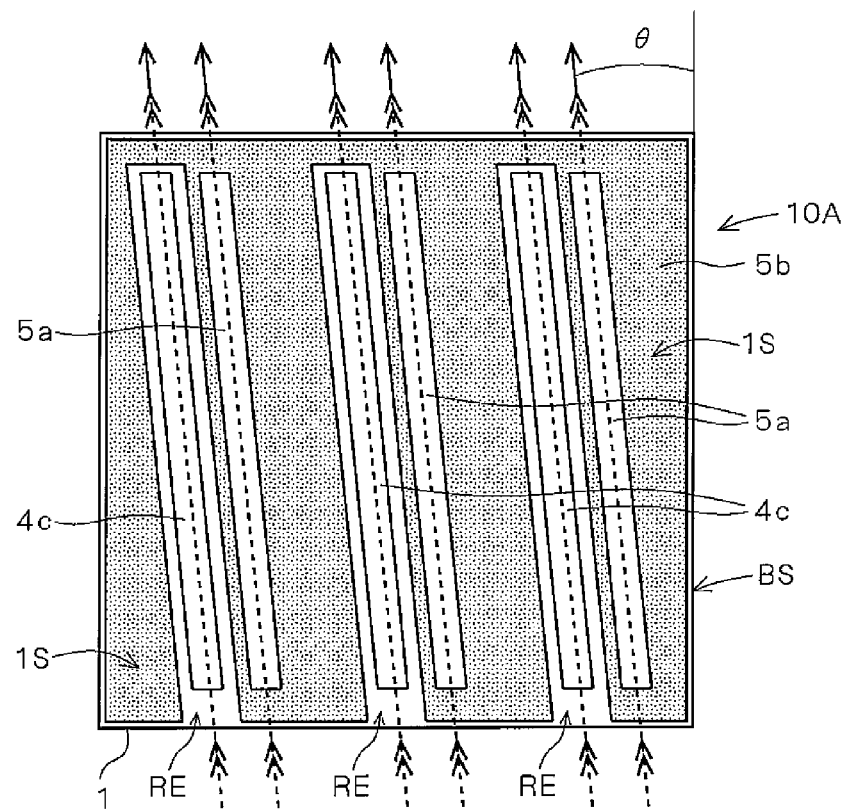
FIGS. 2A and 2B are plan views of the solar cell element 10A.

Preferred embodiments of a solar cell module of the present invention will be described in detail with reference to the drawings.

First Embodiment

<Configuration of Solar Cell Element>

FIG. 1 is a cross-sectional schematic view showing a configuration of a solar cell element 10A according to a first embodiment of the present invention.

The solar cell element 10A includes a semiconductor substrate 1 of one conductivity type, a opposite conductivity type layer 2 of a conductivity type different from the semiconductor substrate 1, a first electrode 4, and a second electrode 5.

The solar cell element 10A includes the semiconductor substrate 1 with a first surface 1F (upper surface side in FIG. 1), and a second surface 1S (lower surface side in FIG. 1) on the back side of the first surface 1F. In the solar cell element 10A, the first surface 1F serves as a light receiving surface (for the sake of convenience of description, the first surface 1F is sometimes referred to as a light receiving surface or the like of the semiconductor substrate 1).

A crystalline silicon substrate such as a single crystalline silicon substrate and a polycrystalline silicon substrate having a predetermined dopant element (impurities for conductivity type control) and exhibiting one conductivity type (e.g., p-type) is used as the semiconductor substrate 1. A mode of using a plate-shaped silicon obtained through a pull-up method such as a ribbon method may be adopted. The thickness of the semiconductor substrate 1 is preferably less than or equal to 300 μm, more preferably less than or equal to 250 μm, and even more preferably less than or equal to 150 μm.

In the present embodiment, a case where a crystalline silicon substrate exhibiting a p-type conductivity type is used as the semiconductor substrate 1 will be described by way of example. When the semiconductor substrate 1 made of a crystalline silicon substrate exhibits p-type, boron or gallium is one suitable example for the dopant element. In particular, if gallium is used, the light deterioration phenomenon can be reduced, and higher efficiency of the solar cell element can be achieved.

A texture structure (uneven structure) 1a with a great number of microscopic projections 1b are formed on the side of the first surface 1F of the semiconductor substrate 1 to reduce the reflection of the incident light at the first surface 1F and absorb more solar light into the semiconductor substrate 1. The projections 1b suitably have a width and a height of less than or equal to 2 μm, and an aspect ratio (height/width) of greater than or equal to 0.1 and less than or equal to 2. The texture structure 1a is formed through methods such as wet etching and dry etching. The texture structure 1a is not an essential configuration in the present embodiment, and may be formed as necessary.

A plurality of through holes 3 is formed between the first surface 1F and the second surface 1S in the semiconductor substrate 1. In FIG. 1, the cross section including only one through hole 3 is illustrated for the sake of convenience of illustration. As hereinafter described, the through hole 3 has a second opposite conductivity type layer 2b formed on the surface. A conductive part 4b of the first electrode 4 is formed inside the through hole 3. The through holes 3 are preferably formed at a constant pitch with a diameter in the range of greater than or equal to 50 μm and less than or equal to 300 μm. The diameters of the through hole 3 may differ between the first surface 1F and the second surface 1S. The through holes 3 are formed with a mechanical drill, a water jet, a laser processing device, or the like.

The opposite conductivity type layer 2 is a layer that exhibits a conductivity type opposite to the semiconductor substrate 1. The opposite conductivity type layer 2 includes a first opposite conductivity type layer 2a formed on the first surface 1F side of the semiconductor substrate 1, a second opposite conductivity type layer 2b formed on the surface of the through hole 3, and a third opposite conductivity type layer 2c formed on the second surface 1S side of the semiconductor substrate 1. If a silicon substrate exhibiting a conductivity type of p-type is used for the semiconductor substrate 1, the opposite conductivity type layer 2 is formed to exhibit the conductivity type of n-type. This is realized by diffusing phosphorous (P) through thermal diffusion method or the like. The method of forming the opposite conductivity type layer 2 will be described later in detail.

The first opposite conductivity type layer 2a is suitably formed as $n^+$-type having sheet resistance of about 60 to 300Ω/□. With such a range, increase in surface recombination and increase in surface resistance at the first surface 1F can be suppressed. In particular, in a case where the first opposite conductivity type layer 2a is arranged in combination with the texture structure 1a, short-circuit current of the solar cell element 10A is greatly increased. The value of the sheet resistance can be measured through a four-probe method. For instance, four metal needles lined on a straight line are contacted to the surface of the semiconductor substrate 1 while applying pressure, current is flowed to two needles on the outer side, and the voltage generated between two needles on the inner side is measured, whereby the resistance value is obtained from that voltage and the flowed current by the Ohm's law.

The first opposite conductivity type layer 2a is preferably formed to a depth of about 0.2 μm to 0.5 μm at the region other than the portion formed with the through hole 3 in the first surface 1F of the semiconductor substrate 1. The third opposite conductivity type layer 2c merely needs to be formed at the peripheral part of the through hole 3 in the second surface 1S of the semiconductor substrate 1.

A pn junction is formed between the opposite conductivity type layer 2 and the bulk region of the semiconductor substrate 1 (region other than the opposite conductivity type layer 2) in the solar cell element 10A by including the opposite conductivity type layer 2.

The solar cell element 10A includes a high concentration doped layer 6 inside the semiconductor substrate 1. The high concentration doped layer 6 is a layer arranged with the aim of generating an internal electric field inside the solar cell element 10A (with the aim of achieving a so-called BSF effect) to prevent lowering of power generation efficiency caused by occurrence of carrier recombination in the vicinity of the second surface 1S of the semiconductor substrate 1. The high concentration doped layer 6 is formed over substantially the entire surface other than the vicinity of the through hole 3 on the side of the second surface 1S of the semiconductor substrate 1. More specifically, the high concentration doped layer 6 is formed so as not to contact the third opposite conductivity type layer 2c (so that the bulk region of the semiconductor substrate 1 exists in between) on the side of the second surface 1S. The specific formation pattern differs according to the formation pattern of the first electrode 4.

"High concentration" herein means that a dopant element exists at a concentration higher than the concentration of the dopant element that is doped to exhibit one conductivity type in the semiconductor substrate 1. The high concentration doped layer 6 is suitably formed, e.g., by diffusing a dopant element such as boron or aluminum from the second surface 1S so that the concentration of the dopant element becomes about $1 \times 10^{18}$ to $5 \times 10^{21}$ atoms/cm$^3$. The high concentration doped layer 6 thereby exhibits a conductivity type of p$^+$-type and realizes ohmic contact with a power collecting part 5b to be described later.

If boron is the dopant element, the high concentration doped layer 6 can be formed using thermal diffusion method with BBr$_3$ (boron tribromide) as a diffusion source. If aluminum is the dopant element, the high concentration doped layer 6 can be formed by applying and firing aluminum paste containing aluminum powder, organic vehicle, and the like.

The high concentration doped layer 6 is preferably formed to greater than or equal to 70% and less than or equal to 90% of the entire region of the second surface 1S when the second surface 1S of the semiconductor substrate 1 is seen in plan view. In the case of greater than or equal to 70%, the BSF effect for enhancing the output characteristics of the solar cell element 10A is obtained. The concentration is made to lower than or equal to 90% since it is necessary to ensure the region for forming a first connection part 4c of the first electrode 4 and a non-formation region RE (described later) of the power collecting part 5b that becomes necessary with the formation of the first connection part 4c. In the solar cell element 10A of the present invention, however, the formation region of the first connection part 4c can be made smaller than in the conventional solar cell element as will be described later, and thus the high concentration doped layer 6 can be formed in a sufficiently large range of at a maximum of 90% of the entire region when the second surface 1S is seen in plan view.

The solar cell element 10A includes an antireflection coating 7 on the first surface 1F side of the semiconductor substrate 1. The antireflection coating 7 serves to reduce the reflection of the incident light at the surface of the semiconductor substrate 1 and is formed on the first opposite conductivity type layer 2a. The antireflection coating 7 is suitably formed with a silicon nitride film (SiN$_x$ film (composition ratio (x) ranges with Si$_3$N$_4$ stoichiometry as the center)), oxide material film (TiO$_2$ film, SiO$_2$ film, MgO film, ITO film, SnO$_2$ film, ZnO film), or the like. The suitable value for the thickness of the antireflection coating 7 differs depending on the constituting material, but is set to a value that realizes nonreflecting condition with respect to the incident light. For instance, if a silicon substrate is used for the semiconductor substrate 1, the antireflection coating 7 is formed with a material having an index of refraction of about 1.8 to 2.3 to a thickness of about 500 to 1200 Å. The arrangement of the antireflection coating 7 is not essential in the present embodiment and may be formed as necessary. The antireflection coating 7 is formed through PECVD method, vacuum deposition method, sputtering method, and the like.

The first electrode 4 is configured by a main electrode part 4a formed on the first surface 1F of the semiconductor substrate 1, a first connection part 4c formed on the second surface 1S, and a conduction part 4b arranged in the through hole 3 for electrically connecting the main electrode part 4a with the first connection part 4c. The main electrode part 4a has a function of collecting carriers generated at the first surface 1F, and the first connection part 4c serves as a wiring connection part for connecting external wirings. The main electrode part 4a, the conduction part 4b, and the first connection part 4c are formed by applying conductive paste containing metallic powder on the first surface 1F (for the main electrode part 4a and the conduction part 4b) or the second surface 1S (for the first connection part 4c) of the semiconductor substrate 1 in a predetermined electrode pattern, and then firing the same.

On the other hand, the second electrode 5 has a polarity different from the first electrode 4 and is configured by a second connection part (bus bar part) 5a and a power collecting part 5b surrounding the second connection part 5a. The power collecting part 5b is formed on the high concentration doped layer 6 formed on the side of the second surface 1S of the semiconductor substrate 1 and collects carriers generated on the side of the second surface 1S. The second connection part 5a serves as a wiring connection part for connecting external wirings. When forming both the parts, at least part of the second connection part 5a is preferably configured to overlap with the power collecting part 5b.

The power collecting part 5b is formed, e.g., by applying conductive paste containing aluminum and silver as the metallic powder on the high concentration doped layer 6 in a predetermined electrode pattern, and then firing the same. If aluminum paste is used for the conductive paste, the high concentration doped layer 6 and the power collecting part 5b can be simultaneously formed, as will be described later.

The second connection part 5a is formed by applying conductive paste containing silver as a main component as the metallic powder on the high concentration doped layer 6 in a predetermined electrode pattern, and then firing the same. The second connection part 5a is thereby electrically connected to the power collecting part 5b.

If silver is used for the second connection part 5a, and aluminum is used for the power collecting part 5b, the second connection part 5a preferably contains zinc or a zinc alloy. According to such a configuration, the rise in resistance between the power collecting part 5b and the second connection part 5a can be reduced. In particular, in the case of being formed to contain zinc or a zinc alloy at greater than or equal to 7 parts by weight and lower than or equal to 35 parts by weight with respect to silver of 100 parts by weight, the output characteristics of the solar cell element 10A further less likely to lower.

According to such a configuration, there is realized a solar cell element 10A having $n^+/p/p^+$ junction of the opposite conductivity type layer 2, the semiconductor substrate 1, and the high concentration doped layer 6 between the first electrode 4 and the second electrode 5.

Figure 2B:
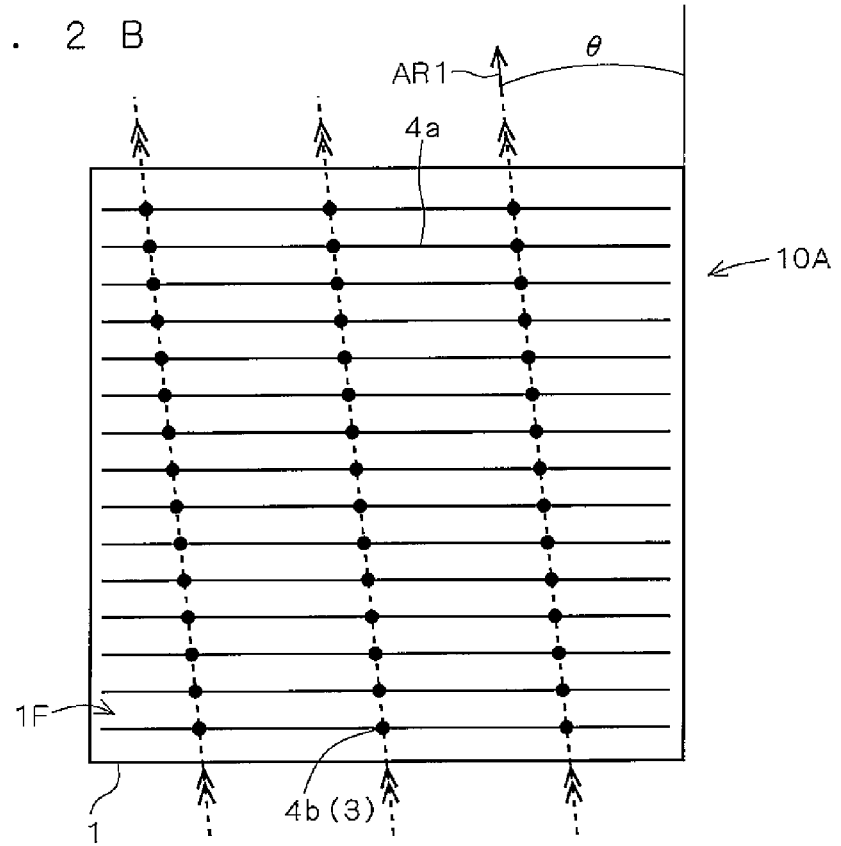

FIGS. 2A and 2B are plan views of the solar cell element 10A showing one example of the electrode patterns of the first electrode 4 and the second electrode 5. FIG. 2A is a diagram of the solar cell element 10A seen from the side of the second surface 1S in plan view (also referred to as a back surface view), and FIG. 2B is a diagram of the solar cell element 10A seen from the side of the first surface 1F in plan view (also referred to as a light receiving surface view). To facilitate the understanding on the relationship between the electrode pattern arranged on the side of the first surface 1F and the electrode pattern arranged on the side of the second surface 1S, the electrode patterns in a relationship where the front and back surfaces of the solar cell element 10A are actually inverted is not shown in FIGS. 2A and 2B, and illustration is made such that the electrode pattern on the back surface side in the case where the solar cell element 10A is virtually seen through from the light receiving surface side shown in FIG. 2B has a relationship corresponding to the electrode pattern shown in FIG. 2A. Although not mentioned, this holds true for the subsequent figures in a similar relationship.

As shown in FIG. 2B, a plurality of conduction parts 4b is formed in the solar cell element 10A in correspondence to the plurality of through holes 3 formed in the semiconductor substrate 1. That is, the formation positions of the conduction parts 4b shown in black dots in FIG. 2B correspond to the formation positions of the through holes 3. In the present embodiment, there is shown a case where the plurality of through holes 3 is formed so that an array of a plurality of columns (three columns in FIG. 2B) is formed parallel to a direction (direction inclined by an inclination angle θ with respect to a base side BS of the first surface 1F of the semiconductor substrate 1) shown with an arrow AR1 in FIG. 2B, and the conduction part 4b is formed inside each of the plurality of through holes 3. The base side BS is the side parallel to the arraying direction in the case of arraying the plurality of solar cell elements 10A whereby to form the solar cell module 20A. The direction along the base side BS (direction parallel to the base side BS) is referred to as a reference direction. In FIG. 2B, the through holes 3 are arranged so as to be arrayed in a plurality of (three in FIGS. 2A and 2B) straight lines, and the solar cell element 10A includes the through holes 3 (conduction parts 4b) formed at substantially equal intervals.

It is to be noted that the term "parallel" in the present description should not be strictly defined as in a mathematical definition.

Furthermore, the main electrode parts 4a are formed on the first surface 1F as a plurality of linear patterns connecting with the plurality of (three in FIG. 2B) conduction parts 4b belonging to different arrays. Such main electrode parts 4a are suitably formed to have a line width of about 50 to 100 μm. Thus, when light is evenly emitted onto the first surface 1F, concentrating of the current flow at one conduction part 4b, and increase in the resistance loss is reduced. The output characteristics of the solar cell element are thus less likely to lower. The pattern of the main electrode parts 4a is not limited to that shown in FIG. 2B, and various patterns can be formed (this holds true for the subsequent embodiments).

In addition, in the solar cell element 10A, high light receiving efficiency is realized since the occupying proportion of the main electrode parts 4a configuring the first electrode 4 is very small compared to the entire surface of the first surface 1F, or the light receiving surface, and the carriers generated at the first surface 1F can be efficiently collected since the main electrode parts 4a are uniformly formed.

Meanwhile, as shown in FIG. 2A, the first connection parts 4c having an elongated shape (parallelogram) with a longitudinal direction in the arraying direction of the conduction parts 4b (i.e. having a band form), and being connected to the conduction parts 4b are formed at positions immediately below the plurality of conduction parts 4b (through holes 3) at the second surface 1S of the semiconductor substrate 1. The first connection parts 4c are formed in plural (three in FIG. 2A) in correspondence to the array of the conduction parts 4b.

The power collecting part 5b is formed over substantially the entire surface of the second surface 1S excluding the first connection parts 4c, the peripheral portion of the first connection parts 4c, and the second connection parts 5a of the second electrodes 5. "Substantially the entire surface" herein refers to the case where the power collecting part 5b is formed at greater than or equal to 70% and less than or equal to 90% of the entire region of the second surface 1S when the second surface 1S of the semiconductor substrate 1 is seen in plan view. The region near the edge surfaces of the semiconductor substrate 1 of the solar cell element 10A that is not formed with the first connection parts 4c but is to be covered by a wiring 11 during the formation of the solar cell module 20A, as will be described later, is assumed as a non-formation region RE where the power collecting part 5b is not formed to prevent the wiring 11 from contacting the power collecting part 5b whereby to reduce the occurrence of leakage. The arrangement of the power collecting part 5b over substantially the entire surface other than the region formed with the first connection parts 4c and the non-formation region RE shortens the movement distances of the carriers collected at the power collecting part 5b and increases the amount of carriers to be retrieved from the second connection parts 5a, and thus contributes to enhancement of the output characteristics of the solar cell element 10A.

Furthermore, the second connection parts 5a are arranged so that at least parts thereof overlap with the power collecting part 5b. The plurality of second connection parts 5a (three in correspondence to the first connection parts 4c in FIG. 2A), has an elongated shape (parallelogram) similar to the first connection parts 4c (i.e., having a band form) in a mode of being parallel to each of the plurality of first connection parts 4c. The formation position of each second connection part 5a (in particular, formation interval with the adjacent first connection part 4c) is defined according to the arrangement interval of the adjacent solar cell elements 10A in the case where the plurality of solar cell elements 10A is arranged adjacent to each other (in the case of configuring a solar cell module). This will be described later.

<Solar Cell Module>

The solar cell element 10A according to the present embodiment can be used alone, but a suitable structure is obtained by adjacently arranging a plurality of solar cell elements 10A having the same structure and connecting the same in series to one another to configure a module. The solar cell module formed using the plurality of solar cell elements 10A will be described below.

FIGS. 3A and 3B are diagrams schematically showing a configuration of such a solar cell module 20A. FIG. 3A is a cross-sectional view of the solar cell module 20A, and FIG. 3B is a front view of the solar cell module 20A seen from the light receiving surface side.

As shown in FIG. 3A, the solar cell module 20A mainly includes a translucent member 12 made of glass and the like, a surface side filler 24 made of transparent ethylene-vinyl acetate copolymer (EVA) and the like, the plurality of solar cell elements 10A, a back side filler 15 made of EVA and the like, and a back surface protective member 13 having polyethylene telephthalate (PET) or a metal foil sandwiched with polyvinyl fluoride resin (PVF) and the like. The plurality of solar cell elements 10A has the adjacent solar cell elements 10A connected in series to each other with the wirings 11 serving as a connection member.

FIGS. 4A and 4B are diagrams showing the detail of connection of the solar cell elements 10A by the wirings 11 in the solar cell module 20A. FIG. 4A is a diagram of two solar cell elements 10A adjacent to each other in the solar cell module 20A seen in plan view from the side of the second surface 1S. FIG. 4B is a diagram of the same in plan view seen from the side of the first surface 1F.

FIGS. 3A and 3B only show schematic cross sections, but one first connection part 4c of one of the adjacent solar cell elements 10A and one second connection part 5a of the other solar cell element 10A are connected by an elongated (linear) wiring 11 in the solar cell module 20A, as shown in FIG. 4A. In the case of FIGS. 4A and 4B, connection is made at three locations. In the following description, of the two solar cell elements 10A connected by the wirings 11 in FIGS. 4A and 4B, the solar cell element 10A having the wiring 11 connected to the first connection part 4c is referred to as a first solar cell element 10Aα, and the solar cell element 10A having the wiring connected to the second connection part 5a is referred to as a second solar cell element 10Aβ, for the sake of convenience.

More specifically, in the solar cell module 20A, the first solar cell element 10Aα and the second solar cell element 10Aβ are arranged such that the respective base sides BS are positioned on the same straight line and so that the longitudinal directions of the first connection parts 4c of the first solar cell element 10Aα and the longitudinal directions of the corresponding second connection parts 5a of the second solar cell element 10Aβ are positioned on substantially the same straight line. The first solar cell element 10Aα and the second solar cell element 10Aβ are connected by the linear wirings 11 in plan view on substantially the same straight line. This is because the arrangement mode of the first connection parts 4c and the second connection parts 5a (e.g., inclination angle θ, spacing between the first connection part 4c and the second connection part 5a, and the like) is defined so that the first connection parts 4c of the first solar cell element 10Aα and the second connection parts 5a of the second solar cell element 10Aβ satisfy the above positional relationship in the case where the solar cell elements 10A are adjacently arranged at a predetermined distance w. In other words, the first connection parts 4c and the second connection parts 5a are arranged so that the first solar cell element 10Aα and the second solar cell element 10Aβ are electrically connectable with the plurality of wirings 11 in the case where the first solar cell element 10Aα and the second solar cell element 10Aβ are arranged at a distance w so as to be translationally symmetric to each other.

The inclination angle θ is preferably greater than or equal to 0.3 degrees and less than or equal to 15 degrees if a semiconductor substrate 1 of 15 cm squares is used. If the size of one side of the semiconductor substrate 1 is greater than or equal to 15 cm, a smaller value may be adopted. In this case, since it can be seen as if the wirings 11 are formed substantially perpendicular to one side of the rectangular semiconductor substrate 1, a beautiful appearance is obtained.

In the solar cell module 20A, the relative arrangement relationship among the sets of the first connection part 4c and the second connection part 5a in a relationship of being connected with one wiring 11 is equivalent (i.e., sets of first connection part 4c and second connection part 5a are all in translationally symmetric relationship) excluding the solar cell element 10A arranged at the ends, and thus the wiring 11 having the same shape can be used for the connection of the each set of the first connection part 4c and the second connection part 5a.

A wiring, e.g., having a thickness of about 0.1 to 0.4 mm and a width of about 2 mm, and having a band shaped copper foil with the entire surface covered by a solder material cut into a predetermined length in the longitudinal direction can be used for the wiring 11. In the case of the wiring 11 covered with a solder material, it is soldered to the first connection part 4c and the second connection part 5a of the solar cell element 10A using hot air or a soldering iron, or using a reflow furnace and the like.

In the solar cell module 20A connected with the wirings 11 in such a mode, the plurality of first connection parts 4c is individually and directly connected to the second connection parts 5a of the adjacent solar cell elements, as opposed to the conventional solar cell module in which connection by one wiring is carried out at the bus bar part arranged at the end of the solar cell element, and thus a path of a collecting current from each main electrode part 4a is shortened. Thus, the loss of photovoltaic power due to the internal resistance is less likely to occur than in the conventional solar cell module.

The wiring 11 merely needs to be connected to one portion of each of the first connection part 4c and the second connection part 5a as long as the connection therebetween is sufficiently obtained (resistance is sufficiently small), and need not necessarily be arranged so as to cover the entire first connection part 4c and the second connection part 5a. Regarding the connection of the first connection part 4c and the wiring 11, the wiring 11 is arranged so that the wiring 11 exists at the portion immediately below the through hole 3 (conduction part 4b). Since the wiring 11 also exists as the conductive member in addition to the first connection part 4c immediately below the through hole 3 where the wiring 11 is arranged, and thus the cross sectional area of the conductive portion becomes larger. Thus, the reduction in the conduction resistance in retrieving the collecting current is realized.

An effect of facilitating the positioning of the wirings 11 in connection is obtained by arranging the first connection parts 4c of the first solar cell element 10Aα and the second connection parts 5a of the second solar cell element 10Aβ on the same straight lines. That is, there is obtained an effect that the connection step of the solar cell element 10A and the wirings 11 is less likely to become complicated.

Furthermore, in the solar cell module 20A according to the present embodiment, the wirings 11 are arranged connecting only with the first connection parts 4c and the second connection parts 5a arranged on the side of the second surface 1S of the solar cell element 10A, and thus the wirings 11 need not be bent to be connected on the first surface 1F side as in the conventional solar cell module. Accordingly, the wirings are less likely to be stripped from the electrodes.

In addition, the solar cell elements 10A are connected only at the second surface 1S side, and thus the region the wirings 11 that have glaze due to the metal raw material is relatively small when the solar cell module is seen from the first surface 1F side or the light receiving surface side, as shown in FIG. 4B. Thus, the aesthetic appearance of the solar cell module 20A is not affected.

If a material having high reflectance such as a white material is used for the back surface protective member 13, the solar cell elements 10A are irradiated with light such that the light emitted between the solar cell elements 10A is reflected diffusely, and thus the light receiving quantity at the solar cell elements 10A further increases.

<Manufacturing Method of the Solar Cell Element>

A method of manufacturing the solar cell element will be described next.

(Step of Preparing a Semiconductor Substrate)

First, a semiconductor substrate 1 exhibiting a conductivity type of p-type is prepared.

If a single crystalline silicon substrate is used for the semiconductor substrate 1, the semiconductor substrate 1 can be obtained by cutting out a single crystalline silicon ingot made through a known manufacturing method such as FZ and CZ method to a predetermined thickness. If a polycrystalline silicon substrate is used for the semiconductor substrate 1, the semiconductor substrate 1 is obtained by cutting out a polycrystalline silicon ingot made through a known manufacturing method such as casting method and in-mold solidifying method to a predetermined thickness. If a plate-shaped silicon obtained through a pull-up method such as ribbon method is used, the plate-shaped silicon is cut into a predetermined size, and a surface polishing process and the like are performed as necessary to obtain a desired semiconductor substrate 1.

In the following, a case of using a crystalline silicon substrate exhibiting a conductivity-type of p-type obtained by doping B or Ga as the dopant element to about $1 \times 10^{15}$ to $1 \times 10^{17}$ atoms/cm$^3$ is used for the semiconductor substrate 1 will be described by way of example. The doping of the dopant element can be realized by dissolving an appropriate amount of the dopant element itself or a dopant material containing an appropriate amount of the dopant element in silicon into a silicon solution in each silicon ingot manufacturing method described above.

In order to remove a mechanically damaged layer or polluted layer of the surface layer of the semiconductor substrate 1 involved in cut-out (slicing), each surface layer on the front surface side and the back surface side of the cut-out semiconductor substrate 1 is etched by about 10 to 20 µm with NaOH and KOH, a mixed liquid of hydrofluoric acid and nitric acid, or the like and then washed with pure water to remove organic components and metal components.

<Through Hole Formation Step>

A through hole 3 is formed between the first surface 1F and the second surface 1S of the semiconductor substrate 1.

The through hole 3 is formed using a mechanical drill, a water jet, a laser processing device, or the like. In such a case, the processing is performed from the second surface 1S side towards the first surface 1F side of the semiconductor substrate 1 to avoid the first surface 1F to be the light receiving surface from being damaged. However, if the damage on the semiconductor substrate 1 by the processing is small, the processing may be performed from the first surface 1F side towards the second surface 1S side.

<Texture Structure Formation Step>

A texture structure 1a having microscopic projections (convex parts) 1b to effectively reduce the light reflectance is formed on the light receiving surface side of the semiconductor substrate 1 formed with the through hole 3.

The method of forming the texture structure 1a includes a wet etching method with an alkaline aqueous solution such as NaOH and KOH, and a dry etching method using an etching gas having a property of etching Si.

When the wet etching method is used, the second surface 1S side is preferably masked with an etching preventive material to prevent concave/convex parts from forming on the second surface 1S side of the semiconductor substrate 1.

When the dry etching method is used, the microscopic texture structure 1a can be formed basically only on the processing surface side (first surface 1F side). When RIE method (Reactive Ion Etching method) is used for the dry etching method, the microscopic texture structure 1a capable of suppressing the light reflectance to a very low degree over a wide wavelength range can be formed over a wide area in a short period of time, which is very effective in enhancing the efficiency of the solar cell element 10A. In particular, since the RIE method is capable of forming the concave-convex structure without being greatly influenced by plane orientation of the crystal, the microscopic texture structure 1a having low reflectance can be uniformly formed over the entire substrate irrespective of the plane orientation of each crystal grain in the polycrystalline silicon substrate even if a polycrystalline silicon substrate is used for the semiconductor substrate 1.

<Opposite Conductivity Type Layer Formation Step>

A opposite conductivity type layer 2 is then formed. That is, the first opposite conductivity type layer 2a is formed on the first surface 1F of the semiconductor substrate 1, the second opposite conductivity type layer 2b is formed on the surface of the through hole 3, and the third opposite conductivity type layer 2c is formed on the second surface 1S.

In the case of using a crystalline silicon substrate exhibiting a conductivity type of p-type as the semiconductor substrate 1, P (phosphorous) is preferably used for the n-type doping element for forming the opposite conductivity type layer 2.

The opposite conductivity type layer 2 is formed by an application and thermal diffusion method of applying $P_2O_5$ in a paste form to formation target locations on the semiconductor substrate 1 and thermally diffusing the same, a gaseous phase thermal diffusion method of diffusing to the formation target locations with $POCl_3$ (phosphorous oxychloride) in a gas form as the diffusion source, an ion implantation method of diffusing P$^+$ ions directly to the location to be formed with the opposite conductivity type layer 2, and the like. The gaseous phase thermal diffusion method is preferably used since the opposite conductivity type layers 2 can be simultaneously formed at the formation target locations on both main surfaces of the semiconductor substrate 1 and the surface of the through hole 3.

Under the conditions where a diffusion region is formed other than the formation target locations, the opposite conductivity type layer 2 may be formed after forming a diffusion preventive layer in advance at that portion, thereby partially preventing the diffusion. Alternatively, the diffusion region formed other than the formation target locations may be subsequently etched and removed without forming the diffusion preventive layer. If the high concentration doped layer 6 is formed with aluminum paste, as will be described later, after the formation of the opposite conductivity type layer 2, aluminum or a p-type dopant element can be diffused to a sufficient depth at a sufficient concentration, and thus the presence of the shallow diffusion region that has been already formed can be ignored. That is, the opposite conductivity type layer 2 existing at the location to be formed with the high concentration doped layer 6 need not be particularly removed. In such a case, an etching paste of glass and the like is applied and fired only at the peripheries of the regions to be formed with the first connection parts 4c to perform pn isolation.

<Antireflection Coating Formation Step>

Next, the antireflection coating 7 is preferably formed on the first opposite conductivity type layer 2a.

A PECVD method, a deposition method, a sputtering method, and the like may be employed for the method of forming the antireflection coating 7. If the antireflection coating 7 made of SiNx film is formed through the PECVD method, the antireflection coating 7 is formed by diluting a mixed gas of silane ($Si_3H_4$) and ammonia ($NH_3$) with nitrogen ($N_2$) with the inside of the reaction chamber at 500° C., and thereafter forming the diluted gas into plasma with glow discharge degradation and depositing the same.

The antireflection coating 7 may be formed while patterning with a predetermined pattern so that the antireflection coating 7 is not formed at the locations to be formed with the main electrode parts 4a later. The patterning method includes, in addition to the method of removing the antireflection coating 7 at the locations to be formed with the main electrode parts 4a using an etching method (wet etching or dry etching) using a mask such as resist, a method of forming a mask in advance prior to the formation of the antireflection coating 7, and removing the same after forming the antireflection coating 7.

Alternatively, instead of employing the patterning method, a so-called fire-through method of uniformly forming the antireflection coating 7, and thereafter, directly applying conductive paste for forming the main electrode parts 4a on the surface of the antireflection coating 7 and at the location to be formed with the main electrode parts 4a, and firing the same to electrically contact the main electrode parts 4a with the first opposite conductivity type layer 2a. The fire through method will be described later.

<High Concentration Doped Layer Formation Step>

The high concentration doped layer 6 is formed on the second surface 1S of the semiconductor substrate 1.

In the case of using boron for the dopant element, the high concentration doped layer 6 can be formed at a temperature of about 800 to 1100° C. through the thermal diffusion method having $BBr_3$ (phosphorous tribromide) as the diffusion source. In this case, prior to the formation of the high concentration doped layer 6, a diffuse barrier made of oxide film and the like is formed on a region other than the location to be formed with the high concentration doped layer 6 such as the already formed opposite conductivity type layer 2, and is desirably removed after forming the high concentration doped layer 6.

In the case of using aluminum for the dopant element, the high concentration doped layer 6 can be formed by applying aluminum paste made of aluminum powder, organic vehicle, and the like on the second surface 1S of the semiconductor substrate 1 through a printing method, and thereafter performing thermal treatment (firing) at a temperature of about 700 to 850° C. to diffuse aluminum towards the semiconductor substrate 1. In this case, the high concentration doped layer 6 of the desired diffusion region can be formed only on the second surface 1S of the printed surface of the aluminum paste. Furthermore, a layer of aluminum formed on the second surface 1S can be used as a power collecting part 5b without being removed after the firing.

<Electrode Formation Method>

The main electrode parts 4a and the conduction parts 4b configuring the first electrode 4 is then formed.

The main electrode parts 4a and the conduction parts 4b are formed using an application method. Specifically, the main electrode parts 4a and the conduction parts 4b can be formed by applying a conductive paste, which is obtained by, e.g., adding organic vehicle of 10 to 30 parts by weight and glass frit of 0.1 to 10 parts by weight with respect to 100 parts by weight of metal powder of silver and the like, to the first surface 1F of the semiconductor substrate 1 with formation patterns of the main electrode parts 4a shown in FIG. 2B thereby to form an applied film, and thereafter, firing the applied film for about several tens seconds to several tens minutes at a maximum temperature of 500 to 850° C. In this case, the conduction parts 4b are formed by filling the conductive paste into the through holes 3 when applying the conductive paste. However, the conductive paste is applied from the second surface 1S side when forming the first connection parts 4c, as will be described later, in which case the conductive paste is again filled into the through holes 3 and thereafter fired, and thus the through holes 3 need not be sufficiently filled with the conductive paste when applying the conductive paste to the first surface 1F.

After applying the conductive paste and before the firing, the solvent in the applied film is preferably evaporated at a predetermined temperature to dry the applied film. The main electrode parts 4a and the conduction parts 4b may be formed by respective application/filing, e.g., filling and drying the conductive paste only in the through holes 3 in advance, and thereafter, applying and firing the conductive paste in the patterns of the main electrode parts 4a as shown in FIG. 2B, as described above.

In the case where the antireflection coating 7 is formed prior to the formation of the main electrode parts 4a as described above, the main electrode parts 4a are formed in the patterned region or the main electrode parts 4a are formed by the fire through method.

In the case of forming the main electrode parts 4a by the fire through method, a fire-through-use conductive paste in which, e.g., the glass frit contains a lead glass frit or phosphorous in the conductive paste is applied on the antireflection coating, and fired at a high temperature of higher than or equal to 800° C. to fire through the antireflection coating 7.

Alternatively, the antireflection coating 7 may be formed after forming the main electrode parts 4a. In this case, the antireflection coating 7 need not be patterned and the fire-through method need not be employed, and thus the conditions for forming the main electrode parts 4a are alleviated. For example, the main electrode parts 4a can be formed without performing firing at a high temperature of about 800° C.

The power collecting part 5b is then formed on the second surface 1S of the semiconductor substrate 1.

An application method can be used to form the power collecting part 5b. Specifically, the power collecting part 5b is formed by applying a conductive paste, which is obtained by adding organic vehicle of 10 to 30 parts by weight and a glass frit of 0.1 to 5 parts by weight with respect to 100 parts by weight of metal powder of aluminum, silver, or the like, to the second surface 1S of the semiconductor substrate 1 with a formation pattern of the power collecting part 5b shown in FIG. 2A thereby to form an applied film, and thereafter, firing the applied film for about several tens seconds to several tens minutes at a maximum temperature of 500 to 850° C. As described above, the high concentration doped layer 6 and the power collecting part 5b can be simultaneously formed if aluminum paste is used.

Furthermore, the first connection parts 4c and the second connection parts (bus bar parts) 5a are formed on the second surface 1S of the semiconductor substrate 1.

The first connection parts 4c and the second connection parts 5a can be simultaneously formed using an application method. Specifically, the first connection parts 4c and the second connection parts 5a are formed by applying a conductive paste, which is obtained by adding an organic vehicle of 10 to 30 parts by weight and a glass frit of 0.1 to 5 parts by weight to a metal powder of 100 parts by weight such as silver, to the second surface 1S of the semiconductor substrate 1 with the formation patterns of the first connection parts 4c and the second connection parts 5a shown in FIG. 2A thereby to form an applied film, and thereafter, firing the applied film for about several tens seconds to several tens minutes at a maximum temperature of 500 to 850° C.

The first connection parts 4c and the second connection parts 5a may be respectively formed or may be formed using conductive pastes of different compositions. For instance, the conductive paste for forming the second connection parts 5a may contain silver and zinc or a zinc alloy as the metal powder. For instance, when the second connection parts 5a are formed using a conductive paste containing zinc or a zinc alloy of greater than or equal to 7 parts by weight and less than or equal to 35 parts by weight with respect to silver of 100 parts by weight, organic vehicle of 10 to 30 parts by weight, and a glass frit of 0.1 to 5 parts by weight, the rise in series resistance between the second connection parts 5a and the power collecting part 5b lowers.

The solar cell element 10A according to the present embodiment can be manufactured through the above procedure.

A solder region (not shown) may be formed on the first connection parts 4c and the second connection parts 5a through a solder dipping process, as necessary.

<Method of Manufacturing the Solar Cell Module>

A method of manufacturing the solar cell module 20A using the solar cell element 10A formed as above will be described next.

First, the entire surface of a copper foil having a thickness of about 0.1 to 0.4 mm and a width of about 2 mm is covered with a solder material in advance, and then cut to a predetermined length in the longitudinal direction to fabricate the wirings 11.

As shown in FIG. 4A, the plurality of solar cell elements 10A is mounted with the second surfaces 1S facing upward, spaced at a predetermined distance w, and the wirings 11 are contacted between the first connection parts 4c of the first solar cell element 10Aα and the second connection parts 5a of the second solar cell element 10Aβ from the upper side. In this state, the solder at the surface of the wirings 11 is melted using hot air or a soldering iron, or a reflow furnace to connect the wirings 11 to the first connection parts 4c and the second connection parts 5a. According to such a method, the solar cell elements 10A can be connected at high productivity.

Subsequently, a module base obtained by sequentially stacking a front side filler 24, the plurality of solar cell elements 10A connected to one another by the wirings 11, a back side filler 15, and the back surface protective member 13 on the translucent member 12 is deaired, heated, and pressed in a laminator to integrate the layers, thereby obtaining the solar cell module 20A.

As shown in FIG. 3B, a frame 18 made of aluminum and the like is fitted to the outer periphery of the above-described solar cell module 20A. As shown in FIG. 3A, the ends of the electrodes of the first solar cell element 10A and the last solar cell element 10A of the plurality of solar cell elements 10A connected in series are connected to a terminal box 17, which is an output retrieving unit, by an output retrieving wiring 16.

The solar cell module 20A according to the present embodiment can be obtained according to such a procedure.

Second Embodiment

The arrangement mode of the solar cell module according to the present invention and the first electrode and the second electrode in the solar cell element configuring the same is not limited to that described in the first embodiment. A different arrangement mode of the first electrode and the second electrode will be hereinafter described sequentially in each embodiment. In all of the embodiments described below, effects similar to the solar cell element and the solar cell module according to the first embodiment can be obtained. However, in all the embodiments, the elements configuring the solar cell module and the solar cell element are the same as in the first embodiment, and the cross-sectional structure near the through holes is the same as in FIG. 1, and thus the same reference numerals as in the first embodiment are given for components having the same function, and the detailed description thereof will not be repeated.

First, a solar cell element 10B according to the second embodiment will be described with reference to FIGS. 5A and 5B.

Figure 5A:
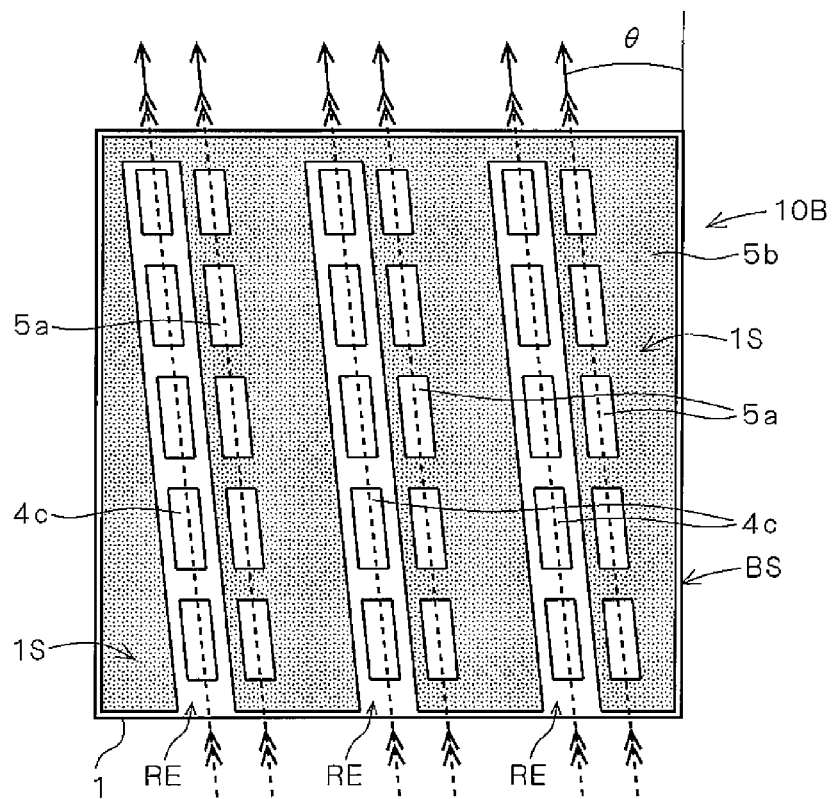
FIGS. 5A and 5B are plan views of a solar cell element 10B according to a second embodiment of the present invention.
Figure 5B:
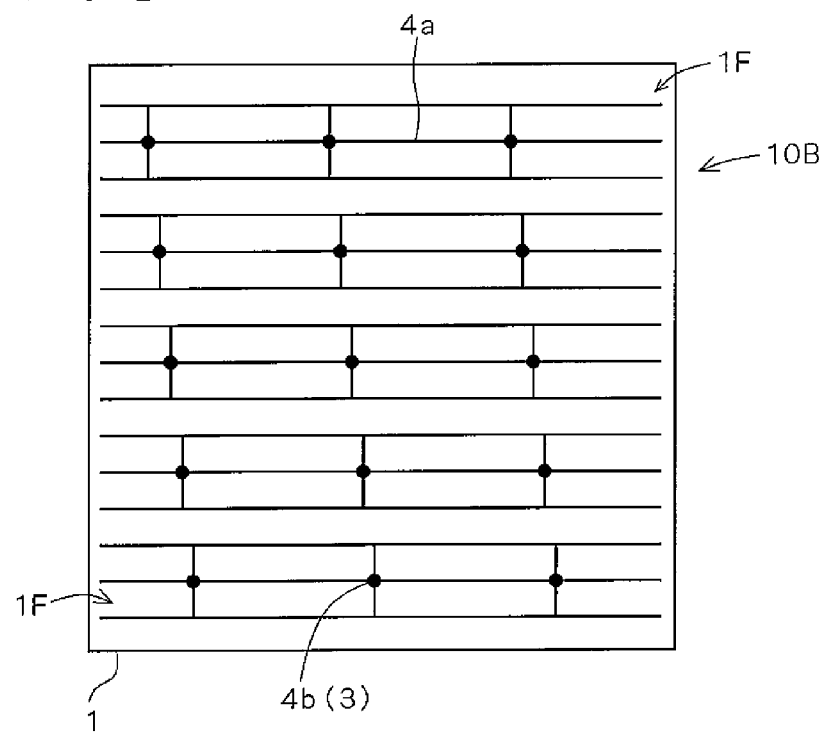

FIGS. 5A and 5B are plan views of the solar cell element 10B showing one example of electrode patterns of the first electrode 4 and the second electrode 5 in the solar cell element 10B. FIG. 5A is a diagram showing the solar cell element 10B when seen in plan view from the second surface 1S side, and FIG. 5B is a diagram showing the solar cell element 10B when seen in plan view from the first surface 1F side.

As shown in FIG. 5A, a plurality of columns (three columns in FIG. 5A) in which a plurality of (five in FIG. 5A) first connection parts 4c having a parallelogram shape is lined in a direction indicated with an arrow AR2 (direction inclined by the same angle θ as the inclination angle θ of the first connection parts 4c and the second connection parts 5a in the solar cell element 10A according to the first embodiment) is formed, and a plurality of columns (three columns in FIG. 5A) including a plurality of (five in FIG. 5A) second connection parts 5a having a parallelogram shape lined in a direction of the arrow AR2 to lie along the columns of the first connection parts 4c is formed on the second surface 1S side of the solar cell element 10B. In such a case, the relationship between the columns of the first connection parts 4c and the columns of the second connection parts 5a can be assumed as substantially the same as the relationship between the first connection parts 4c and the second connection parts 5a of the solar cell element 10A according to the first embodiment. In other words, the solar cell element 10B has a configuration in which the first connection parts 4c and the second connection parts 5a of an elongated shape in the solar cell element 10A are respectively replaced with an array of a plurality of (five in FIG. 5A) first connection parts 4c and second connection parts 5a having a smaller size than those in the first embodiment in the longitudinal direction. The formation mode of the power collecting part 5b is similar to that in the solar cell element 10A according to the first embodiment.

On the other hand, as shown in FIG. 5B, the through holes 3 (conduction parts 4b) are formed so as to substantially coincide with the formation positions of the first connection parts 4c in plan view, and the main electrode parts 4a are uniformly formed on the first surface 1F as a plurality of linear patterns connecting with the plurality of (three in FIG. 5B) conduction parts 4b belonging to different arrays.

When forming a solar cell module using the plurality of solar cell elements 10B, the adjacent solar cell elements 10B are arranged at a predetermined distance so that the respective base sides BS are positioned on the same straight line and so as to be in a translationally symmetric relationship, similar to the solar cell module 20A according to the first embodiment, besides in this case, they are arranged such that the column including the plurality of first connection parts 4c and the column including the plurality of second connection parts 5a are positioned on the same straight line parallel to the direction of the arrow AR2. In this manner, all the first connection parts 4c and all the second connection parts 5a positioned on the same straight line are connected with one wiring 11 as in the first embodiment. In other words, in the present embodiment as well, the relative arrangement relationship among the sets of the first connection parts 4c and the second connection parts 5a in a relation of being connected with one wiring 11 is equivalent (i.e., all the sets of first connection parts 4c and second connection parts 5a are in a translationally symmetric relationship), and thus the wiring 11 of the same shape can be used for the connection of each set of first connection part 4c and the second connection part 5a. For instance, the wiring having a shape similar to that used in the solar cell module 20A can be used. The relationship of the column including the plurality of first connection parts 4c and the column including the plurality of second connection parts 5a is substantially the same as the relationship between the first connection part 4c of the first solar cell element 10Aα and the second connection part 6a of the second solar cell element 10Aβ in the solar cell module 20A according to the first embodiment.

Regarding the solar cell element 10B, the first connection parts 4c and the second connection parts 5a may be formed into a shape different from above (e.g., trapezoid, circle, ellipse, semicircle, fan-shape, or composite shape thereof) as long as the above array state is met and the connection mode by the wirings 11 can be realized.

Third Embodiment

A solar cell element 10C and a solar cell element 10C', which is a variation thereof, according to a third embodiment of the present invention will be described with reference to FIGS. 6A to 6D and FIGS. 7A and 7B.

Figure 6A:
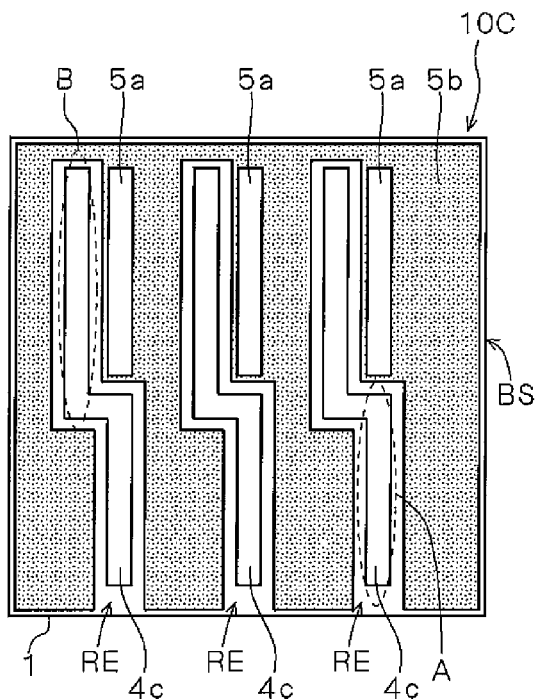
FIGS. 6A to 6D are plan views of a solar cell element 10C and a solar cell element 10C', which is a variation thereof, according to a third embodiment of the present invention.
Figure 6B:
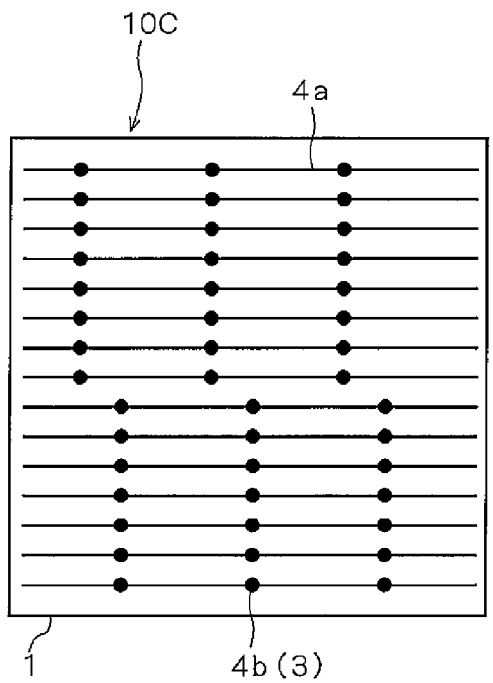
Figure 6C:
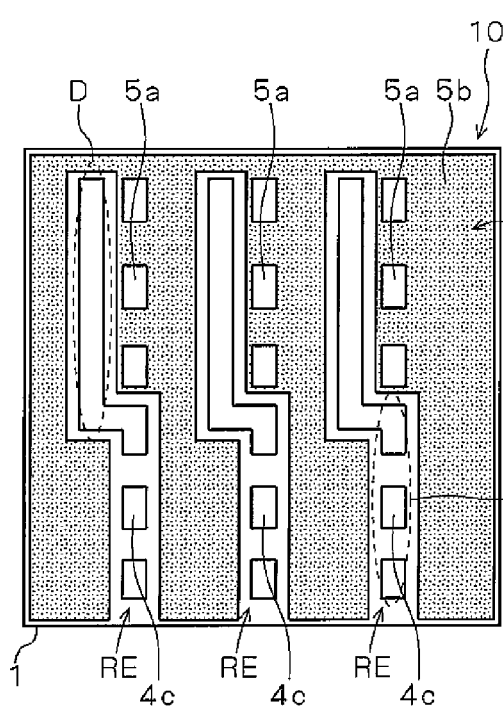
Figure 6D:
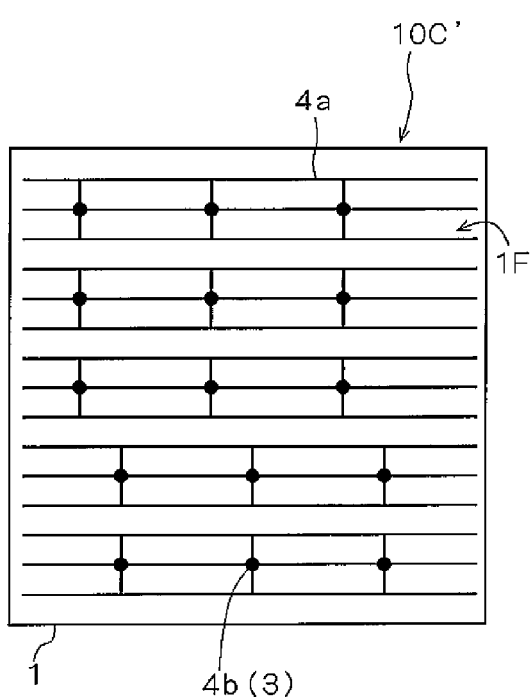

FIGS. 6A to 6D are plan views of the solar cell element 10C and the solar cell element 10C' showing one example of electrode patterns of the first electrode 4 and the second electrode 5 in the solar cell element 10C and the solar cell element 10C'. FIG. 6A is a diagram showing the solar cell element 10C when seen in plan view from the second surface 1S side, and FIG. 6B is a diagram showing the solar cell element 10C when seen in plan view from the first surface side. FIG. 6C is a diagram showing the solar cell element 10C' when seen in plan view from the second surface 1S side, and FIG. 6D is a diagram showing the solar cell element 10C' when seen in plan view from the first surface side.

As shown in FIG. 6A, a plurality of (three in FIG. 6A) of first connection parts 4c is arranged in the solar cell element 10C. Each first connection part 4c has a portion A and a portion B parallel to the base side BS but has a folding (bent) structure in plan view. A plurality of (three in FIG. 6A) second connection parts 5a is also arranged. The second connections part 5a are formed so as to be on the same straight lines as the portions A of the first connection parts 4c and so as to be parallel to the portions B of the second connection parts 5a. In the present embodiment as well, the power collecting part 5b is formed over substantially the entire surface other than the formation region of the first connection parts 4c and the non-formation region RE.

In the solar cell element 10C' shown in FIG. 6C, the portions A of the first connection parts 4c and the second connection parts 5a each monolithically formed in the solar cell element 10C are respectively replaced with the portions C of the first connection parts 4c having a discontinuous shape and the arrays of the second connection parts 5a dividing into a plurality of pieces (three in FIG. 6C). The shape of the portions D of the first connection parts 4c are the same as the shape of the portions B of the first connection parts 4c of the solar cell element 10C.

In the case where the first connection parts 4c are arranged such that the lengths in the longitudinal direction (coincide with the reference direction) of the portions A and the portions C of the first connection parts 4c shown in FIGS. 6A and 6C are approximately greater than or equal to 30% and less than or equal to 70% of the length of the base side BS, the contact area of the wirings 11 and the first connection parts 4c can be increased. The resistance loss can be further suppressed through such connection.

Meanwhile, as shown in FIGS. 6B and 6D, the through holes 3 (conduction parts 4b) are formed so as to substantially coincide with the formation positions of the first connection parts 4c in plan view, and the main electrode parts 4a are uniformly formed on the first surface 1F as a plurality of linear patterns connecting to the plurality of (three in FIGS. 6B and 6D) conduction parts 4b belonging to different arrays in both the solar cell element 10C and the solar cell element 10C'.

Figure 7A:
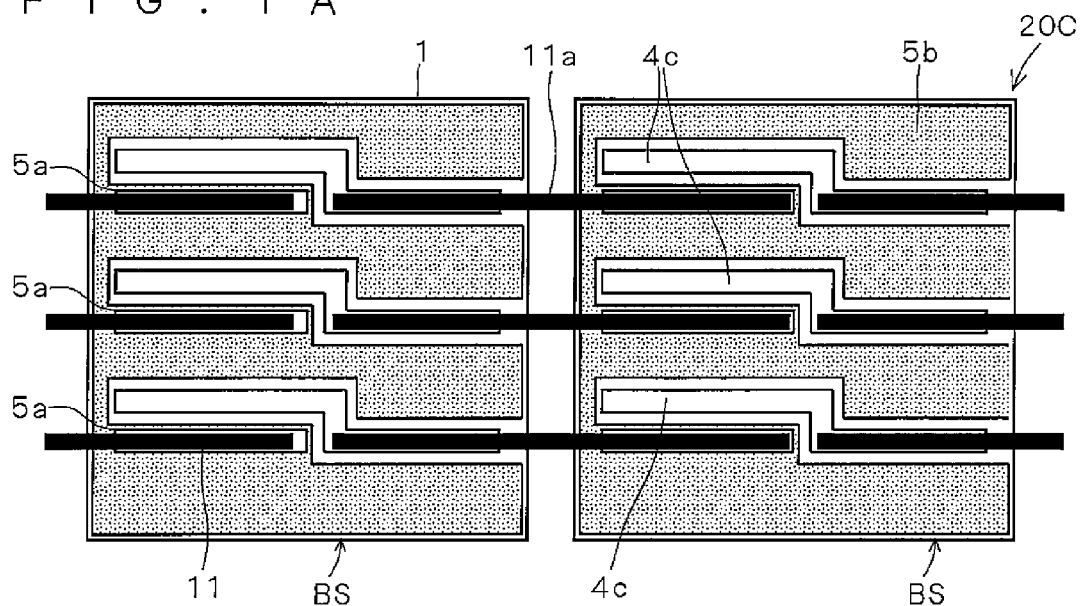
FIGS. 7A and 7B are diagrams showing in detail the state of connection of the solar cell elements 10C by the wirings 11 in a solar cell module 20C according to the third embodiment of the present invention.
Figure 7B:
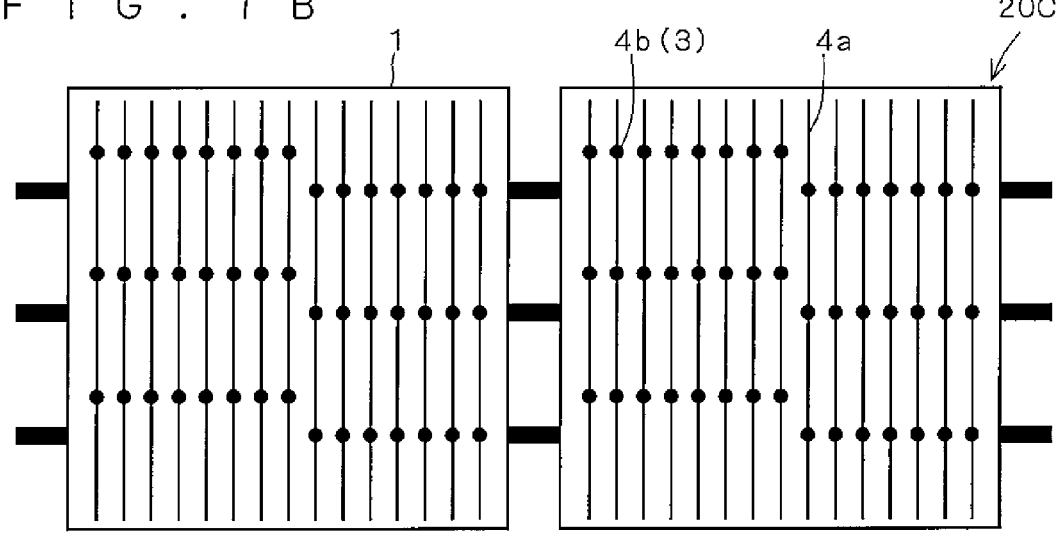
Figure 8A:
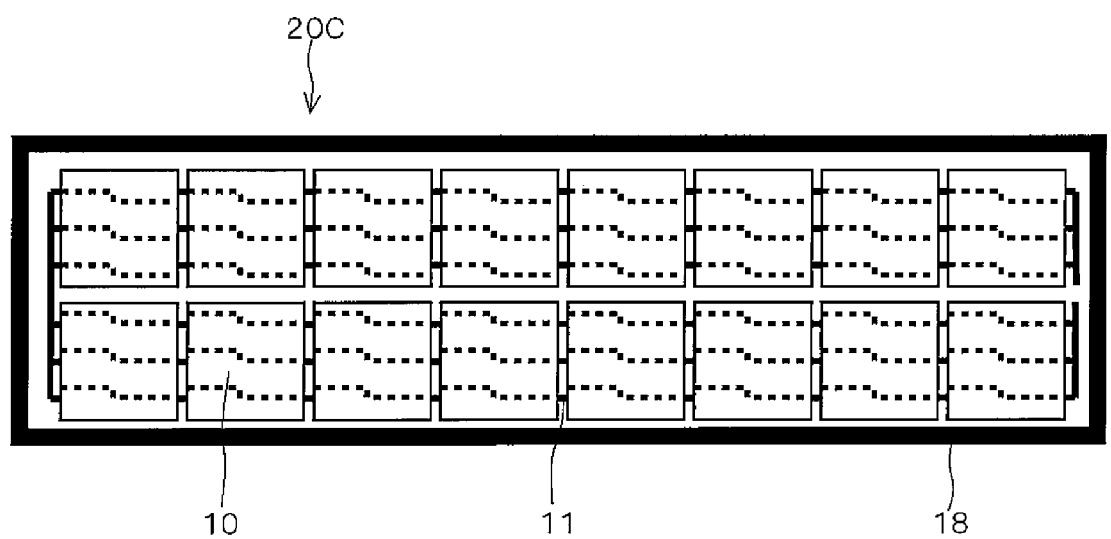
FIGS. 8A and 8B are schematic views of the entire solar cell module 20C according to the third embodiment and a solar cell module 20D according to a fourth embodiment according to the present invention when seen from the first surface 1F side in plan view.

FIGS. 7A and 7B are diagrams showing the detail of connection by the wirings 11 of the solar cell elements 10C in the solar cell module 20C configured using the plurality of solar cell elements 10C. FIG. 7A is a diagram of two solar cell elements 10C adjacent to each other in the solar cell module 20C when seen from the second surface 1S side in plan view, and FIG. 7B is a diagram of the same when seen from the first surface 1F side in plan view. FIG. 8A is a schematic view of the entire solar cell module 20C when seen from the first surface 1F side in plan view. In FIG. 7A, the solar cell elements 10C configuring the solar cell module 20C are not the same as those shown in FIGS. 6A to 6D, and are in a mirror symmetric relationship (line symmetric with respect to the center line of the solar cell element 10C), but the description of the present embodiment is established in using either solar cell element 10C in a symmetric relationship as long as the same solar cell elements 10C are used when configuring one solar cell module 20C.

In the case where the solar cell module 20C is configured using the solar cell element 10C in which the first connection parts 4c and the second connection parts 5a have the shape and the arrangement relationship described above, the portion A of the first connection part 4c of one solar cell element 10C and the second connection part 5a of the other solar cell element 10C exist on one straight line if the adjacent solar cell elements 10C are arranged so that the respective base sides BS are positioned on the same straight line and are in a translationally symmetric relationship, as shown in FIG. 7A. Regarding the solar cell module 20C, the portion A of the first connection part 4c and the second connection part 5a satisfying such a relationship are connected using the wiring 11 having a linear shape in plan view. In the present embodiment as well, the relative arrangement relationship among the sets of the first connection part 4c and the second connection part 5a in a relationship of being connected with one wiring 11 is equivalent (i.e., all the sets of the first connection part 4c and the second connection part 5a are in a translationally symmetric relationship), and thus the wiring 11 having the same shape can be used in the connection of each set of first connection part 4c and the second connection part 5a. The wiring having a shape similar to that used in the solar cell module 20A can be used, for example.

In the case of forming a solar cell module using a plurality of solar cell elements 10C', the adjacent solar cell elements 10C' are arranged at a predetermined distance so that the respective base sides BS are positioned on the same straight line and so as to be in a translationally symmetric relationship, as in the solar cell module 20C. Thus, the portion C of the first connection part 4c and all the second connection parts 5a positioned on the same straight line are connected with one wiring 11. In this case also, the relative arrangement relationship among the sets of the first connection part 4c and the second connection part 5a in a relation of being connected with one wiring 11 is equivalent (i.e., all the sets of first connection part 4c and second connection part 5a are in a translationally symmetric relationship), and thus the wiring 11 of the same shape can be used for the connection of each set of portion C of the first connection part 4c and the second connection part 5a. For instance, the wiring having a shape similar to that used in the solar cell module 20A can be used.

Regarding the solar cell element 10C', the portion C and the second connection part 5a may be formed into a shape different from above (e.g., trapezoid, circle, ellipse, semicircle, fan-shape, or composite shape thereof as long as the above array state is met and the connection mode by the wiring 11 can be realized.

Figure 9A:
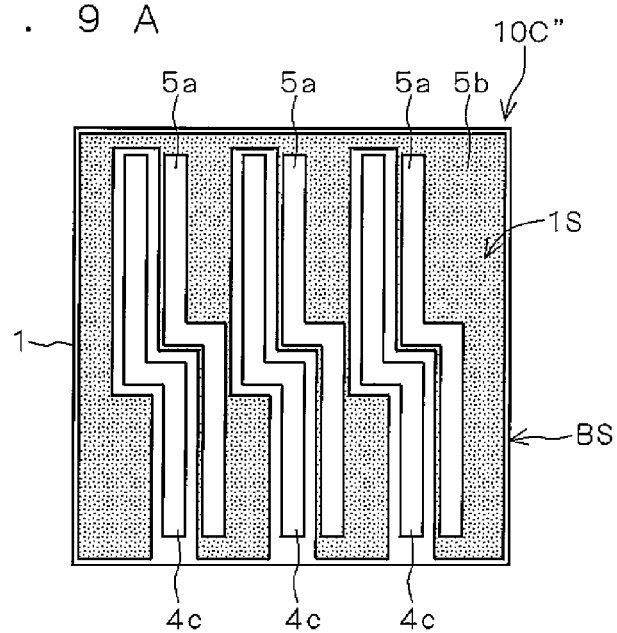
FIGS. 9A and 9B are diagrams showing a solar cell element 10C'', which is a variation of the solar cell element 10C, and a solar cell module 20C'' configured using the plurality of solar cell elements 10C''.
Figure 9B:
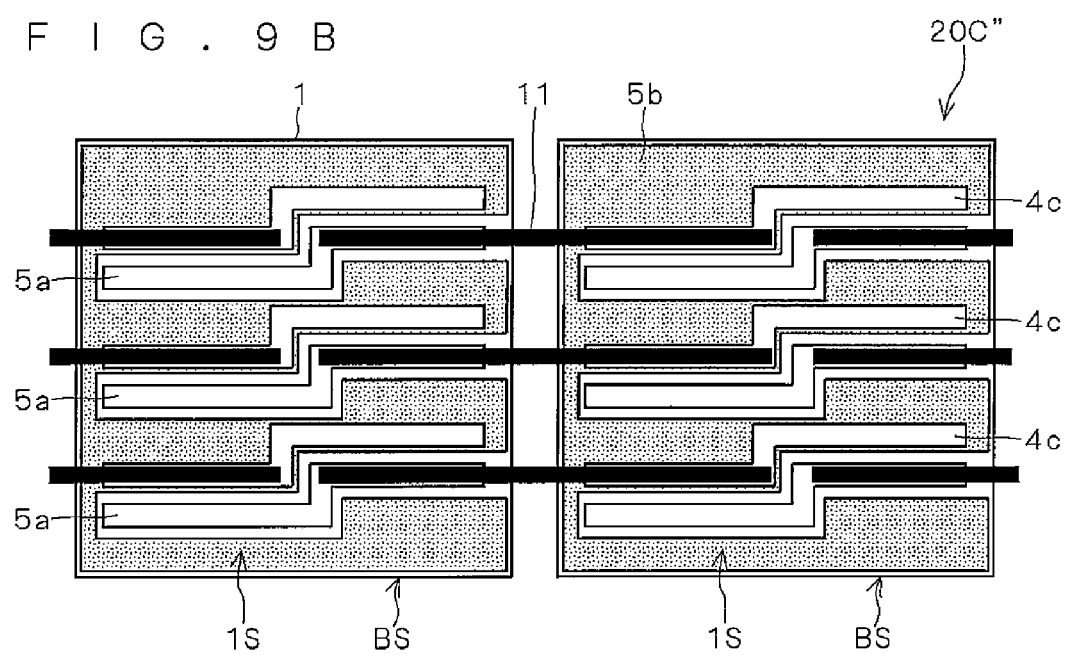

FIGS. 9A and 9B are diagrams showing a solar cell element 10C'', which is another variation of the solar cell element 10C, and a solar cell module 20C'' configured using a plurality of solar cell elements 10C'' according to the present embodiment. FIG. 9A is a diagram of the solar cell element 10C'' when seen from the second surface 1S side in plan view, and FIG. 9B is a diagram of two adjacent solar cell elements 10C'' in the solar cell module 20C'' when seen from the second surface 1S side in plan view.

The solar cell element 10C'' is similar to the solar cell element 10C in that the first connection part 4c has a bent shape, but differs from the solar cell element 10C in that the second connection part 5a also has a bent shape. However, in the solar cell module 20C'' configured using the solar cell element 10C'' as well, a state in which the first connection part 4c of one solar cell element 10C'' and the second connection part 5a of the other solar cell element 10C exist on one straight line is realized by arranging the adjacent solar cell elements 10C'' so that the respective base sided BS are positioned on the same straight line and are in a translationally symmetric relationship, as shown in FIG. 9B. The solar cell module 20C'' is also similar to the solar cell module 20C in that the first connection part 4c and the second connection part 5a lined on one straight line are connected using a wiring 11 in a linear form in plan view.

Fourth Embodiment

A solar cell element 10D and a solar cell element 10D', which is a variation thereof, according to a fourth embodiment, will be described with reference to FIGS. 10A to 10D and FIGS. 11A and 11B.

Figure 10A:
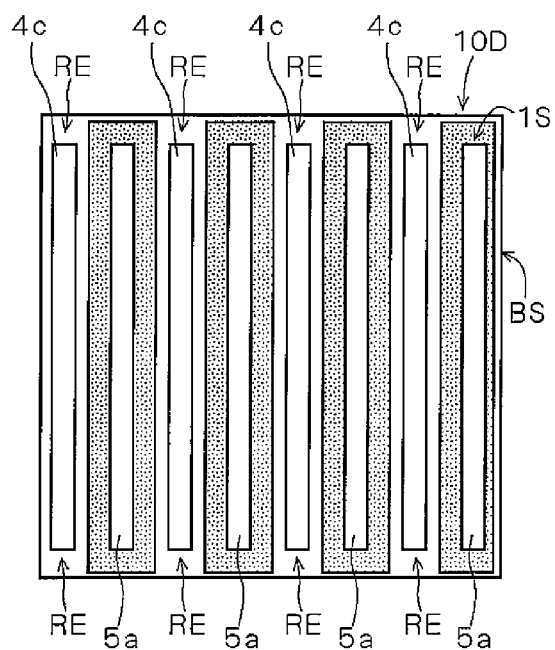
FIGS. 10A to 10D are plan views of a solar cell element 10D and a solar cell element 10D' according to the fourth embodiment of the present invention.
Figure 10B:
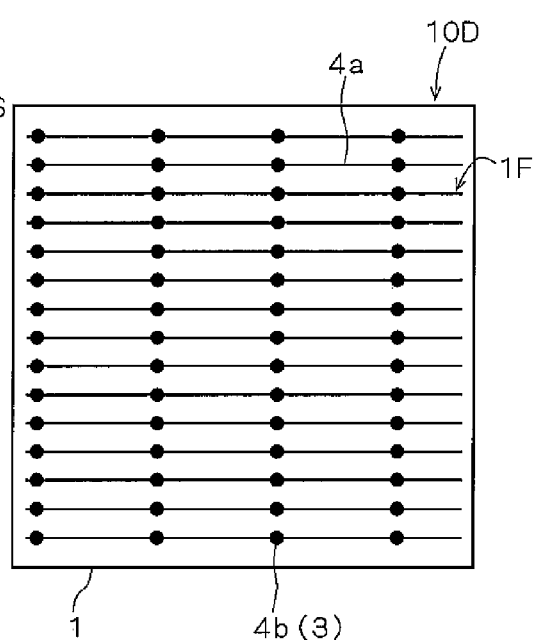
Figure 10C:
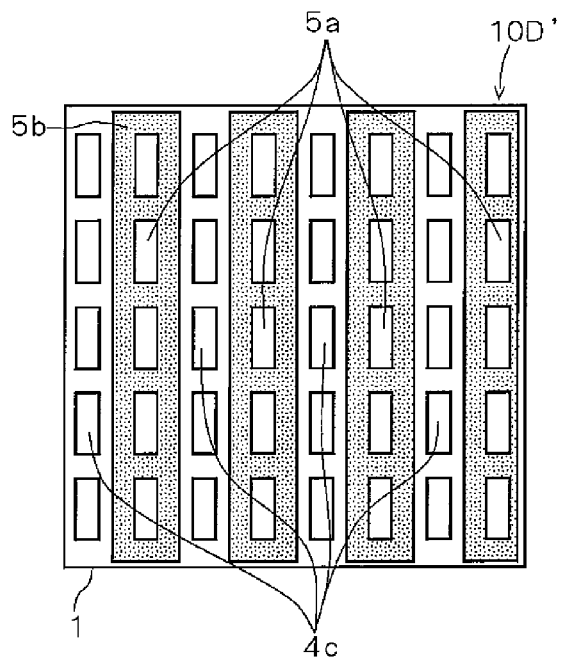
Figure 10D:
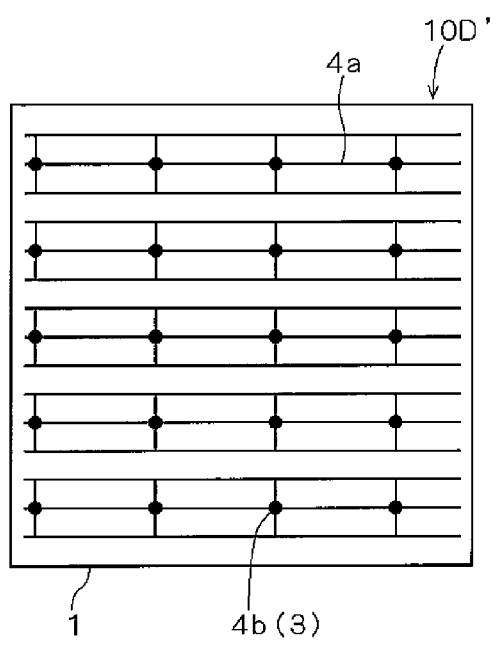

FIGS. 10A to 10D are plan views of the solar cell element 10D and the solar cell element 10D' showing one example of electrode patterns of the first electrode 4 and the second electrode 5 in the solar cell element 10D and the solar cell element 10D'. FIG. 10A is a diagram showing the solar cell element 10D when seen from the second surface 1S side in plan view, and FIG. 10B is a diagram showing the solar cell element 10D when seen from the first surface side 1F in plan view. FIG. 10C is a diagram showing the solar element 10D' when seen from the second surface 1S side in plan view, and FIG. 10D is a diagram showing the solar cell element 10D' when seen from the first surface 1F side in plan view.

As shown in FIG. 10A, a plurality of (four in FIG. 10A) first connection parts 4c is arranged in the solar cell element 10D. Each first connection part 4c has an elongated shape (rectangle) parallel to the base side BS and is arranged at substantially regular intervals parallel to the reference direction. On the other hand, the second connection parts 5a of the same number as the first connection parts 4c are also arranged. Each second connection part 5a also has an elongated shape (rectangle) parallel to the base side BS and is arranged at substantially regular intervals parallel to the reference direction. The first connection parts 4c and the second connection parts 5a are alternately arranged. Furthermore, the first connection parts 4c and the second connection parts 5a in the solar cell element 10D have the respective arrangement positions defined so that a rotationally symmetrical arrangement is realized between adjacent solar cell elements 10D when configuring a solar cell module 20D, as will be described later.

In the present embodiment, an elongated power collecting part 5b is formed at the peripheries of the second connection parts 5a. Thus, the non-formation region RE is ensured near both the ends of the first connection parts 4c. This aspect will be described later.

In the solar cell element 10D' shown in FIG. 10C, both the plurality of first connection parts 4c and the plurality of second connection parts 5a, each of them having a rectangular shape, are arranged at substantially regular intervals and discretely at positions where the first connection parts 4c and the second connection parts 5a are formed in the solar cell element 10D. That is, the solar cell element 10D' has a configuration in which the first connection parts 4c and the second connection parts 5a having an elongated shape in the solar cell element 10D are replaced with arrays of the plurality of (five in FIG. 10C) first connection parts 4c and second connection parts 5a having smaller sizes than those in the solar cell element 10D in the longitudinal direction. The formation mode of the power collecting part 5b is similar to that in the solar cell element 10D.

On the other hand, as shown in FIGS. 10B and 10D, in both the solar cell element 10D and the solar cell element 10D', the through holes 3 (conduction parts 4b) are formed so as to substantially coincide with the formation positions of the first connection parts 4c in plan view, and the main electrode parts 4a are uniformly formed on the first surface 1F as a plurality of linear patterns connecting with the plurality of (four in FIGS. 10B and 10D) conduction parts 4b belonging to different arrays.

Figure 8B:
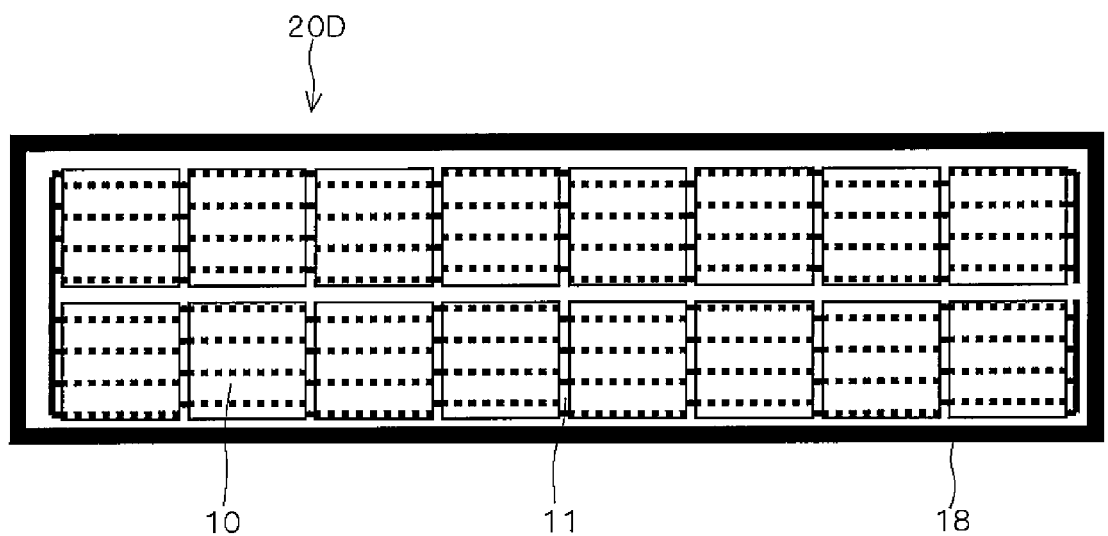
Figure 11A:
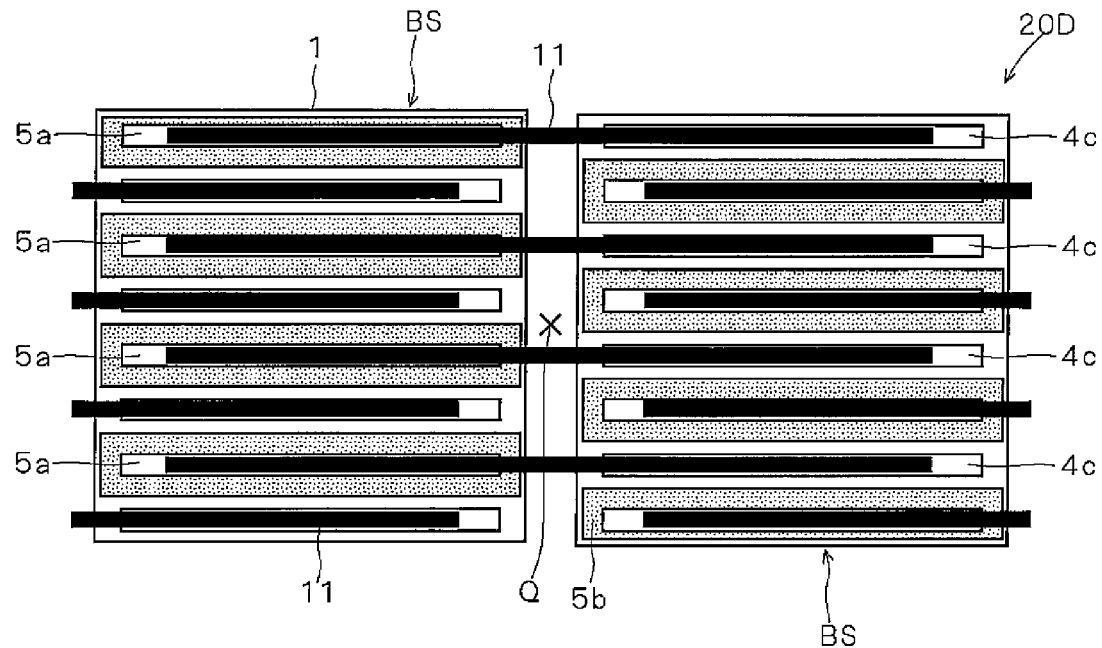
FIGS. 11A and 11B are diagrams showing in detail the state of connection of the solar cell elements 10D by the wirings 11 in the solar cell module 20D according to the fourth embodiment.
Figure 11B:
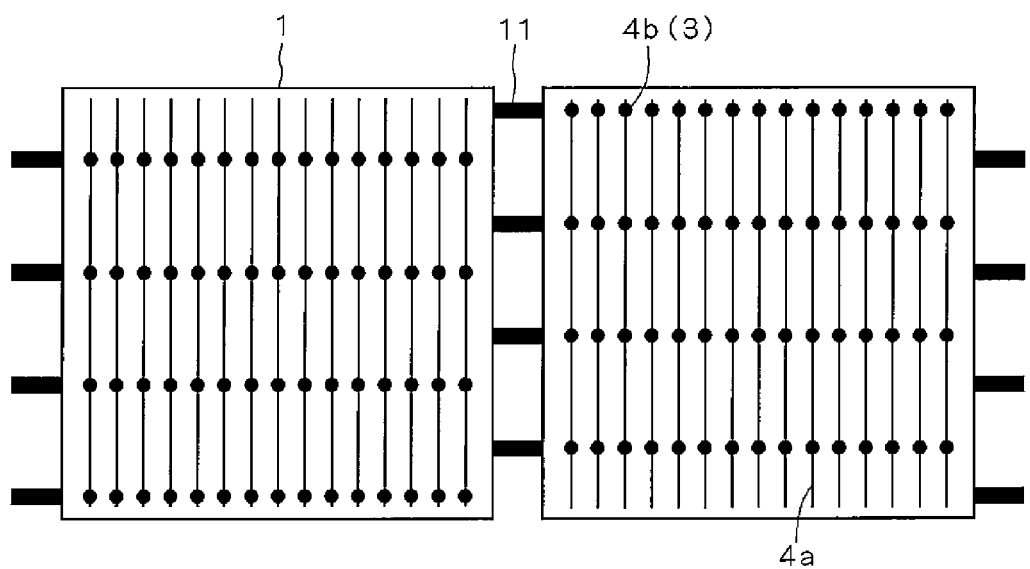

FIGS. 11A and 11B are diagrams showing the detail of connection of the solar cell elements 10D by the wirings 11 in the solar cell module 20D configured using the plurality of solar cell elements 10D. FIG. 11A is a diagram of two solar cell elements 10D adjacent to each other in the solar cell module 20D seen in plan view from the side of the second surface 1S. FIG. 11B is a diagram of the same in plan view seen from the side of the first surface 1F. FIG. 8B is a schematic view of the entire solar cell module 20D when seen from the first surface 1F side in plan view.

In the case of configuring the solar cell module 20D using the solar cell element 10D in which the first connection parts 4c and the second connection parts 5a have the shape and the arrangement relationship as described above, the first connection part 4c of one solar cell element 10D and the second connection part 5a of the other solar cell element 10D exist on one straight line if the adjacent solar cell elements 10D are arranged so that the respective base sides BS are parallel and are at positions not on the same straight line, and are in a rotationally symmetric (more specifically, point symmetric) relationship. In the case shown in FIGS. 11A and 11B, point Q is the center of rotational symmetry. In the solar cell module 20D, the first connection parts 4c and the second connection parts 5a satisfying such a relationship are connected using the wirings 11 in a linear form in plan view. In the present embodiment also, the mutual relative arrangement relationship among the sets of the first connection part 4c and the second connection part 5a in a relationship of being connected with one wiring 11 is equivalent (i.e., the sets of the first connection part 4c and the second connection part 5a are all in a translationally symmetric relationship), and thus the wiring 11 having the same shape can be used for the connection of each set of the first connection part 4c and the second connection part 5a. The wiring 11 having a shape similar to that used in the solar cell module 20A can be used, for example.

The non-formation region RE is ensured near both the ends of the first connection parts 4c in the solar cell element 10D as described above in order to adapt to circumstances where there are two directions each solar cell element 10D may take in the solar cell module 20D and the connecting position by the wiring 11 differs according to the directions, namely, in order to use the solar cell elements 10D having the same electrode patterns regardless of the directions.

On the other hand, in the case of forming a solar cell module using a plurality of solar cell elements 10D', the adjacent solar cells 10D' are arranged so that the respective base sides BS are parallel and are not at positions on the same straight line and so that they are in a rotationally symmetric (specifically, point symmetric) relationship with each other, as in the solar cell module 20D. Accordingly, all the first connection parts 4c and all the second connection parts 5a positioned on the same straight line are connected by one wiring 11. In this case, the relative arrangement relationship among the sets of the plurality of first connection parts 4c and the plurality of second connection parts 5a in a relationship of being connected with one wiring 11 is equivalent (i.e., the sets of the plurality of first connection parts 4c and the plurality of second connection parts 5a are all in a translationally symmetric relationship), and thus the wiring 11 having the same shape can be used for the connection of each set of the first connection part 4c and the second connection part 5a.

Regarding the solar cell element 10D', the first connection parts 4c and the second connection parts 5a may be formed into a shape different from above (e.g., trapezoid, circle, ellipse, semicircle, fan-shape, or composite shape thereof) as long as the above array state is met and the connection mode by the wiring 11 can be realized.

The power collecting amount of the first connection parts 4c and the second connection parts 5a is smaller at the ends of the semiconductor substrate 1 than at the central part, and thus the formation widths in the short direction of the first connection parts 4c and the second connection parts 5a at the ends may be shorter than at the central part.

Fifth Embodiment

The solar cell element 10E according to a fifth embodiment of the present invention will be described with reference to FIGS. 12A and 12B and FIGS. 13A and 13B.

Figure 12A:
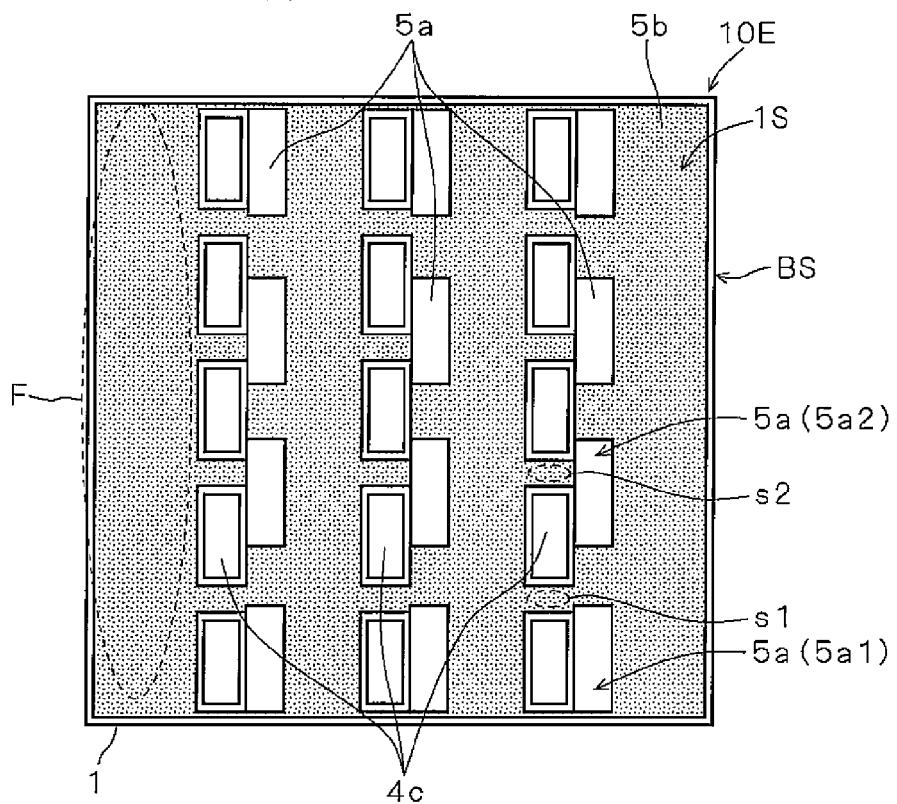
FIGS. 12A and 12B are plan views of a solar cell element 10E according to a fifth embodiment of the present invention.
Figure 12B:
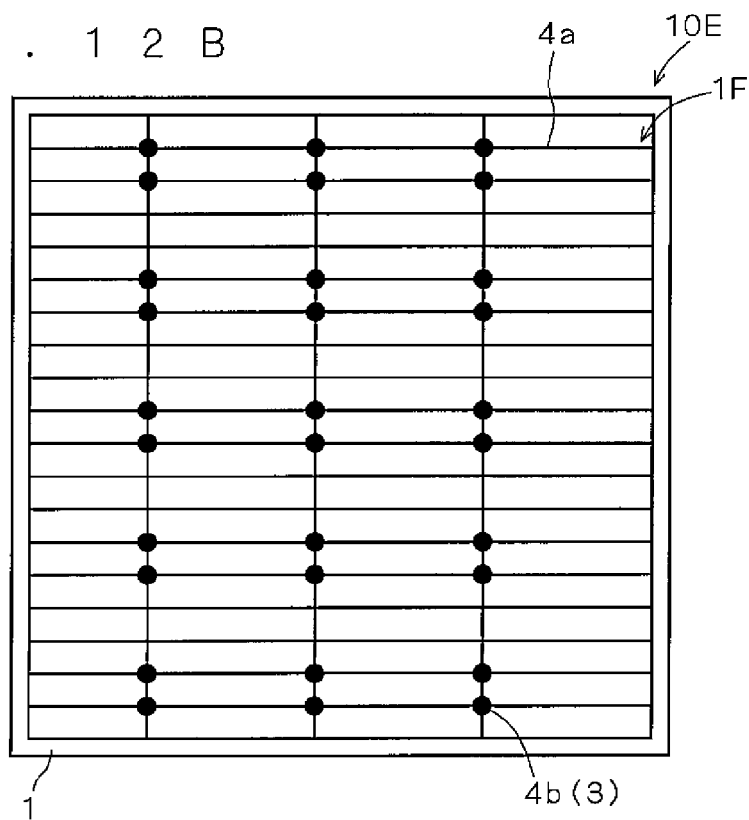

FIGS. 12A and 12B are plan views of the solar cell element 10E showing one example of electrode patterns of the first electrode 4 and the second electrode 5 in the solar cell element 10E. FIG. 12A is a diagram of the solar cell element 10E when seen from the second surface 1S side, and FIG. 12B is a diagram of the solar cell element 10E when seen from the first surface side in plan view.

As shown in FIG. 12A, in the solar cell element 10E, each first connection part 4c having a rectangular shape and having a longitudinal direction in the reference direction are divided into plural pieces into a plurality of columns (three columns in FIG. 12A) and is arranged with a gap at substantially the regular intervals (five in FIG. 12A). The columns are arranged at substantially equal intervals parallel to the reference direction. On the other hands, each plurality of (four in FIG. 12A) second connection parts 5a having a rectangular shape and having a longitudinal direction in the reference direction is arranged, with a gap at substantially the regular intervals, in a plurality of columns (i.e., the number of columns is the same as that of the columns of the first connection parts 4c) along the columns of the first connection parts 4c.

More specifically, the first connection parts 4c and the second connection parts 5a are arranged to satisfy the relationship that there exists at least partially adjacent second connection part 5a for all the clearances between the first connection parts 4c. For example, the second connection part 5a1 is adjacent to a part of the clearance s1, and the second connection part 5a2 is adjacent to the entire clearance s2. When the first connection parts 4c and the second connection parts 5a are arranged in such an arrangement relationship, the number of second connection parts 5a becomes less than the number of first connection parts 4c (thus the size in the longitudinal direction becomes large), but the second connection parts 5a may be arranged in the same as or in a greater number than the first connection parts 4c. One elongated second connection part 5a can be arranged instead of being arranged in plurals. Furthermore, in the case of forming the high concentration doped layer 6 through the formation of the power collecting part 5b, a larger power collecting part 5b (high concentration doped layer 6) can be formed in the clearances between the second connection parts 5a by arranging a great number of second connection parts 5a, whereby the output characteristic of the solar cell element 10E can be enhanced.

Furthermore, in the solar cell element 10E, the arrangement positions of the first connection parts 4c and the second connection parts 5a are defined so that a rotationally symmetric arrangement is realized between the adjacent solar cell elements 10E in the case of configuring a solar cell module 20E, as will be described later.

In the solar cell element 10E as wells the power collecting part 5b is formed over substantially the entire surface other than the formation region of the first connection parts 4c, as in the other embodiments. However, in the case of the solar cell element 10E, enlargement of the formation region of the power collecting part 5b and enlargement in the formation region of the high concentration doped layer 6 are achieved by two aspects in that both the first connection parts 4c and the second connection parts 5a are arranged up to the vicinity of the ends of the semiconductor substrate 1 in the arraying direction and the non-formation region RE is not ensured, and in that the power collecting part 5b is formed even at the clearance portions between the first connection parts 4c arranged in the same columns parallel to the base side BS.

In the solar cell element 10E having such an arrangement relationship, the carriers collected by the power collecting part 5b in the region on the side opposite to the columns of the second connection parts 5a with respect to the columns of the first connection parts 4c parallel to the base side BS can be satisfactorily retrieved from the second connection parts 5a. Particularly in the case shown in FIG. 12A, the power collection from the region F not formed with the second connection parts 5a is effectively carried out. That is, satisfactory power collecting efficiency can be obtained without arranging the second connection parts 5a in the region F.

On the other hand, as shown in FIG. 12B, the through holes 3 (conduction parts 4b) are formed so as to substantially coincide with the formation positions of the first connection parts 4c in plan view in the solar cell element 10E. In the solar cell element 10E, two through holes 3 (conduction parts 4b) are formed in correspondence to one first connection part 4c. Furthermore, the main electrode parts 4a are uniformly formed on the first surface 1F as a plurality of linear patterns connecting to all the conduction parts 4b. The main electrode parts 4a arranged perpendicular to the connecting direction of the wirings 11 may be arranged only at the portions where the clearances between the conduction parts 4b are large.

Figure 13A:
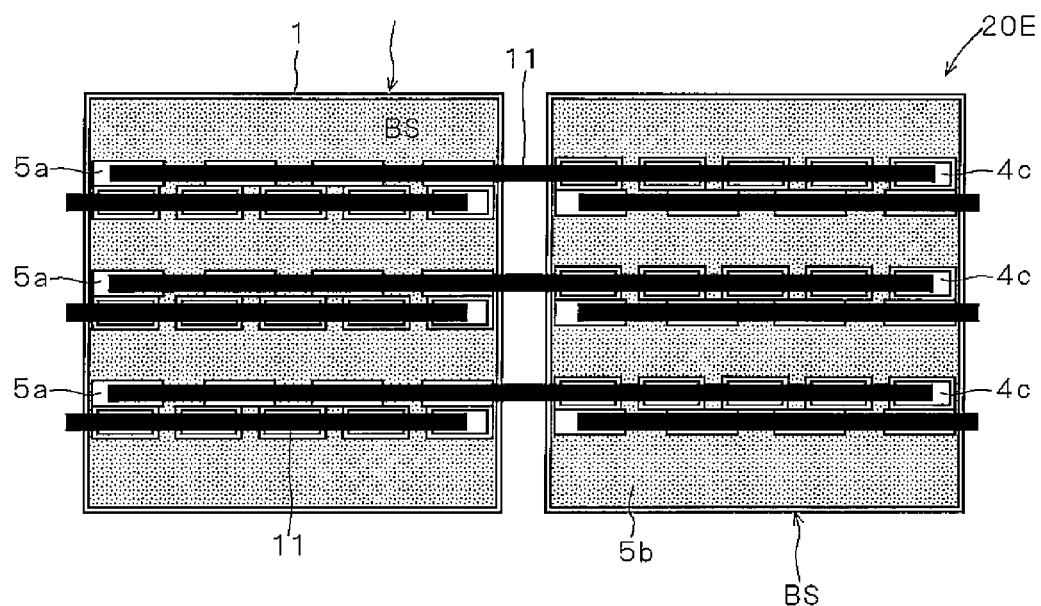
FIGS. 13A and 13B are diagrams showing in detail the state of connection of the solar cell elements 10E by the wirings 11 in a solar cell module 20E according to the fifth embodiment.
Figure 13B:
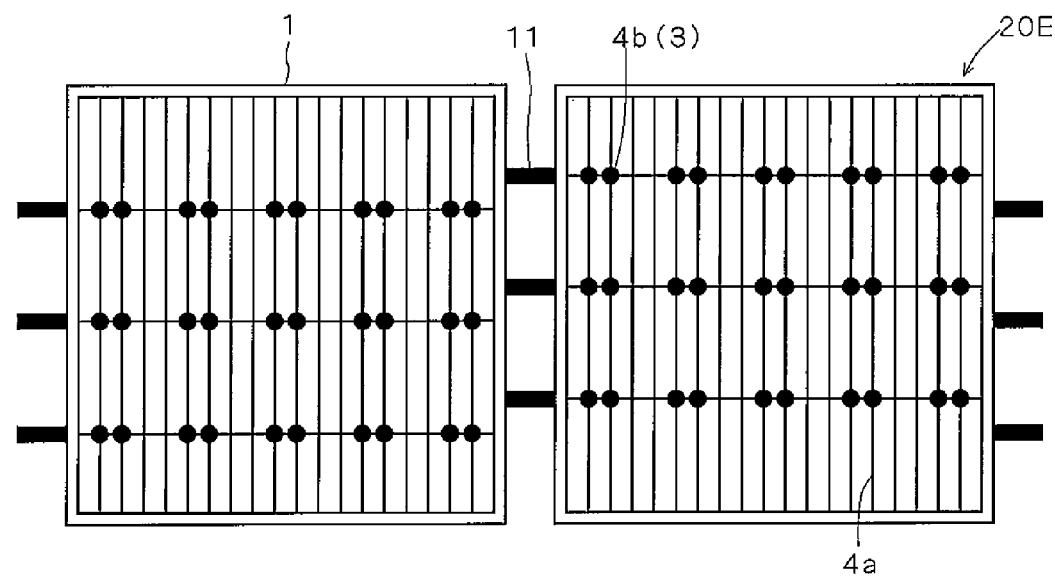

FIGS. 13A and 13B are diagrams showing the detail of connection by the wirings 11 of the solar cell elements 10E in the solar cell module 20E configured using a plurality of solar cell elements 10E. FIG. 13A is a diagram of two solar cell elements 10E adjacent to each other in the solar cell module 20E when seen from the second surface 1S side in plan view, and FIG. 13B is a diagram of the same when seen from the first surface 1F side in plan view.

In the case of configuring the solar cell module 20E using the solar cell element 10E described above, the adjacent solar cell elements 10E are arranged so that the respective base sides BS are parallel and are not positioned on the same straight line, and are in a rotationally symmetric (specifically, point symmetric) relationship with each other, as shown in FIG. 13A, as in the solar cell module 20D. According to such an arrangement, the first connection parts 4c of one solar cell element 10E and the second connection parts 5a of the other solar cell element 10E exist on one straight line. In the solar cell module 20E, such first connection parts 4c and second connection parts 5a are connected using the wirings 11 having a linear form in plan view. In the present embodiment as well, the relative arrangement relationship among the sets of the first connection parts 4c and the second connection parts 5a in a relationship of being connected with one wiring 11 is equivalent (i.e., all the sets of the first connection parts 4c and the second connection parts 5a are in a translationally symmetric relationship). Therefore, the connection of each set of the first connection part 4c and the second connection part 5a is performed by the wiring 11 having the same shape. For instance, the wiring having a shape similar to that used in the solar cell module 20A may be used.

If the wiring 11 connected to the first connection parts 4c of the solar cell element 10E contacts the power collecting part 5b of the same solar cell element 10E, the first connection parts 4c and the power collecting part 5b short-circuit and leakage occurs. Thus, an insulating layer is preferably formed on the power collecting part 5b at the locations that it might contact the wirings 11. Alternatively, connection may be made using a wiring similar to a wiring 11B having a plurality of bent parts in cross-sectional view as will be described later.

Regarding the solar cell element 10E, the first connection parts 4c and the second connection parts 5a may be formed into a shape different from above (e.g., trapezoid, circle, ellipse, semicircle, fan-shape, or composite shape thereof) as long as the above array state is met and the connection mode by the wiring 11 can be realized.

Sixth Embodiment

A solar cell element 10F according to a sixth embodiment of the present invention will be described with reference to FIGS. 14A and 14B and FIGS. 15A and 15B.

Figure 14A:
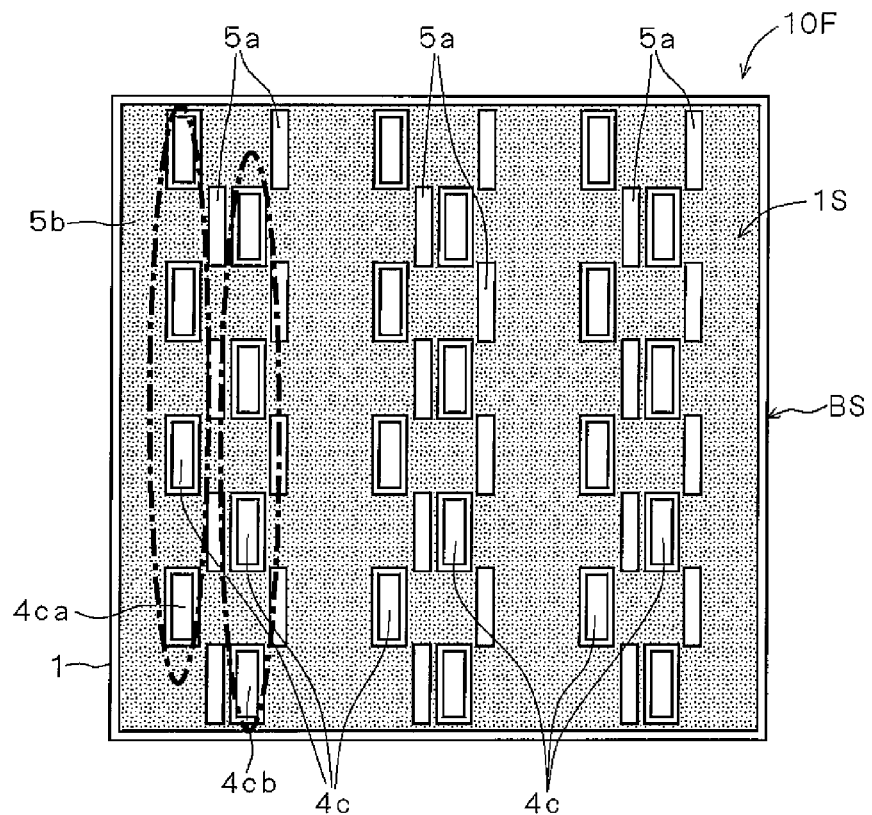
FIGS. 14A and 14B are plan views of a solar cell element 10F according to a sixth embodiment of the present invention.
Figure 14B:
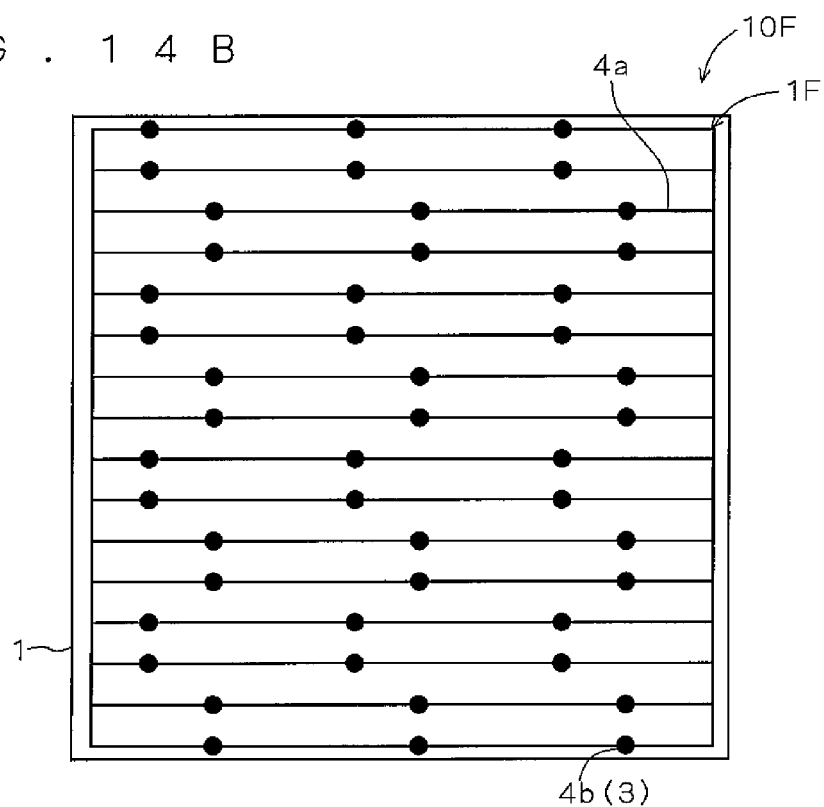

FIGS. 14A and 14B are plan views of the solar cell element 10F showing one example of electrode patterns of the first electrode 4 and the second electrode 5 in the solar cell element 10F. FIG. 14A is a diagram of the solar cell element 10F when seen from the second surface 1S side in plan view, and FIG. 14B is a diagram of the solar cell element 10F when seen from the first surface 1F side in plan view.

As shown in FIG. 14A, in the solar cell element 10F, each plurality of (four in FIG. 14A) first connection parts 4c having a rectangular shape and having a longitudinal direction in the reference direction is divided into a plurality of columns (six columns in FIG. 14A) and is arranged with a gap at substantially the regular intervals. Each column is arranged at substantially the regular intervals parallel to the reference direction. On the other hand, each plurality of (four in FIG. 14A) second connection parts 5a having a rectangular shape and having a longitudinal direction in the reference direction, similar to the first connection parts 4c, is arranged with a gap at substantially the regular intervals in a plurality of columns along the columns of the first connection parts 4c (i.e., the number of columns is the same as that of the columns of the first connection parts 4c).

More specifically, the columns of the first connection parts 4c and the columns of the second connection parts 5a configure a plurality of sets (three sets in FIG. 14A) arranged alternately and adjacent to one another by a plurality of columns (two columns in FIG. 14A). From the arrangement relationship with the columns of the second connection parts 5a, the columns of the first connection parts 4c are distinguished between a first column 4ca in which the column of the second connection parts 5a exists only on one side and a second column 4cb in which the column of the second connection parts 5a exists on both sides (sandwiched between the columns of the second connection parts 5a). Further, the adjacent columns of the first connection parts 4c belonging to the same set (e.g., the first column 4ca and the second column 4cb in FIG. 14A) are arranged such that the arrangement relationship between the first connection parts 4c and the clearances in the reference direction is reversed from each other between the adjacent columns.

Similarly, the adjacent columns of the second connection parts 5a belonging to the same set (e.g., the two columns on both sides of the second column 4cb in FIG. 14A) are arranged such that the arrangement relationship between the second connection parts 5a and the clearances in the reference direction is reversed from each other between the adjacent columns, and the second connection parts 5a are adjacent to the first connection parts 4c configuring the second column 4cb.

Furthermore, in the solar cell element 10F, the arrangement positions of the first connection parts 4c and the second connection parts 5a are defined so that a rotationally symmetric arrangement is realized between the adjacent solar cell elements 10F in the case of configuring a solar cell module 20F, as will be described later.

In the solar cell element 10F as well, the power collecting part 5b is formed over substantially the entire surface other than the formation region of the first connection parts 4c, as in the other embodiments. However, in the case of the solar cell element 10F, the non-formation region RE is not prepared, and the power collecting part 5b is formed even in the clearance portions of the first connection parts 4c arranged in the same column. That is, enlargement of the formation region of the power collecting part 5b and enlargement in the formation region of the high concentration doped layer 6 are achieved.

On the other hand, as shown in FIG. 14B, the through holes 3 (conduction parts 4b) are formed so as to substantially coincide with the formation positions of the first connection parts 4c in plan view in the solar cell element 10F. In the solar cell element 10F, two through holes 3 (conduction parts 4b) are formed in correspondence to one first connection part 4c. Furthermore, the main electrode parts 4a are uniformly formed on the first surface 1F as a plurality of linear patterns connecting to the plurality of (three in FIG. 14B) conduction parts 4b belonging to different arrays.

Figure 15A:
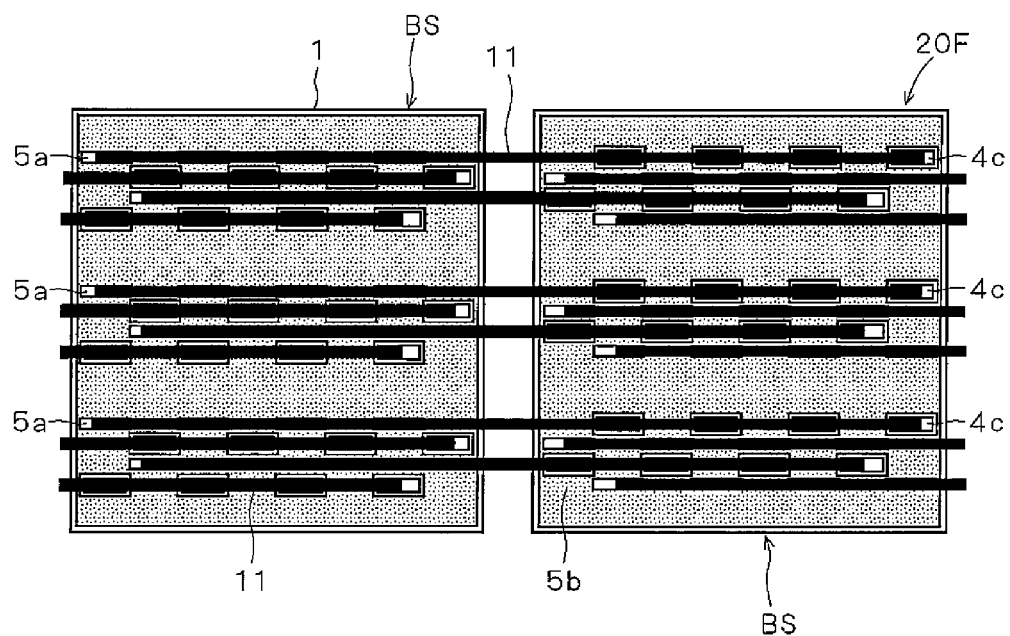
FIGS. 15A and 15B are diagrams showing in detail the state of connection of the solar cell elements 10F by the wirings 11 in a solar cell module 20F according to the sixth embodiment.
Figure 15B:
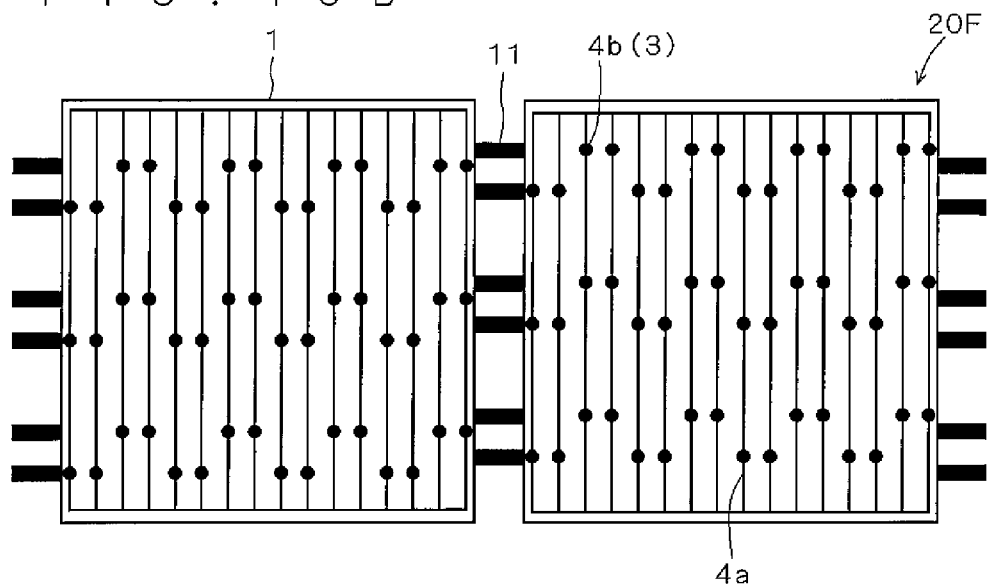

FIGS. 15A and 15B are diagrams showing the detail of connection by the wirings 11 of the solar cell elements 10F in the solar cell module 20F configured using a plurality of solar cell elements 10F. FIG. 15S is a diagram of two solar cell elements 10F adjacent to each other in the solar cell module 20F when seen from the second surface 1S side in plan view, and FIG. 15B is a diagram of the same when seen from the first surface 1F side in plan view.

In the case of configuring the solar cell module 20F using the solar cell element 10F as described above, the adjacent solar cell elements 10P are arranged so that the respective base sides BS are parallel and are at positions not on the same straight line, and are in a rotationally symmetric (specifically, point symmetric) relationship with each other, as shown in FIG. 15A, as in the solar cell module 20D. According to such an arrangement, the first connection parts 4c of one solar cell element 10F and the second connection parts 5a of the other solar cell element 10F exist on one straight line. In the solar cell module 20F, such first connection parts 4c and second connection parts 5a are connected using the wiring 11 having a linear form in plan view. In the present embodiment as well, the relative arrangement relationship among the sets of the first connection parts 4c and the second connection parts 5a in a relationship of being connected with one wiring 11 is equivalent (i.e., all the sets of the first connection parts 4c and the second connection parts 5a are in a translationally symmetric relationship), and thus the connection of each set of the first connection part 4c and the second connection part 5a is performed by the wiring 11 having the same shape. For instance, a wiring having a shape similar to that used in the solar cell module 20A may be used.

Since the number of wirings 11 in the solar cell module 20F shown in FIGS. 15S and 15B is greater than those of the solar cell modules shown in the embodiments above, resistance loss that occurs when current flows concentrating on one wiring 11 is less likely to occur.

If the wirings 11 connected to the first connection parts 4c of the solar cell element 10F contacts the power collecting part 5b of the same solar cell element 10, the first connection parts 4c and the power collecting part 5b short-circuit and leakage occurs, and thus, an insulating layer (not shown) is preferably formed on the power collecting part 5b at the locations that it might contact the wirings 11. Alternatively, the connection may be made using a wiring similar to the wiring 11B having a broken line shape in cross-sectional view as will be described later.

Also, regarding the solar cell element 10F, the first connection parts 4c and the second connection parts 5a may be formed into a shape different from above (e.g., trapezoid, circle, ellipse, semicircle, fan-shape, or composite shape thereof as long as the above array state is met and the connection mode by the wiring 11 can be realized.

Seventh Embodiment

A solar cell element 10G according to a seventh embodiment of the present invention and a solar cell element 10G', which is a variation thereof, will be described with reference to FIGS. 16A to 16D and FIGS. 17A and 17B.

FIGS. 16A to 16D are plan views of the solar cell element 10G and the solar cell element 10G' showing one example of electrode patterns of the first electrode 4 and the second electrode 5 in the solar cell element 10G and the solar cell element 10G'. FIG. 16A is a diagram of the solar cell element 10G when seen from the second surface 1S side in plan view, and FIG. 16B is a diagram of the solar cell element 10G when seen from the first surface 1F side in plan view. FIG. 16C is a diagram of the solar cell element 10G' when seen from the second surface 1S side in plan view, and FIG. 16D is a diagram of the solar cell element 10G' when seen from the first surface 1F side in plan view.

The shapes and the arrangement relationships of the first connection parts 4c and the second connection parts 5a in the solar cell element 10G and the solar cell element 10G' shown in FIGS. 16A and 16C are similar to the first connection parts 4c and the second connection parts 5a of the solar cell element 10D according to the fourth embodiment in that the longitudinal direction is in the reference direction and both the parts are arranged in parallel to the reference direction and alternately. However, the solar cell element 10G and the solar cell element 10G' differ from the solar cell element 10D in the relationship in the numbers of the first connection parts 4c and the second connection parts 5a.

That is, as shown in FIG. 16A, n (n is a natural number) pieces of first connection parts 4c and n−1 pieces second connection parts 5a are arranged in the solar cell element 10G. In FIG. 16A, a case of n=4 is shown. Meanwhile, as shown in FIG. 16C, n−1 pieces of first connection parts 4c and n pieces of second connection parts 5a are arranged in the solar cell element 10G'. In FIG. 16C, a case of n=4 is shown.

As shown in FIGS. 16B and 16D, the through holes 3 (conduction parts 4b) are formed so as to substantially coincide with the formation positions of the first connection parts 4c in plan view, and the main electrode parts 4a are uniformly formed on the first surface 1F as a plurality of linear patterns connecting to the plurality of (four in FIG. 16B, three in FIG. 16D) conduction parts 4b belonging to different arrays both in the solar cell element 10G and the solar cell element 10G'.

Figure 17A:
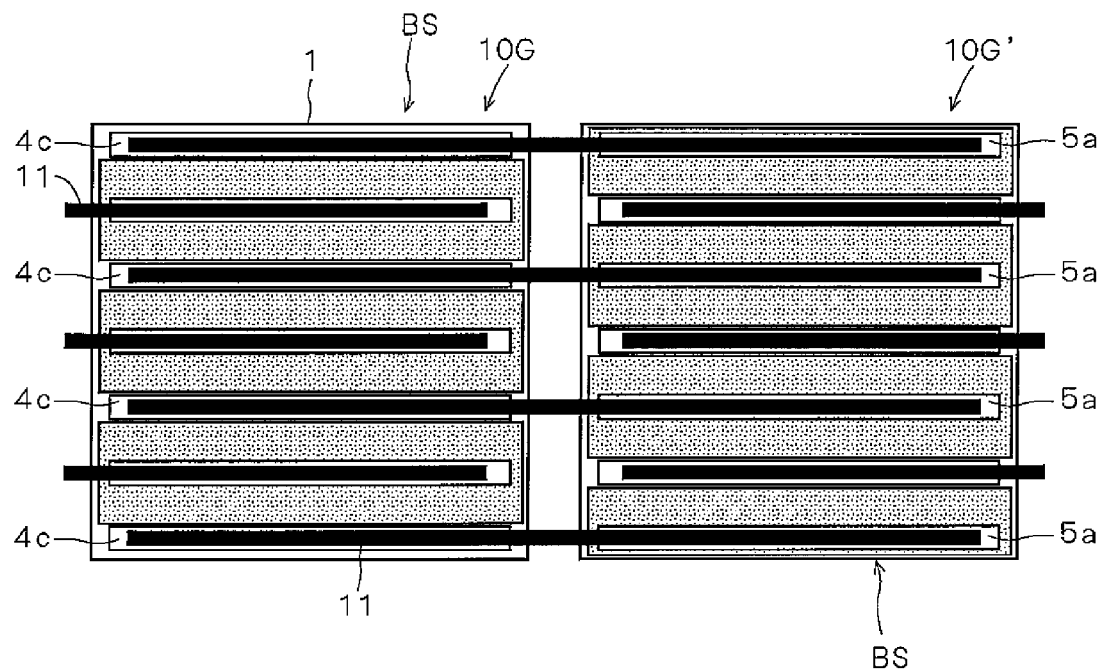
FIGS. 17A and 17B are diagrams showing in detail the state of connection of the solar cell element 10G and the solar cell element 10G' by the wirings 11 in the solar cell module 20G according to the seventh embodiment.
Figure 17B:
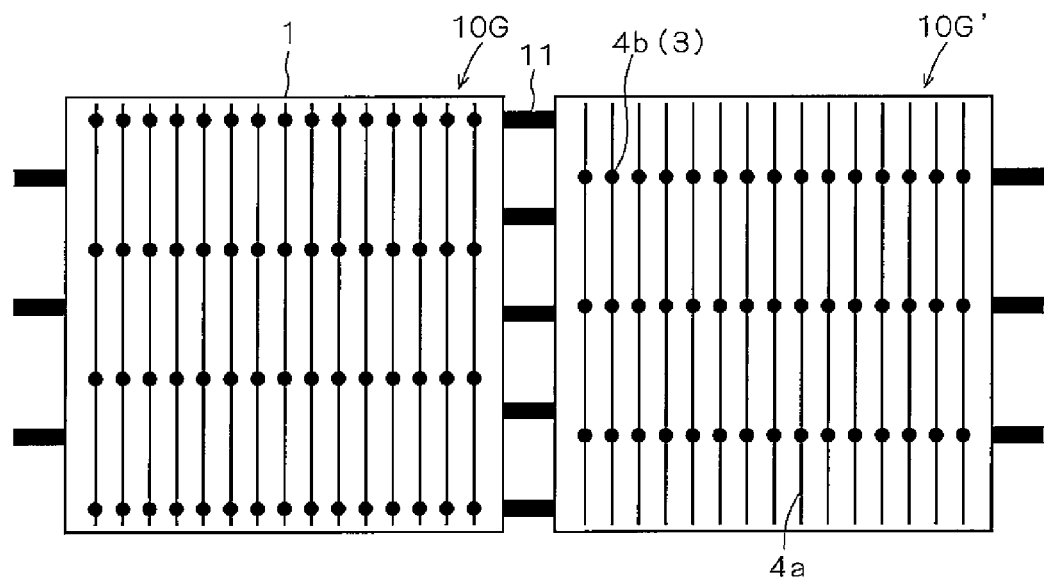

FIGS. 17A and 17BG are diagrams showing the detail of connection by the wirings 11 of the solar cell elements 10G and the solar cell elements 10G' in the solar cell module 20G configured using a plurality of solar cell elements 10G and a plurality of solar cell elements 10G'. FIG. 17A is a diagram of the solar cell element 10G and the solar cell element 10G' adjacent to each other in the solar cell module 20G when seen from the second surface 1S side in plan view, and FIG. 17B is a diagram of the same when seen from the first surface 1F side in plan view.

The solar cell module 20G differs from the solar cell module according to each embodiment described above, and the solar cell element 10G and the solar cell element 10G' having different arrangement relationships between the first connection parts 4c and the second connection parts 5a are arranged alternately and so that the respective base sides BS are positioned on one straight line. In the solar cell module 20G having such a configuration, the first connection parts 4c of a certain solar cell element 10G and the second connection parts 5a of the adjacently positioned solar cell element 10G' exist on one straight line. In the solar cell module 20G, the first connection parts 4c and the second connection parts 5a satisfying such a relationship are connected using the wirings 11 (first wiring, second wiring) having a linear form in plan view. In the present embodiment as well, the relative arrangement relationship among the sets of the first connection part 4c and the second connection part 5a in a relationship of being connected with one wiring 11 is equivalent (i.e., all the sets of the first connection part 4c and the second connection part 5a are in a translationally symmetric relationship), and thus the connection of each set of the first connection part 4c and the second connection part 5a is performed by the wiring 11 having the same shape. For instance, a wiring having a shape similar to that used in the solar cell module 20A may be used.

Eighth Embodiment

A solar cell element 10H according to an eighth embodiment of the present invention will now be described with reference to FIGS. 18A and 18B, FIGS. 19A and 19B, and FIGS. 20A and 20B.

Figure 18A:
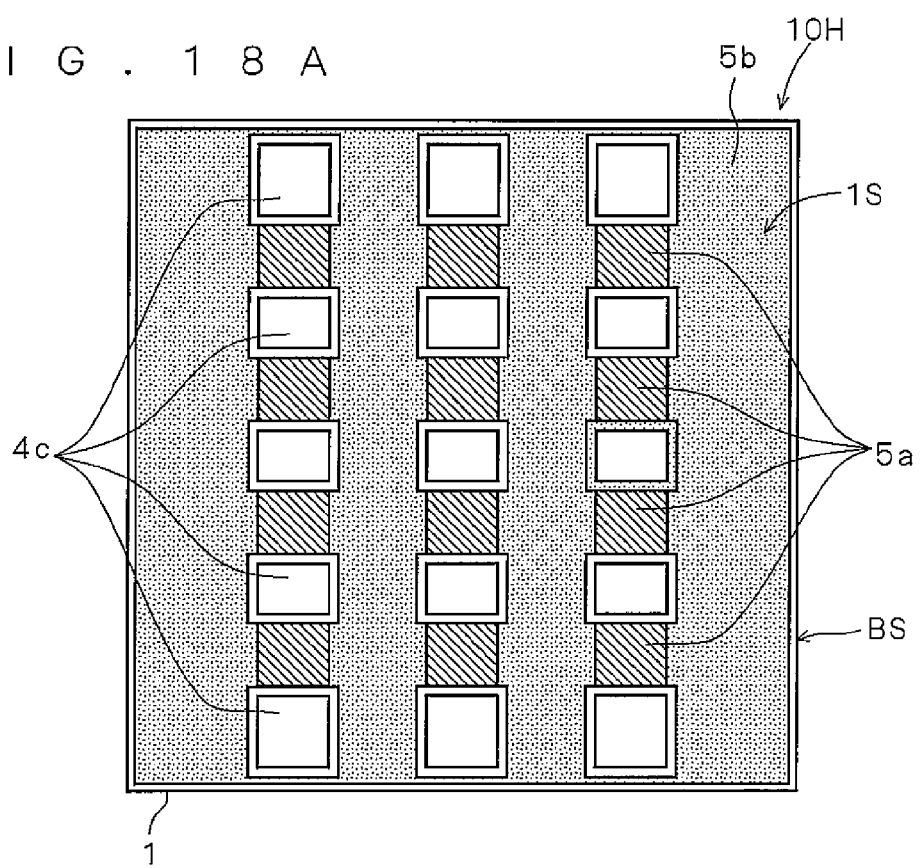
FIGS. 18A and 18B are plan views of a solar cell element 10H according to an eighth embodiment of the present invention.
Figure 18B:
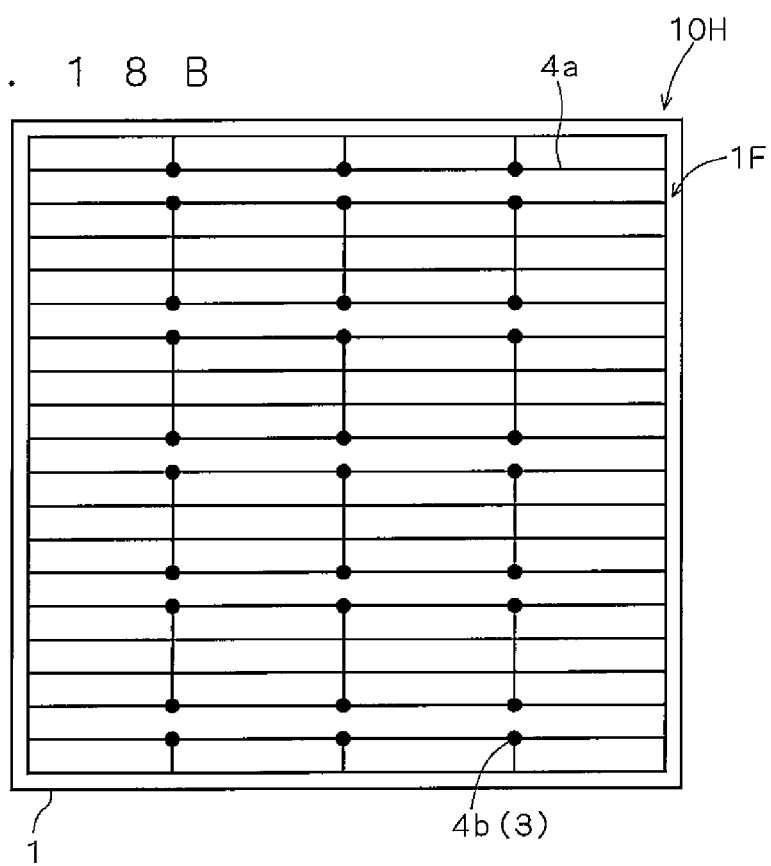

FIGS. 18A and 18B are plan views of the solar cell element 10H showing one example of electrode patterns of the first electrode 4 and the second electrode 5 in the solar cell element 10H. FIG. 18A is a diagram of the solar cell element 10H when seen from the second surface 1S side in plan view, and FIG. 18B is a diagram of the solar cell element 10H when seen from the first surface 1F side in plan view.

As shown in FIG. 18A, in the solar cell element 10H, each plurality of first connection parts 4c having a square shape is arranged discretely at substantially regular intervals in a plurality of columns (three columns in FIG. 18A) parallel to the reference direction, and the second connection parts 5a are arranged between the first connection parts 4c in each column. In FIG. 18A, five first connection parts 4c and four second connection parts 5a are arranged in one column. The columns are arranged at substantially regular intervals in parallel to the reference direction. The first connection parts 4c and the second connection parts 5a are formed into a size with which two wirings 11 can be arranged parallel to the reference direction when forming a solar cell module 20H to be described later.

Similar to other embodiments, in the solar cell element 10H, the power collecting part 5b is formed over substantially the entire surface other than the formation region of the first connection parts 4c. Since the second connection parts 5a are arranged while being sandwiched between the power collecting part 5b in the solar cell element 10H, the carriers collected at the power collecting part 5b are efficiently gathered at the second connection parts 5a.

As shown in FIG. 18B, in the solar cell element 10H, the through holes 3 (conduction parts 4b) are formed so as to substantially coincide with the formation positions of the first connection parts 4c in plan view. In the solar cell element 10H, two through holes (conduction parts 4b) are formed in correspondence to one first connection part 4c. Furthermore, the main electrode parts 4a are uniformly formed on the first surface 1F as a plurality of linear patterns connecting to the plurality of (three in FIG. 18B) conduction parts 4b belonging to different arrays.

Figure 19A:
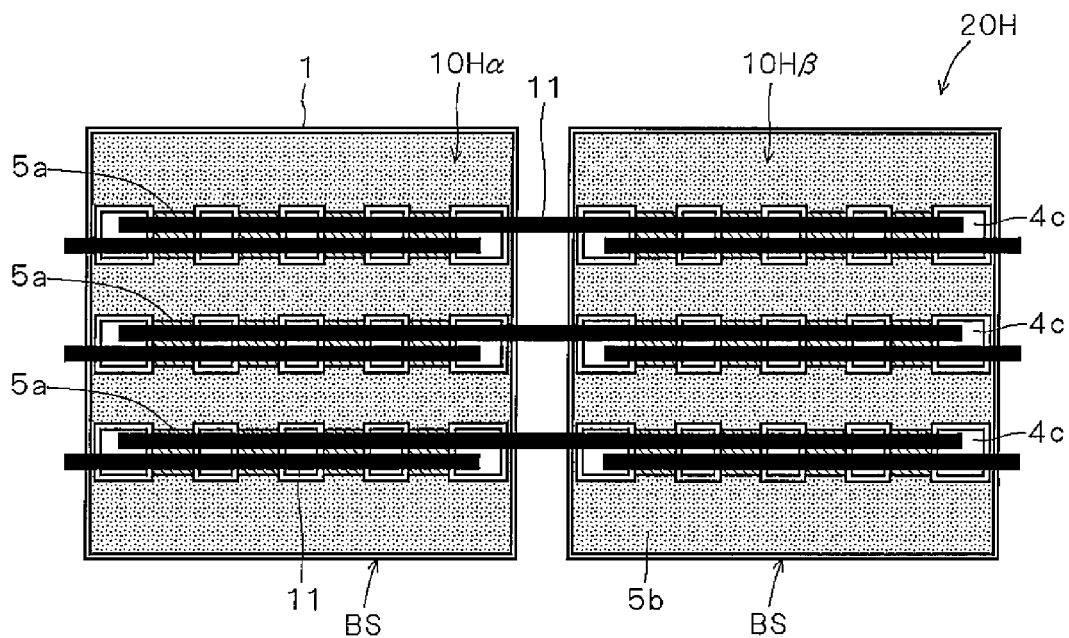
FIGS. 19A and 19B are diagrams showing in detail the state of connection of the solar cell elements 10H by the wirings 11 in the solar cell module 20H according to the eighth embodiment.
Figure 19B:
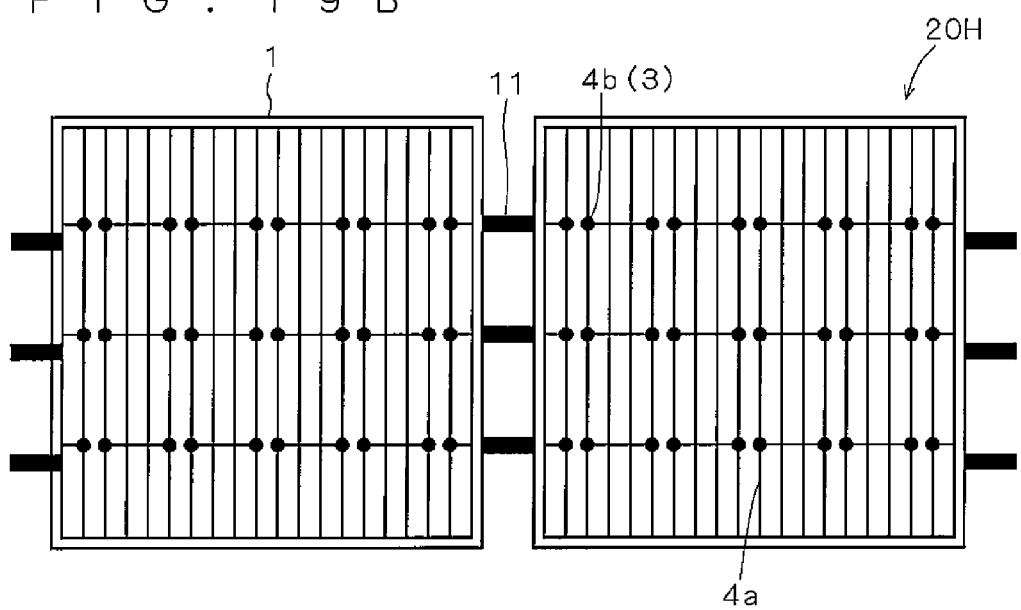

FIGS. 19A and 19B are diagrams showing the detail of connection by the wirings 11 of the solar cell elements 10H in the solar cell module 20H configured using a plurality of solar cell elements 10H. FIG. 19A is a diagram of two solar cell elements 10H adjacent to each other in the solar cell module 20H when seen from the second surface 1S side in plan view, and FIG. 19B is a diagram of the same when seen from the first surface 1F side in plan view.

In the case of configuring the solar cell module 20H using the solar cell element 10H in which the first connection parts 4c and the second connection parts 5a have the shapes and the arrangement relationship described above, the adjacent solar cell elements 10H are arranged so that the respective base sides BS are parallel and are positioned on the same straight line, and are in a translationally symmetric relationship with each other, as shown in FIG. 19A, as in the solar cell module 20A, whereby the first connection parts 4c of one solar cell element 10H and the second connection parts 5a of the other solar cell element 10H exist on one straight line. In the following description, of the two solar cell elements 10H connected by the wirings 11 in FIGS. 19A and 19B, the solar cell element 10H having the wirings 11 connected to the first connection parts 4c is referred to as a first solar cell element 10Hα, and the solar cell element 10H having the wirings connected to the second connection parts 5a is referred to as a second solar cell element 10Hβ, for the sake of convenience.

In the solar cell module 20H, the first connection parts 4c of the first solar cell element 10Hα and the second connection parts 5a of the second solar cell element 10Hβ satisfying the above relationship are connected using the wirings 11 having a linear form in cross section, similar to that in the solar cell module 20A according to the first embodiment. In this case, the first connection parts 4c and the second connection parts 5a alternately arranged in one column in one solar cell element 10H are connected to the second connection parts 5a and the first connection parts 4c of a different solar cell element, respectively. That is, two wirings 11 are connected in parallel in that column.

In this case, however, when attempting to connect them as it is with the wirings 11, the first connection parts 4c and the second connection parts 5a are caused to short-circuit in the first solar cell element 10Hα and the second solar cell element 10Hβ. In order to avoid this, in the present embodiment, when fabricating the solar cell element 10H or when configuring the solar cell module 20H, an insulating layer (not shown) made of an oxide film, resin (an epoxy resin, an acrylic resin, a polyimide resin, a silicone resin, and the like), an insulating tape, and the like is arranged on the second connection parts 5a of the first solar cell element 10Hα and the first connection parts 4c of the second solar cell element 10Hβ at a portion to be positioned immediately under the wirings 11, and then connecting with the wirings 11 is carried out. More specifically, since the two wirings 11 having different connecting destinations are connected to the column in which the first connection parts 4c and the second connection parts 5a are alternately positioned, the insulating layer is formed only at half of the region in the first connection parts 4c and the second connection parts 5a. That is, as for the first connection parts 4c, the insulating layer is formed only in the region assumed as the first connection parts 4c of the second solar cell element 10Hβ, and as for the second connection parts 5a, the insulating layer is formed only in the region assumed as the second connection parts 5a of the first solar cell element 10Hα.

Therefore, in the present embodiment, the relative arrangement relationship among the sets of the first connection parts 4c and the second connection parts 5a in a relationship of being connected with one wiring 11 is equivalent (i.e., the sets of first connection parts 4c and second connection parts 5a are all in a translationally symmetric relationship), and thus the wiring 11 having the same shape can be used for the connection of each set of the first connection part 4c and the second connection part 5a.

The formation of the insulating layer may be a mode of being performed by patterning through an application method or the like so as to be formed only at the relevant locations, or a mode of removing unnecessary portions after performing film formation with an insulating layer formation material on the second surface 1S side of the semiconductor substrate 1 after the first connection parts 4c, the second connection parts 5a, and the power collecting parts 5b are formed.

Figure 20A:
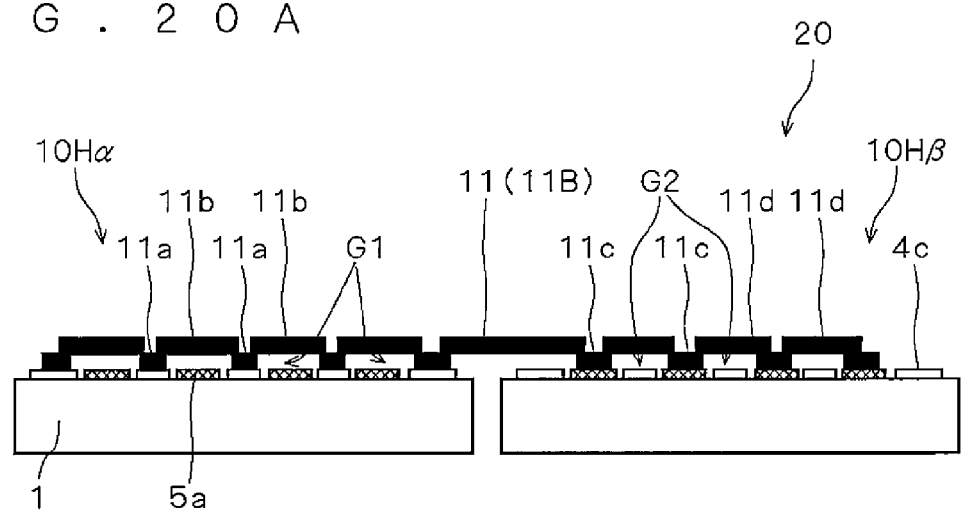
FIGS. 20A and 20B are diagrams illustrating a different connection mode between the solar cell elements 10H in the solar cell module 20H according to the eighth embodiment.
Figure 20B:
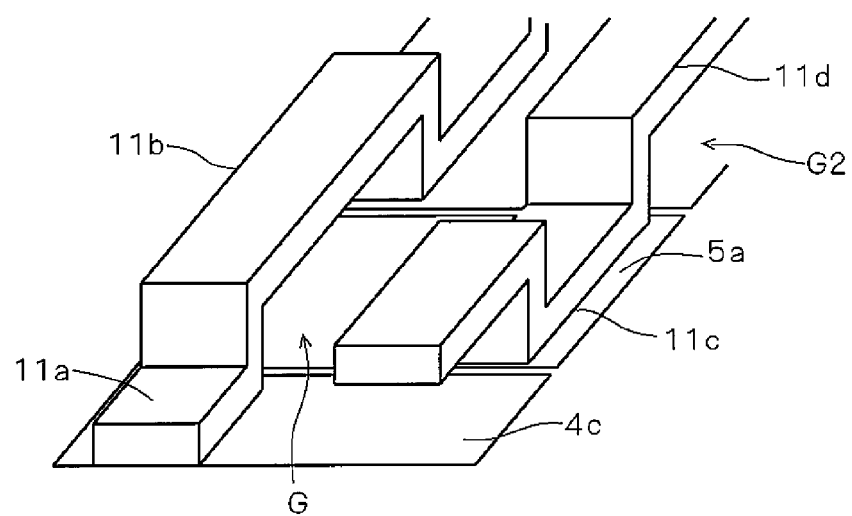

FIG. 20A is a schematic view of a cross section parallel to the reference direction of the two solar cell elements 10H adjacent to each other in the solar cell module 20H to describe another connection mode in the solar cell module 20H. FIG. 20B is a perspective view showing a state of connection in such a connection mode.

In this mode, the first connection parts 4c of the first solar cell element 10Hα and the second connection parts 5a of the second solar cell element 10Hβ are connected using wirings 11B having a plurality of bent parts in cross-sectional view, as shown in FIGS. 20A and 20B. A wiring in which a copper film covered with solder similar to that used in the wiring 11 is folded in an appropriate shape is used for the wiring 11.

The wiring 11B has a plurality of first connection surfaces 11a connecting with the first connection parts 4c at the first solar cell element 10Hα, a first separated part 11b between two first connection surfaces 11a, a plurality of second connection surfaces 11c connecting with the second connection parts 5a at the second solar cell element 10Hβ, and a second separated part 11d between two second connection surfaces 11c. When the first connection surfaces 11a of the wiring 11B are connected to the first connection parts 4c of the first solar cell element 10Hα and the second connection surfaces 11c of the wiring 11B are connected to the second connection parts 5a of the second solar cell element 10Hβ while the plurality of solar cell elements 10H arranged as described above, a gap G1 exists between the second connection part 5a of the first solar cell element 10Hα and the first separated part 11b of the wiring 11B. Similarly, a gap G2 exists between the first connection part 4c of the second solar cell element 10Hβ and the second separated part 11d of the wiring 11B. The short circuit between the first connection parts 4c and the second connection parts 5a in one solar cell element 10H is reduced by having the gaps G1, G2 acting similarly to the insulating layer in the case of using the wiring 11 having a linear form in cross section as shown in FIGS. 19A and 19B. A mode of arranging the insulating layer (not shown) for filling the gaps G1, G2 on the wiring 11B in advance, and connecting the wiring 11B may be adopted.

In the case of performing connection using such a wiring 11B, the quality of alignment of the wiring 11B and the first connection parts 4c and the second connection parts 5a can be visibly checked. The reduction in connection failure can thereby be achieved.

Since the relative arrangement relationship among the sets of the first connection parts 4c and the second connection parts 5a to be connected is still equivalent even in the case of using the wiring 11B, a wiring having the same shape can be used for the wiring 11B used in connecting each set of the first connection part 4c and the second connection part 5a.

Furthermore, in the solar cell element 10H, the first connection parts 4c and the second connection parts 5a may be formed into a shape different from above (e.g., trapezoid, circle, ellipse, semicircle, fan-shape, or composite shape thereof) as long as the above array state is met and the connection mode by the wiring 11 can be realized.

Ninth Embodiment

A solar cell element 10I according to a ninth embodiment of the present invention will be described with reference to FIGS. 21A and 21B and FIGS. 22A and 22B.

FIGS. 21A and 21B are plan views of the solar cell element 10I showing one example of electrode patterns of the first electrode 4 and the second electrode 5 in the solar cell element 10I. FIG. 21A is a diagram of the solar cell element 10I when seen from the second surface 1S side in plan view, and FIG. 21B is a diagram of the solar cell element 10H when seen from the first surface 1F side in plan view.

As shown in FIG. 21A, in the solar cell element 10I, each plurality of (five in the FIG. 21A) first connection parts 4c having a rectangular shape and having a longitudinal direction in the reference direction is arranged with a gap at substantially regular intervals in a plurality of columns (three columns in FIG. 21A), as in the solar cell element 10E according to the fifth embodiment. The columns are arranged at substantially regular intervals in parallel to the reference direction. Meanwhile, each plurality of (four in the FIG. 21A) second connection parts 5a having a rectangular shape and having a longitudinal direction in the reference direction is arranged with a gap formed at substantially regular intervals in a plurality of columns (i.e., the number of columns is the same as that of the columns of the first connection parts 4c) along the columns of the first connection parts 4c.

The solar cell element 10I is the same as the solar cell element 10E of the fifth embodiment in that the arrangement positions of the first connection parts 4c and the second connection parts 5a are defined so that a rotationally symmetric arrangement is realized between solar cell elements 10I adjacent to each other in the case a solar cell module 20I to be described later is configured with them.

Furthermore, the solar cell element 10I is the same as the solar cell element 10E in that the first connection parts 4c and the second connection parts 5a are arranged so as to satisfy a relationship that there exits at least partially adjacent second connection part 5a for all the clearances between the first connection parts 4c, and the formation mode of the power collecting part 5b is also similar to the solar cell element 10E.

Furthermore, as shown in FIG. 21B, the formation mode of the through holes 3 (conduction parts 4b) is also similar.

However, the solar cell element 10I differs from the solar cell element 10E according to the fifth embodiment in three aspects that the solar cell element 10I has the columns of the first connection parts 4c and the columns of the second connection parts 5a spaced apart, that each first connection part 4c includes a region 4c1 where the wiring is arranged and a region 4c2 connected with the through hole and is formed into a convex shape in plan view having the latter region as a convex part, and that the through holes 3 are formed only immediately above the through hole arrangement regions 4c2 of the first connection parts 4c and not formed immediately above the wiring arrangement regions 4c1.

Figure 22A:
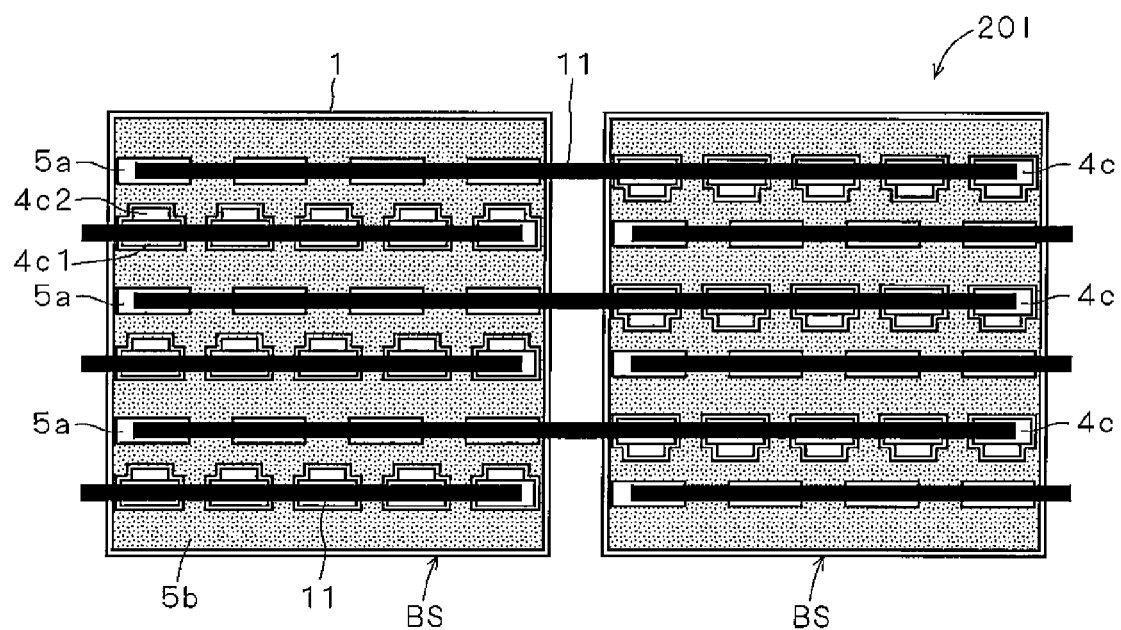
FIGS. 22A and 22B are diagrams showing in detail the state of connection of the solar cell elements 10I by the wirings 11 in the solar cell module 20I according to the ninth embodiment.
Figure 22B:
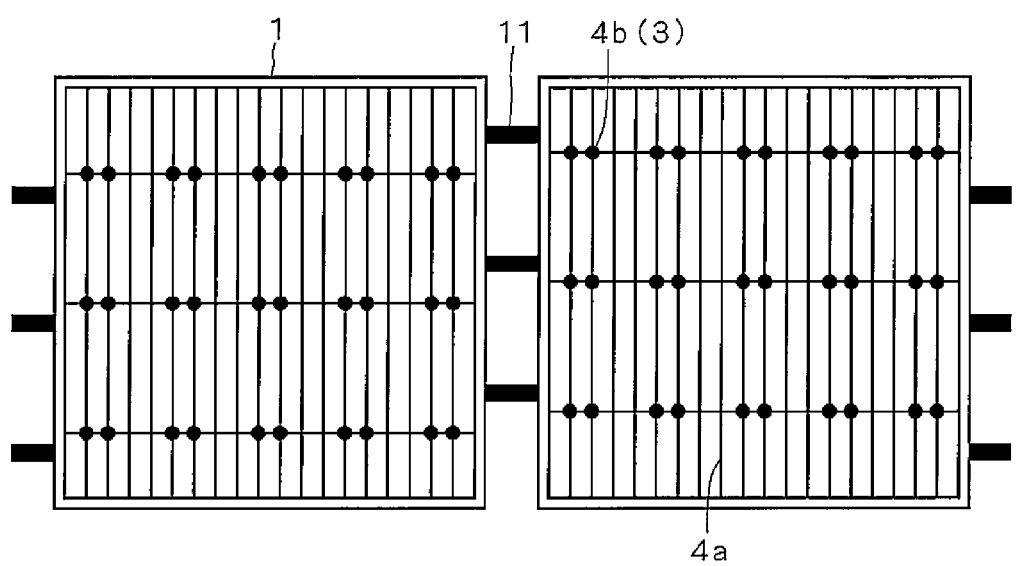

FIGS. 22A and 22B are diagrams showing the detail of connection by the wirings 11 between the solar cell elements 10I in the solar cell module 20I configured using a plurality of solar cell elements 10I having the above configuration. FIG. 22A is a diagram of two solar cell elements 10I adjacent to each other in the solar cell module 20I when seen from the second surface 1S side in plan view, and FIG. 22B is a diagram of the same when seen from the first surface 1F side in plan view.

In the case of configuring the solar cell module 20I using the solar cell element 10I as described above, the adjacent solar cell elements 10E are arranged so that that the respective base sides BS are parallel and are positioned not on the same straight line, and are in a rotationally symmetric (more specifically, point symmetric) relationship with each other, as shown in FIG. 22A, as in the solar cell module 20E. According to such an arrangement, the first connection parts 4c of one solar cell element 10I and the second connection parts 5a of the other solar cell element 10I exist on one straight line. In the solar cell module 20I, such first connection parts 4c and second connection parts 5a are connected using the wirings 11 having a linear form in plan view. Also in the present embodiment, the relative arrangement relationship among the sets of the first connection parts 4c and the second connection parts 5a in a relationship of being connected with one wiring 11 is equivalent (i.e., the sets of first connection parts 4c and second connection parts 5a are all in a translationally symmetric relationship), and thus the wiring 11 having the same shape can be used for the connection of each set of the first connection part 4c and the second connection part 5a. For instance, a wiring having a similar shape to that used in the solar cell module 20A may be used.

In the first connection parts 4c of the solar cell module 20I formed by connecting the solar cell elements 10I in this manner, the wirings 11 are connected only at the wiring arrangement regions 4c1, as shown in FIGS. 22A and 22B, and this realizes a structure in which the wirings 11 do not directly contact the through hole arrangement regions 4c2 formed with the conduction parts 4b immediately above. Thus, generation of heat contraction stress that may occur in the through holes 3 when connecting the wirings 11 to the first connection parts 4c using hot air, a soldering iron, or a reflow furnace can be alleviated. As a result, generation of cracks at the through holes 3 having a relatively weak strength can be reduced.

When the wirings 11 connected to the first connection parts 4c of one solar cell element 10I contact the power collecting part 5b of the same solar cell element 10I, the first connection parts 4c and the power collecting part 5b short-circuit and cause leakage, and thus an insulating layer is preferably formed on the power collecting part 5b at the locations that it contacts the wirings 11. Alternatively, a mode of connecting with wirings similar to the wirings 11B may be adopted.

Furthermore, in the solar cell element 10I, the wiring arrangement regions 4c1 and the through hole arrangement regions 4c2 of the first connection parts 4c and the second connection parts 5a may be formed into a shape different from above (e.g., trapezoid, circle, ellipse, semicircle, fan-shape, or composite shape thereof) as long as the above array state is met and the connection mode by the wirings 11 can be realized.

Tenth Embodiment

A solar cell element 10J according to a tenth embodiment of the present invention will be described with reference to FIG. 23.

Figure 23:
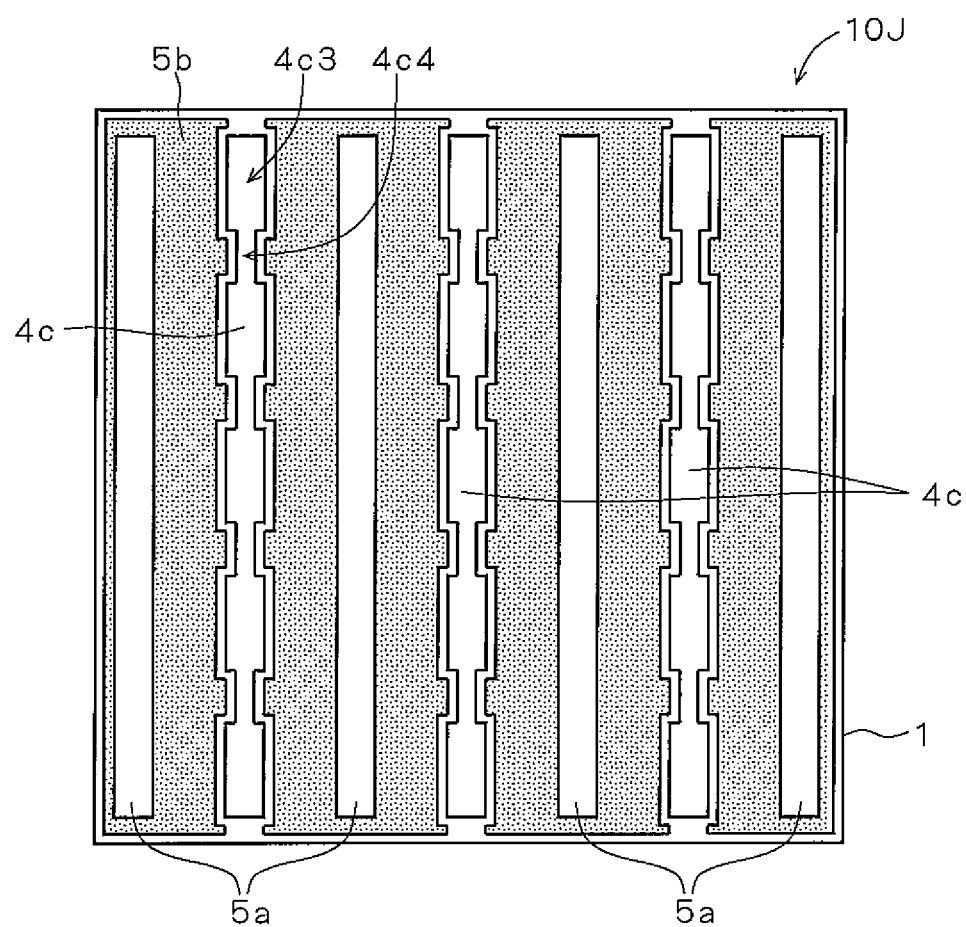
FIG. 23 is a plan view of a solar cell element 10J according to a tenth embodiment of the present invention.

FIG. 23 is a plan view of the solar cell element 10J showing one example of electrode patterns of the first electrode 4 and the second electrode 5 in the solar cell element 10J when seen from the second surface 1S side in plan view.

As in the solar cell element 10G' according to the seventh embodiment, in the solar cell element 10J, the shapes and the arrangement relationship of the first connection parts 4c and the second connection parts 5a are such that both of them have a longitudinal direction in the reference direction and are alternately arranged parallel to the reference direction. Furthermore, it is also similar that n−1 pieces of first connection parts 4c and n pieces of second connection parts 5a are arranged. FIG. 23 shows a case of n=4.

However, the solar cell element 10J differs from the solar cell element 10G' in that each first connection part 4c of the solar cell element 10J has a concave-convex shape along the reference direction by alternately arranging two sites of different widths in the reference direction. Of the two sites, the site having a larger width is referred to as an adhering region 4c3, and the site having a smaller width is referred to as a non-adhering region 4c4.

In the case of configuring a solar cell module using a plurality of solar cell elements 10J and the wirings 11 (more strictly, a solar cell element having a structure corresponding to the solar cell element 10G is also necessary), the solder of the wiring 11 is welded to connect the wiring 11 to the first connection part 4c only at the adhering regions 4c3 in the first connection part 4c. That is, adhesion is performed by points. It is more preferable that each wiring 11 is connected by being welded over the entire surface of the first connection part 4c, but sufficiently satisfactory connection is still realized with the mode of adhesion by points.

In such a mode, the power collecting part 5b and the high concentration doped layer 6 can be formed wider, as shown in FIG. 23, by arranging a non-adhering region 4c4 having a narrower width than the adhering region 4c3. That is, the first connection parts 4c are formed so as to have a concave-convex shape in the reference direction, and then the power collecting part 5b and the high concentration doped layer 6 are formed so as to have a concave-convex shape in the reference direction at the interface portions with the first connection parts 4c. The area of the formation region of the high concentration doped layer 6 then increases, and thus the output characteristics of the solar cell element is further enhanced.

Eleventh Embodiment

A solar cell element 10K according to an eleventh embodiment of the present invention and a solar cell element 10K', which is a variation thereof, will be described with reference to FIGS. 24A to 24C and FIGS. 25A to 25C.

Figure 24A:
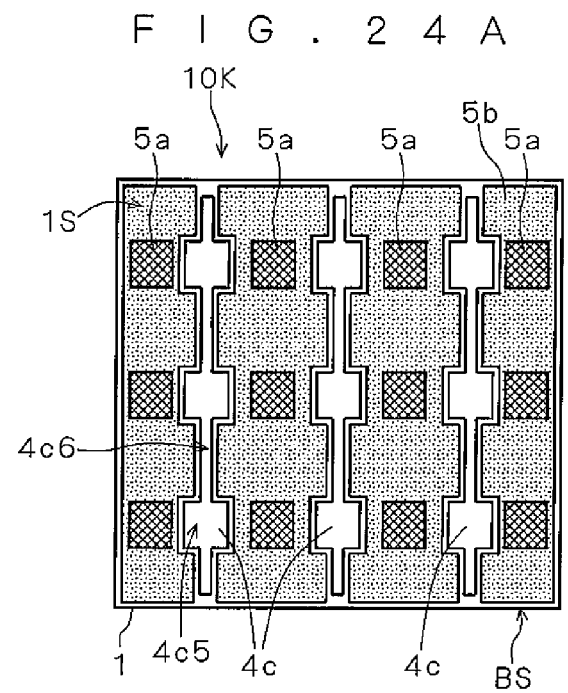
FIGS. 24A to 24C are plan views of a solar cell element 10K according to an eleventh embodiment of the present invention.
Figure 24B:
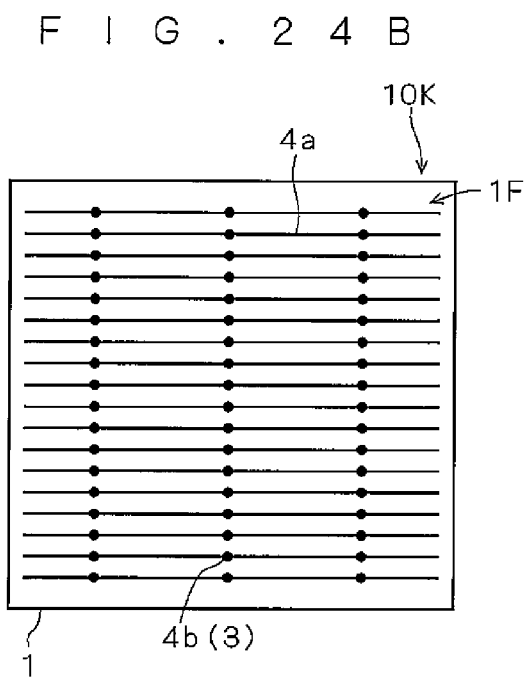
Figure 24C:
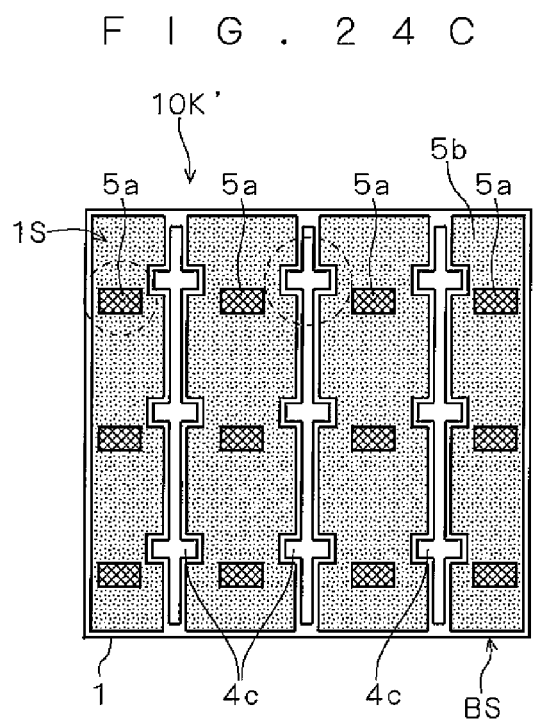

FIGS. 24A to 24C are plan views of the solar cell element 10K showing one example of electrode patterns of the first electrode 4 and the second electrode 5 in the solar cell element 10K. FIG. 24A is a diagram of the solar cell element 10K when seen from the second surface 1S side in plan view, FIG. 24B is a diagram of the solar cell element 10K when seen from the first surface 1F side in plan view, and FIG. 24C is a diagram of the solar cell element 10K' when seen from the second surface 1S side in plan view.

The solar cell element 10K has a structure that each plurality of (three in FIG. 24A) square-shaped wiring arrangement regions 4c5 constituting portions of the first connection parts 4c is arranged discretely at substantially regular intervals in a plurality of columns (three columns in FIG. 24A) in the reference direction, and that a plurality of second connection parts 5a is arranged so as to sandwich the respective wiring arrangement regions (first portions of first electrodes) 4c5 in each column. On this point, the solar cell element 10K seems to have a configuration similar to the solar cell element 10H according to the eighth embodiment (however, the position of the base sides BS of the solar cell element 10H shown in FIG. 18A is different by 90° from that of the solar cell element 10K shown in FIG. 24A). The formation mode of the power collecting part 5b is also similar to the solar cell element 10H.

However, the solar cell element 10K differs from the solar cell element 10H in that each wiring arrangement region 4c5 is continuous with the wiring arrangement region 4c5 of another column by a non-wiring arrangement region (second portion of first electrode) 4c6 extending in a direction perpendicular to the reference direction, that is, in that the first connection parts 4c have a longitudinal direction perpendicular to the reference direction and concave-convex shapes along the direction. In FIG. 24A, the widths of the wiring arrangement region 4c5 and the non-wiring arrangement region 4c6 in the arrangement direction of a plurality of solar cell elements differ from each other, where the width of the wiring arrangement region 4c5 is greater than the width of the non-wiring arrangement region 4c6.

The first connection parts 4c and the second connection parts 5a are formed into sizes with which two wirings 11 can be arranged parallel to the reference direction when forming a solar cell module 20K to be described later.

Also in the solar cell element 10K, a plurality of conduction parts 4b is formed in correspondence to a plurality of through holes 3 formed in the semiconductor substrate 1. As shown in FIG. 24B, the through holes 3 (conduction parts 4b) of the solar cell element 10K are formed so as to be positioned immediately above along the longitudinal direction (direction perpendicular to the reference direction) of the first connection parts 4c. The main electrode parts 4a are uniformly formed on the first surface 1F as a plurality of linear patterns connecting with a plurality of (three in FIG. 24B) conduction parts 4b positioned in the reference direction.

Figure 25A:
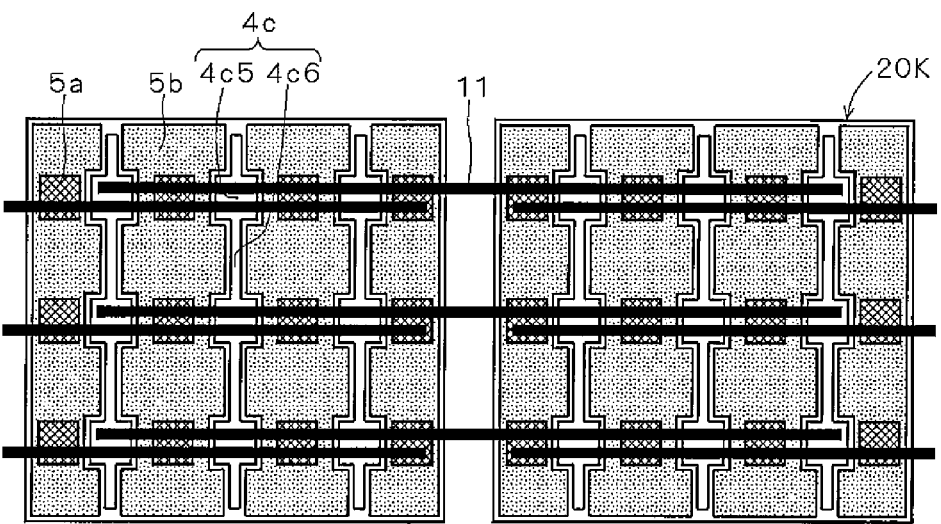
FIGS. 25A to 25C are diagrams showing in detail the state of connection of the solar cell elements 10K by the wirings 11 in the solar cell module 20K according to the eleventh embodiment.
Figure 25B:
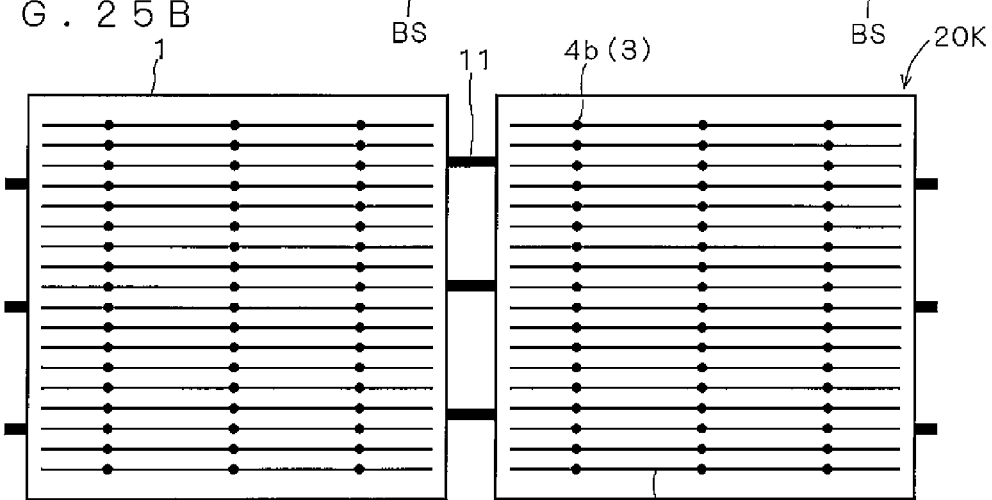
Figure 25C:
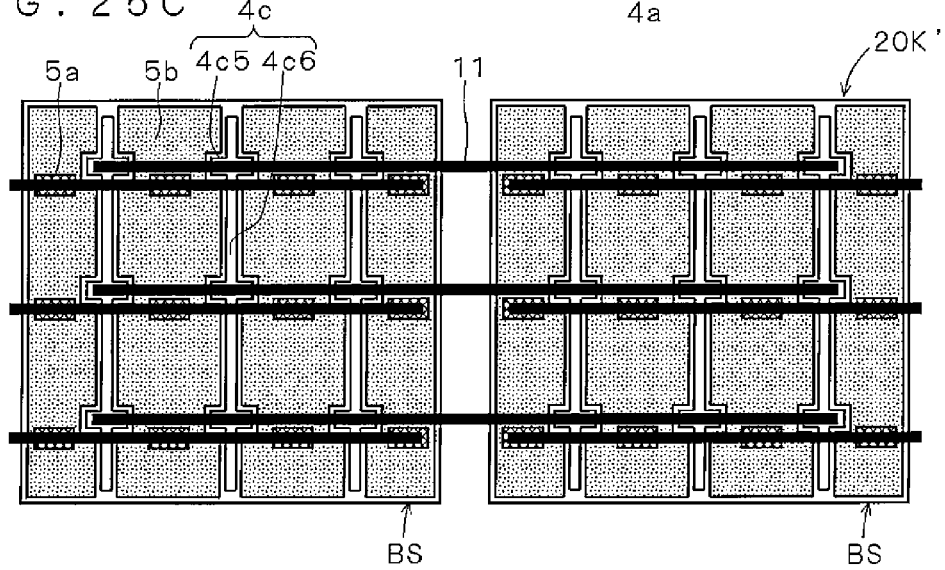

FIGS. 25A to 25C are diagrams showing the detail of connection between the solar cell elements 10K or between the solar cell elements 10K' by the wirings 11 in the solar cell module 20K configured using a plurality of solar cell elements 10K and the solar cell module 20K' configured using a plurality of solar cell elements 10K'. FIG. 25A is a diagram of the two solar cell elements 10K adjacent to each other in the solar cell module 20K when seen from the second surface 1S side in plan view, FIG. 25B is a diagram of the same when seen from the first surface 1F side in plan view, and FIG. 25C is a diagram of the two solar cell elements 10K' adjacent to each other in the solar cell module 20K' when seen from the second surface 1S side in plan view.

In the case of configuring the solar cell module 20K using the solar cell element 10K in which the first connection parts 4c and the second connection parts 5a have the above shapes and arrangement relationship, the adjacent solar cell elements 10K are arranged so that the respective sides BS are positioned in parallel and on the same straight line, and in a translationally symmetric relationship with each other, as shown in FIG. 24A, as in the solar cell module 20H, so that the first connection parts 4c of one solar cell element 10K and the second connection parts 5a of the other solar cell element 10K exist on one straight line.

However, in this case as well, when attempting to connect the solar cell elements 10K with the wirings 11 in such a state, the first connection parts 4c and the second connection parts 5a are caused to short-circuit in one solar cell element 10K, as in the solar cell element 10H. In order to avoid this, also in the present embodiment, an insulating layer (not shown) is arranged at sites where connection is not necessary, similar to the case of configuring the solar cell module 20H, and then connection by the wirings 11 is carried out when fabricating the solar cell element 10K or when configuring the solar cell module 20K. Alternatively, as shown in FIGS. 20A and 20B, the solar cell elements 10K are connected so as to create a clearance corresponding to the insulating layer using the wirings 11B having a broken folded line shape. Alternatively, the solar cell elements 10K are connected so as to arrange the insulating layer in the clearance.

In the solar cell element 10K' shown in FIG. 24C, the first connection parts 4c and the second connection parts 5a are not formed in a part corresponding to a region where the insulating layer is to be formed or a gap is to be created thereon of the first connection parts 4c and the second connections part 5a of the solar cell element 10K. Instead, the power collecting part 5b is formed in such part. That is, since the region of the power collecting part 5b is larger in the solar cell element 10K' than in the solar cell element 10K, the output characteristics in the solar cell element 10K' are further enhanced than in the solar cell element 10K. However, the first connection parts 4c and the second connection parts 5a in the solar cell element 10K' have the respective arrangement positions defined so as to realize a rotationally symmetric arrangement between the adjacent solar cell elements 10K' when configuring the solar cell module 20K'.

In the case of configuring the solar cell module 20K' using the solar cell element 10K' in which the first connection parts 4c and the second connection parts 5a have the above shapes and arrangement relationship, the adjacent solar cell elements 10K' are arranged so that the respective base sides BS are positioned in parallel and not on the same straight line, and so that they are in a rotationally symmetric (more specifically, point symmetric) relationship, as shown in FIG. 25C. Accordingly, the first connection parts 4c of one solar cell element 10K' and the second connection parts 5a of the other solar cell element 10K' exist on one straight line.

In the solar cell module 20K' in which a plurality of solar cell elements 10K' is arranged, the first connection parts 4c and the second connection parts 5a are connected using the wirings 11 having a linear form in plan view. When the wirings 11 connected to the first connection parts 4c of one solar cell element 10K' contact the power collecting part 5b of the same solar cell element 10K', the first connection parts 4c and the power collecting part 5b short-circuit and cause leakage, and thus an insulating layer (not shown) is preferably formed on the power collecting part 5b at locations where it contact the wirings 11. Alternatively, a wiring similar to the wiring 11B having a plurality of bent parts in cross-sectional view may be used.

In both the solar cell modules 20K and 20K', the relative arrangement relationship among the sets of the first connection parts 4c and the second connection parts 5a to be connected with one wiring 11 or wiring 11B is equivalent (i.e., all the sets of first connection parts 4c and second connection parts 5a are in a translationally symmetric relationship), and thus a wiring having the same shape can be used for the wiring 11 or wiring 11B used in the connection of each set of the first connection part 4c and the second connection part 5a.

Regarding the solar cell elements 10K and 10K', the first connection parts 4c and the second connection parts 5a may be formed into a shape different from above (e.g., trapezoid, circle, ellipse, semicircle, fan-shape, or composite shape thereof) as long as the above array state is met and the connection mode by the wirings 11 can be realized.

(Variation)

Various variations of the solar cell element that can be applied to the solar cell module according to each embodiment described above of the present invention will now be described.

(Extension of the High Concentration Doped Layer and Power Collecting Part)

Figure 26A:
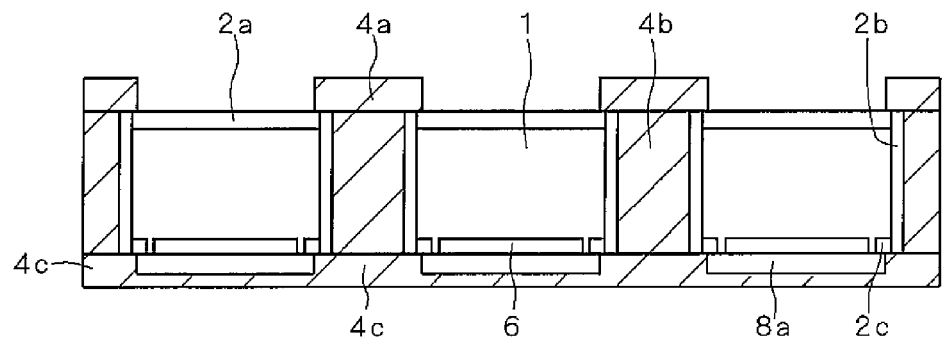
FIGS. 26A to 26C are diagrams showing various variations according to a structure in a cross sectional direction of the solar cell element.
Figure 26B:
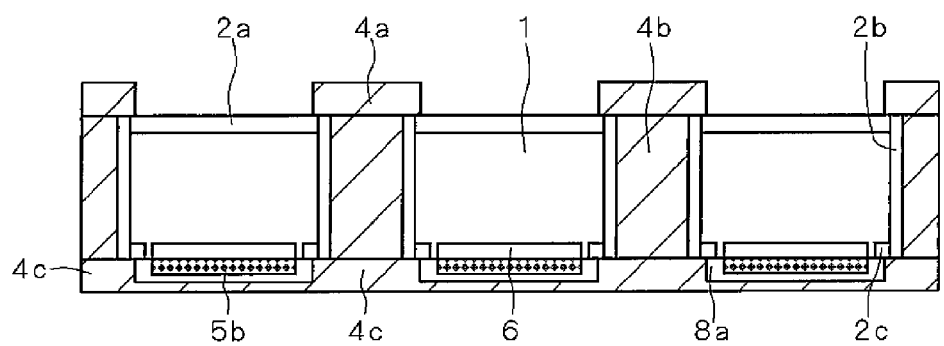
Figure 26C:
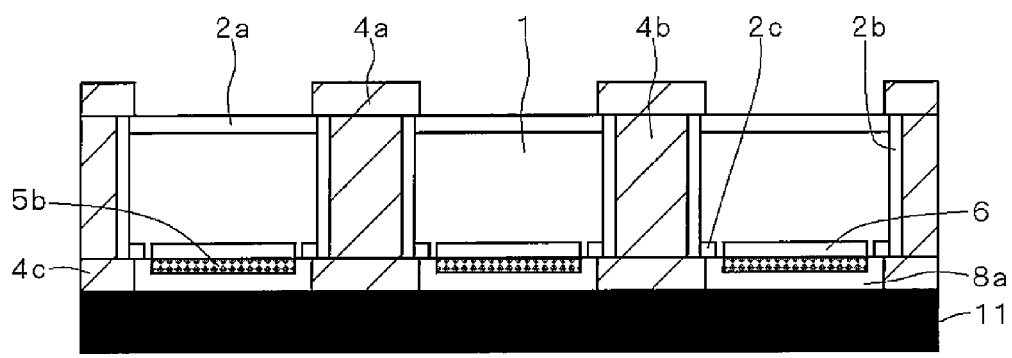

FIGS. 26A to 26C are diagrams showing a various variations according to a structure in a cross-sectional direction of the solar cell element.

FIG. 26A is a diagram showing a structure of the solar cell element in the case of extending the formation region of the high concentration doped layer 6 up to a position overlapping with the formation region of the first connection part 4c in plan view. This is realized through the procedures of forming the high concentration doped layer 6 so that it includes the portion overlapping with the location to be formed with the first connection part 4c (excluding the portion immediately below the through hole 3), then, forming an insulating layer 8a made of an oxide film such as silicon dioxide or a nitride film such as silicon nitride on the overlapped region of the high concentration doped layer 6 with the location to be formed with the first connection part 4c, and thereafter forming the first connection part 4c. Through such a configuration, the output characteristics of the solar cell element can be further enhanced compared to the embodiments described above.

FIG. 26B is a diagram showing a structure of the solar cell element in the case where not only the high concentration doper layer 6 but also the power collecting part 5b has the formation region extended up to a position overlapping with the formation region of the first connection part 4c in plan view. This is realized by forming the high concentration doper layer 6 and the power collecting part 5b sequentially and so that they include the portion overlapping with the location to be formed with the first connection part 4c (excluding the portion immediately below the through hole 3), then, forming the insulating layer 8a so as to cover the overlapped region of the power collecting part 5b with the location to be formed with the first connection part 4c, and thereafter forming the first connection part 4c. In addition to the effect of extending the high concentration doped layer 6 described above, an effect of reducing the movement distance of the carriers collected at the second connection part 5a and further enhancing the output characteristics of the solar cell element is obtained by adopting such a configuration.

FIG. 26C is a diagram showing a structure of the solar cell element, as an application of the structure shown in FIG. 26B, in the case of arranging a plurality of first connection parts 4c that is not of band form (e.g., dot form) so as to form a column in the arrangement direction of the wiring 11 and moreover extending the high concentration doper layer 6 and the power collecting part 5b between the first connection parts 4c. In this case, the wiring 11 is arranged, other than at the connecting location with the first connection part 4c, on the insulating layer 8a such as an oxide film, resin, an insulating tape, formed on the power collecting part 5b. In this case as well, similar effects to adopting the structure shown in FIG. 26B are obtained.

Figure 27A:
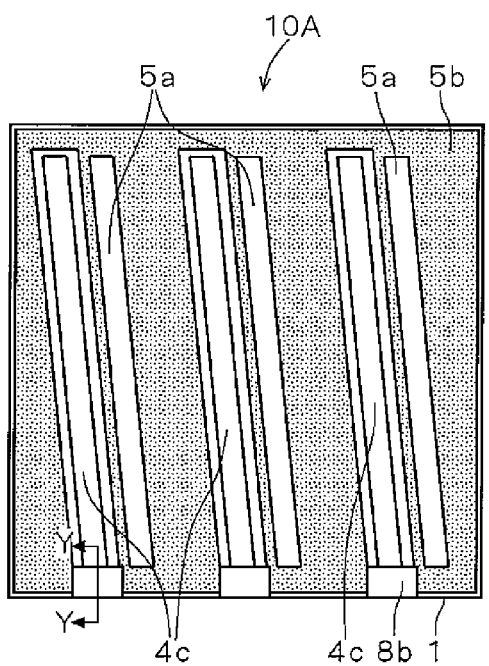
FIGS. 27A to 27D are diagrams showing another variations of the solar cell element.
Figure 27B:
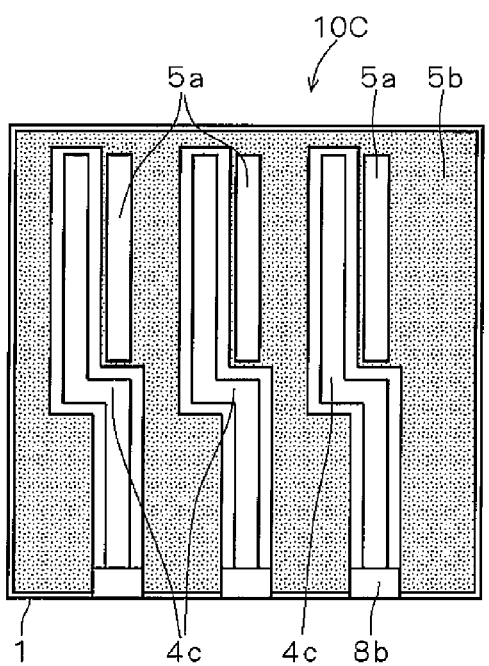
Figure 27C:
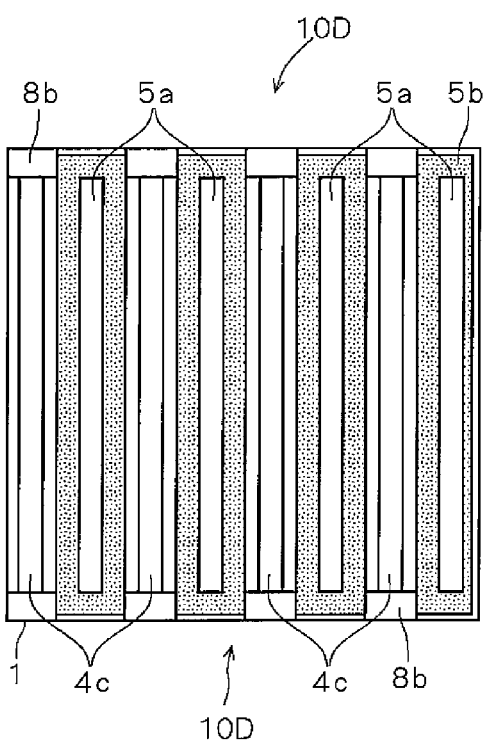
Figure 27D:
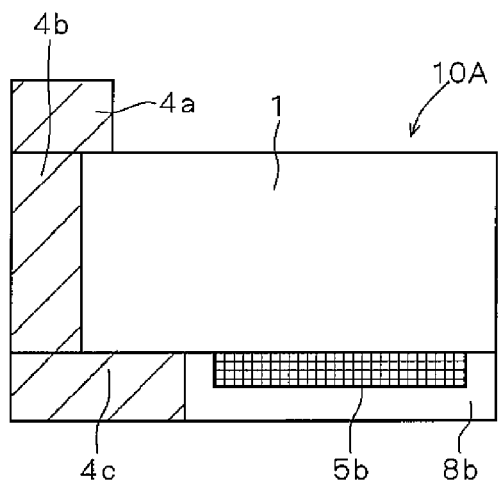
Figure 28A:
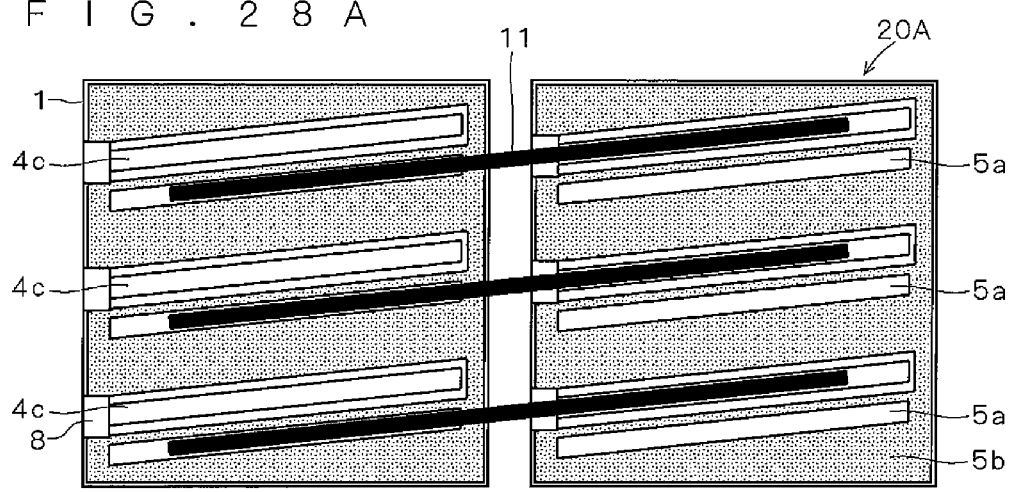
FIGS. 28A to 28C are diagrams showing a solar cell module formed using the solar cell element according to the variation shown in FIG. 28.
Figure 28B:
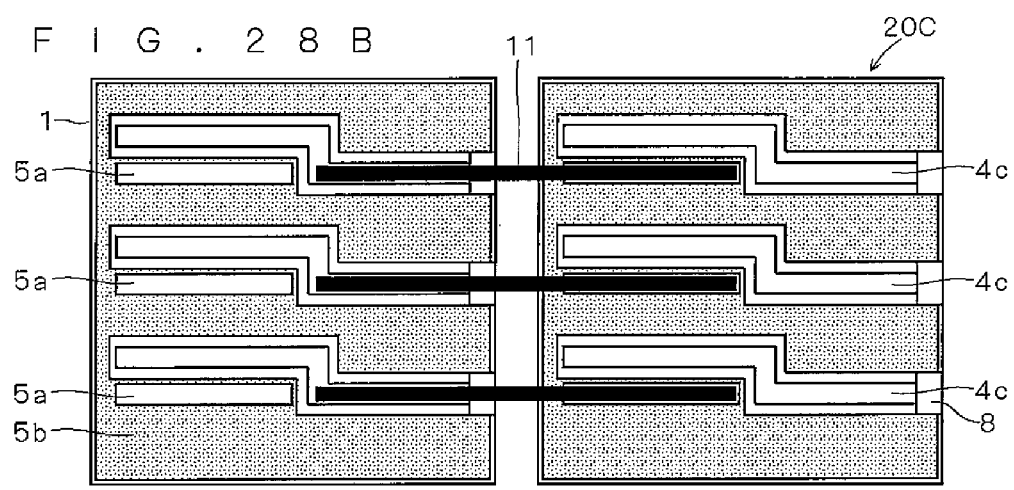
Figure 28C:
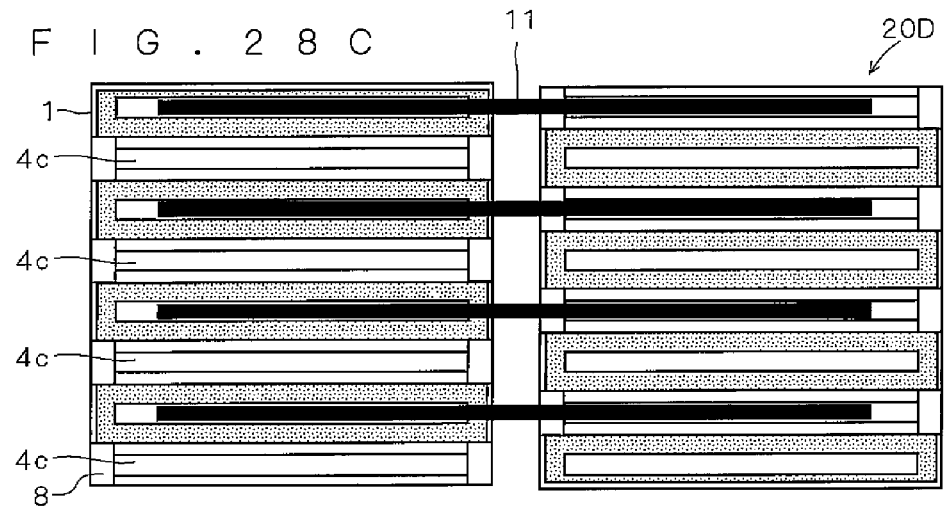

FIGS. 27A to 27D are diagrams showing a variation of the arrangement of the power collecting part 5b at the portion that is also arranged at a region ensured as the non-formation region RE a region where the power collecting part 5b is not formed in the solar cell element of each embodiment described above. FIG. 27A is a plan view showing a variation of the solar cell element 10A according to the first embodiment shown in FIG. 2A, FIG. 27B is a plan view showing a variation of the solar cell element 10C according to the third embodiment shown in FIG. 6A, and FIG. 27C is a plan view showing a variation of the solar cell element 10D according to the fourth embodiment shown in FIG. 10A. FIGS. 27A to 27C are all diagrams when seen from the second surface 1S side of the semiconductor substrate 1 in plan view. FIG. 27D is a cross-sectional schematic view showing a cross section taken along Y-Y portion of the solar cell element shown in FIG. 27A. FIGS. 28A to 28C are diagrams showing a solar cell module formed using the solar cell element according to the variation. FIG. 28A is a plan view of a solar cell module in the case where the solar cell element shown in FIG. 27A is used, FIG. 28B is a plan view of a solar cell module in the case where the solar cell element shown in FIG. 27B is used, and FIG. 28C is a plan view of a solar cell module in the case where the solar cell element shown in FIG. 27C is used. FIGS. 28A to 28C are all diagrams seen from the second surface 1S side of the semiconductor substrate 1 in plan view.

Each solar cell element shown in FIGS. 27A to 27C has an insulating layer 8b including an oxide film, resin, an insulating tape, and the like formed at the location corresponding to the non-formation region RE about the power collecting part 5b in the solar cell element having the structure acting as a basis in plan view. More specifically, as shown in FIG. 27D, the power collecting part 5b is extended at the relevant location, and the insulating layer 8b is arranged so as to cover the same. The power collecting efficiency of the carrier is thereby further enhanced.

Furthermore, by arranging the insulating layer 8b, an occurrence of leakage due to the contact of the wiring 11 and the power collecting part 5b is reduced as in the case where the non-formation region RE is ensured, if the solar cell module is configured using the solar cell element similar to the corresponding embodiments.

The insulating layer 8b may be formed by using a thin-film formation technique such as a CVD, may be formed by applying and firing an insulating paste such as a resin paste, or may be formed by attaching a commercially available insulating tape. When firing the insulating paste, the insulating paste can be fired and formed simultaneously with the electrode formation. Alternatively, the insulating layer 8b may be arranged in advance on the side of the wiring 11 instead on the side of the solar cell element, and connection may be made using the same.

<Formation of Finger Part>

Figure 29A:
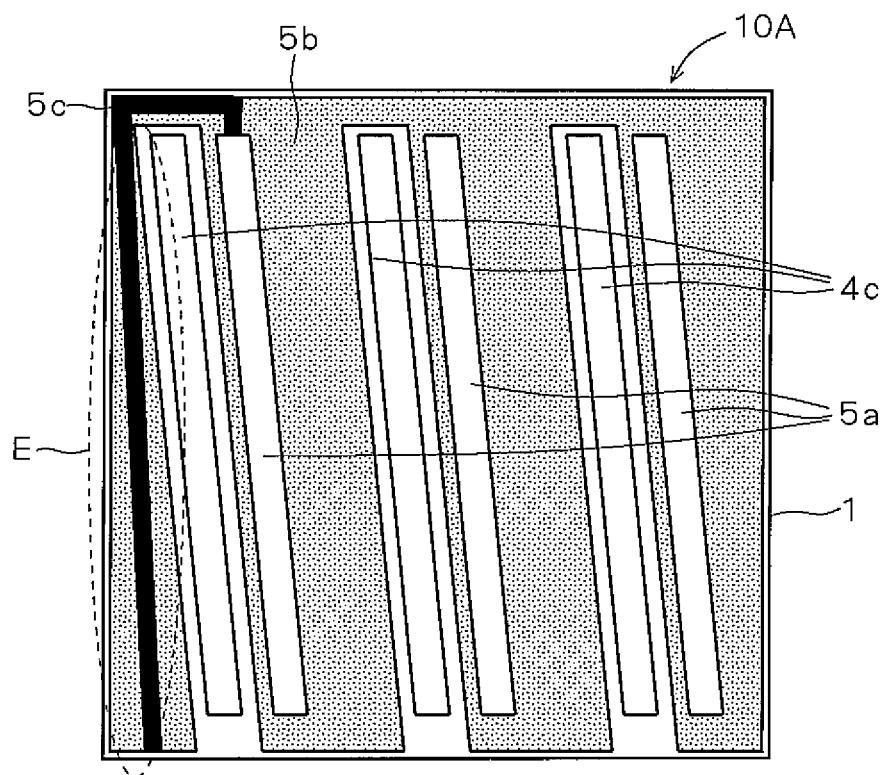
FIGS. 29A and 29B are diagrams showing solar cell elements having finger parts.
Figure 29B:
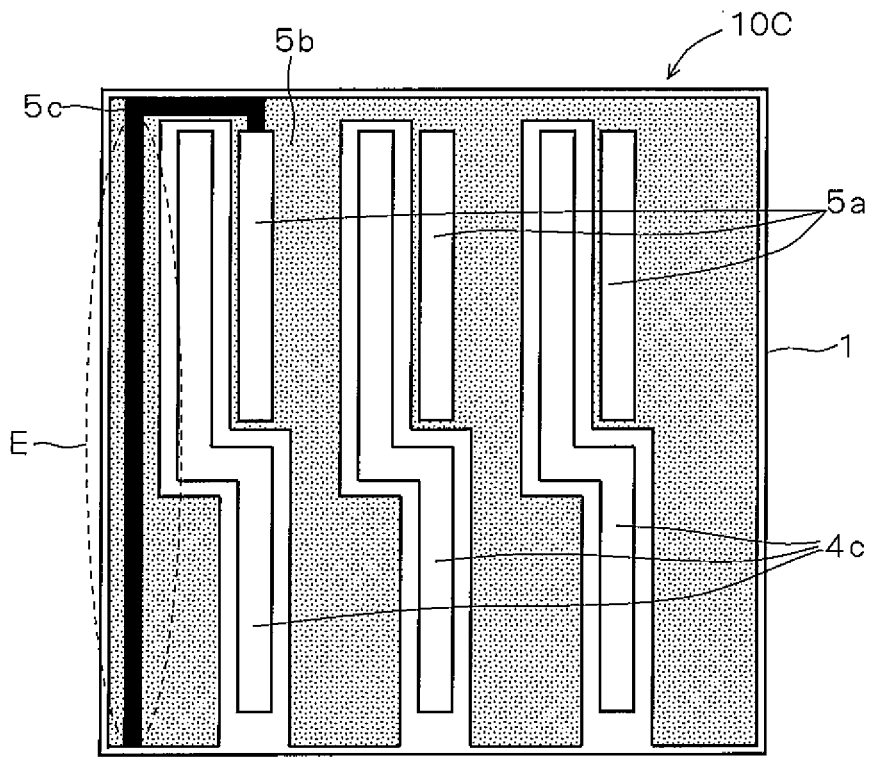
Figure 30:
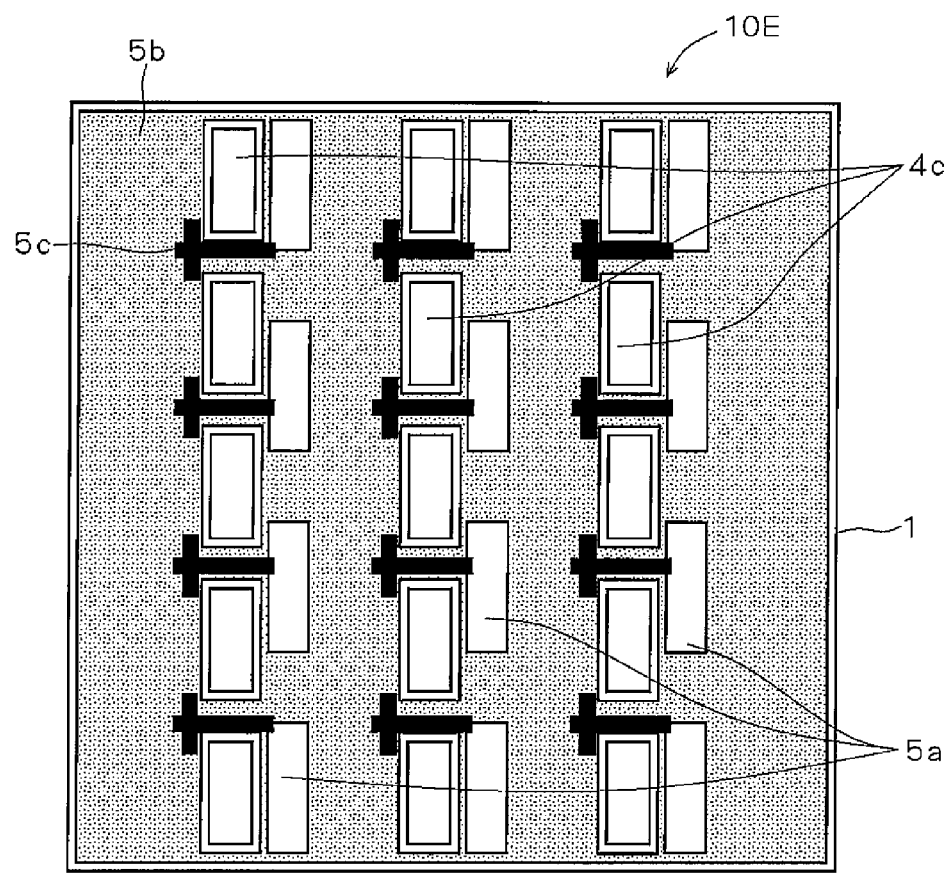
FIG. 30 is a diagram showing a solar cell element having a finger part.

FIGS. 29A and 29B and FIG. 30 are diagrams showing a variation of a configuration of the solar cell element that the adoption of it enhances the power collecting efficiency of the power collecting part 5b distant from the second connection part 5a in the solar cell element according to each embodiment described above.

FIG. 29A is a plan view showing a variation of the solar cell element 10A according to the first embodiment shown in FIG. 2A, and FIG. 29B is a plan view showing a variation of the solar cell element 10C according to the third embodiment shown in FIG. 6A. FIG. 30 is a plan view showing a variation of the solar cell element 10E according to the fifth embodiment shown in FIG. 12A. FIGS. 29A and 29B and FIG. 30 all show a diagram when seen from the second surface 1S side of the semiconductor substrate 1 in plan view.

The solar cell element shown in FIGS. 29A and 29B includes a finger part 5c connecting to the second connection part 5a and extending up to a region E of the second surface 1S where the second connection part 5a is not arranged in the way of going around to the outer periphery of the first connection part 4c. The finger part 5c is formed using a material having lower resistance than the power collecting part 5b.

In the case where the first connection part 4c is arranged so as to extend from one side to the other side of the semiconductor substrate 1 as in the solar cell element 10A and the solar cell element 10C, the carrier collected at the region E will be collected at the second connection part 5a with detouring around the first connection part 4c, if the finger part 5c is not arranged. The power collection from the region E can be more efficiently carried out by arranging the finger part 5c having smaller resistance than the power collecting part 5b along the movement path of the carrier. If the power collecting part 5b is made of aluminum, the finger part 5c can be formed using metal such as silver, copper, or the like as a main component. In particular, when copper is used for the finger part 5c, the finger part 5c can be formed at low cost. The second connection part 5a and the finger part 5c can be formed with different conductive pastes. For instance, silver paste may be used for the second connection part 5a, and copper paste may be used for the finger part 5c.

In the solar cell element 10E according to FIG. 30, the finger part 5c is arranged in the clearance between the first connection parts 4c. In such a case as well, the carrier collected by the power collecting part 5b on the opposite side with respect to the adjacent first connection part 4c can be efficiently transmitted to the second connection part 5a.

<Insulation of Through Hole>

Figure 31:
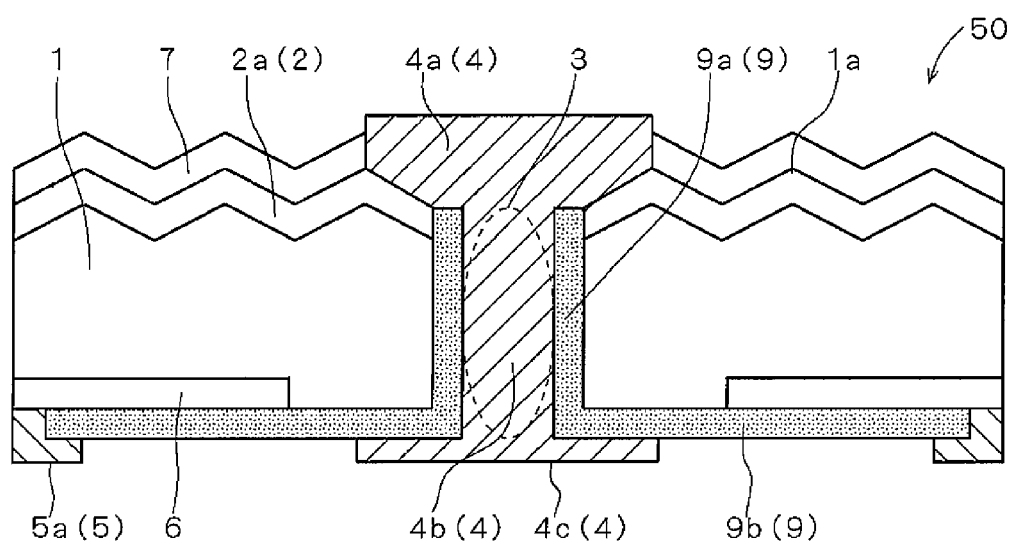
FIG. 31 is a cross-sectional schematic view of a solar cell element 50 formed with an insulating material layer 9 instead of being formed with a second opposite conductivity type layer 2b and a third opposite conductivity type layer 2c.

FIG. 31 is a cross-sectional schematic view of a solar cell element 50 formed with an insulating material layer 9 made of an oxide film, a nitride film, or the like instead of being formed with the second opposite conductivity type layer 2b and the third opposite conductivity type layer 2c. Specifically, a first insulating material layer 9a is formed on the surface of the through hole 3, and a second insulating material layer 9b made of an oxide film or a nitride film is formed on the second surface 1S of the semiconductor substrate 1.

The leakage arising between the conduction part 4b and the semiconductor substrate 1 is reduced by forming the first insulating material layer 9a. The leakage arising between the semiconductor substrate 1 and the first connection part 4c is reduced by forming the second insulating material layer 9b. Furthermore, since the surface recombination rate at the second surface 1S of the semiconductor substrate 1 lowers through passivation effect when an oxide film or a nitride film is formed as the second insulating material layer 9b, the output characteristics of the solar cell element is enhanced.

Specifically, the insulating material layer 9 can be formed by forming a silicon oxide film ($SiO_2$ film), a titanium oxide film ($TiO_2$ film), a silicon nitride film (SiNx), and the like to a thickness of about 10 μm to 50 μm using a sputtering method, a vapor deposition method, or a CVD method. The oxide film to be the insulating material layer 9 may be formed by performing thermal treatment on the semiconductor substrate 1 in a thermal oxidation furnace in an oxygen atmosphere or atmospheric atmosphere, or applying and firing an oxide film material using an application method such as spin coating, spraying, or screen printing. The insulating material layer 9 may be a single layer film, or may be a multi-layer including a double layer structure of a silicon dioxide film and a silicon nitride film.

When containing hydrogen in the insulating material layer 9, the passivation effect is further enhanced. For instance, since the silicon nitride film formed using a plasma CVD method contains hydrogen ($H_2$), diffusion of hydrogen ($H_2$) into the semiconductor substrate 1 by heating during film formation or after film formation, and bonding of the hydrogen ($H_2$) to dangling bond (remaining chemical bond) existing in the semiconductor substrate 1 reduce the possibility of the carrier being trapped by the dangling bond. Therefore, a solar cell element of higher efficiency can be obtained by forming a silicon nitride film over substantially the entire surface of the second surface 1S.

In the case of forming the second insulating material layer 9b over substantially the entire surface of the second surface, the opposite conductivity type layer 2 is less likely to be formed on the back surface side of the semiconductor substrate 1 when forming the opposite conductivity type layer (diffusion layer). In particular, it is preferable to use the CVD method, the application method, or the like, since only the insulating material layer 9 is formed only at the second surface of the semiconductor substrate 1.

When forming the first connection part 4c on the insulating material layer 9, the electrode intensity can be enhanced compared to the case of forming the electrode on the semiconductor substrate 1, since the electrode contains a glass frit.

<Other Variations>

The formation mode of the opposite conductivity type layer 2 is not limited to the above. For instance, an amorphous silicon hydride film, a crystalline silicon film including a micro crystalline silicon film, and the like may be formed using a thin-film formation technique. In the case of forming the opposite conductivity type layer 2 using the amorphous silicon hydride film, the thickness thereof is less than or equal to 50 nm and preferably lower than or equal to 20 nm; and in the case of forming using the crystalline silicon film, the thickness thereof is less than or equal to 500 nm and preferably lower than or equal to 200 nm. Furthermore, the i-type (non-dope) silicon region may be formed between the semiconductor substrate 1 and the opposite conductivity type layer 2 at a thickness of lower than or equal to 20 nm.

The high concentration doped layer 6 may be formed with, e.g., an amorphous silicon hydride film and a crystalline silicon film including a microcrystalline silicon phase using a thin-film technique. In particular, if the pn junction between the opposite conductivity type layer 2 and the bulk region substrate 1 is formed using the thin-film technique, the formation of the high concentration doped layer 6 is also preferably performed using the thin-film technique. In this case, the film thickness of the high concentration doped layer 6 is about 10 to 200 nm. Furthermore, it is effective to form the i-type silicon region between the semiconductor substrate 1 and the high concentration doped layer 6 at a thickness of lower than or equal to 20 nm to enhance characteristics.

The application and firing when forming the main electrode part 4a, the conduction part 4b, the first connection part 4c, the second connection part 5a, and the power collecting part 5b need not be performed in the order described in the embodiment above. In place thereof, the conductive paste for forming each part may all be applied and collectively fired to form all the electrodes. Alternatively, the main electrode part 4a may be applied/fired and formed after applying/firing and forming the power collecting part 5b, the second connection part 5a, the first connection part 4c, and the conduction part 4b. In addition, the procedures may be appropriately combined to form the same. The power collecting part 5b may be arranged immediately below the second connection part 5a.

When arranging the insulating layer 8 on the wiring 11, the insulating layer 8 may also be arranged at the position to be a clearance between the solar cell elements in the solar cell module. Furthermore, the aesthetic appearance can be improved by coloring the insulating layer 8 with a color similar to the back surface protective material 13 and the back side filler 15.

The invention claimed is:

1. A solar cell module comprising:
a plurality of solar cell elements and a wiring material, each of said plurality of solar cell elements comprising:
a semiconductor substrate comprising a first surface for receiving solar light and a second surface on a back side of said first surface;
a first electrode comprising a first connection part arranged on said second surface of said semiconductor substrate; and
a second electrode comprising a second connection part arranged on said second surface of said semiconductor substrate, and a power collecting part electrically connected to said second connection part, and
the first connection part comprises a plurality of first divided portions separated from each other and arrayed along an arraying direction of the solar cell elements, and each of the first divided portions is entirely surrounded by the second electrode and apart from the second electrode and connected to each other by the wiring material,
wherein said wiring material has a linear form in plan view, configured for connecting the plurality of solar cell elements arrayed, wherein said wiring material is positioned along the arraying direction of the solar cell elements such that said first electrode and said second electrode are sandwiched between said wiring material and said semiconductor substrate, and where two adjacent solar cell elements of said plurality of solar cell elements are a first solar cell element and a second solar cell element, and wherein said wiring material is directly connected to said first connection part of said first solar cell element and said wiring material is directly connected to said second connection part of said second cell element.

2. The solar cell module according to claim 1, wherein said power collecting part of said second electrode is arranged over substantially an entire surface of a region not formed with said first electrode and said second connection part of said second electrode out of said second surface of said semiconductor substrate.

3. The solar cell module according to claim 1, wherein said wiring material has a bent portion.

4. The solar cell module according to claim 1, wherein said first and second solar cell elements are arranged in a rotationally symmetric relationship with each other.

5. The solar cell module according to claim 4, wherein
said semiconductor substrate comprises a through hole penetrating between said first surface and said second surface,
said first electrode comprises a conduction part arranged in said through hole, and
said first connection part of said first electrode comprises a region connected to said conduction part of said first electrode and a region connected with said wiring material.

6. The solar cell module according to claim 1, further comprising an insulating layer between the second electrode and the wiring material.

7. The solar cell module according to claim 1, wherein said second connection part of said second electrode is arranged partially overlapping with said power collecting part.

8. The solar cell module according to claim 1, wherein
said semiconductor substrate comprises a through hole penetrating between said first surface and said second surface, and
said first electrode comprises a light receiving surface electrode arranged on said first surface and a conduction part electrically connected to said light receiving surface electrode and arranged in said through hole.

9. The solar cell module according to claim 1, wherein the semiconductor comprises a first side along the arraying direction, and the power collecting part comprises a first side region located on the first side of the semiconductor substrate.

10. The solar cell module according to claim 9, wherein the semiconductor comprises a second side along the arraying direction facing the first side, and the power collecting part comprises a second side region located on the second side of the semiconductor.

11. The solar cell module according to claim 1, wherein the second connection part comprises a plurality of second divided portions separated from each other and arranged corresponding to a gap between two adjacent first divided portions.

12. The solar cell module according to claim 11, wherein
each of the first divided portions comprises a first edge and a second edge along the arraying direction,
each of the second divided portions is located on a side of the first edge of the corresponding first divided portion, and
the second electrode comprises a finger part arranging at a gap between two adjacent first divided portions, electrically connecting the corresponding second divided part, and extending from the corresponding second divided part to a region on a side of the second edge of the corresponding first divided portion in the collecting part.

13. The solar cell module according to claim 1, wherein the second electrode comprises a finger part electrically connecting to the second connection part and arranged at a gap between two adjacent first divided portions.

14. The solar cell module according to claim 13, wherein the resistance of the finger part is lower that the resistance of the power collecting part.

15. The solar cell module according to claim 14, wherein the power collecting part comprises aluminum and the finger part comprises silver or copper.

* * * * *